United States Patent
Yada et al.

(10) Patent No.: US 9,356,034 B1
(45) Date of Patent: May 31, 2016

(54) MULTILEVEL INTERCONNECT STRUCTURE AND METHODS OF MANUFACTURING THE SAME

(71) Applicant: SanDisk Technologies, Inc., Plano, TX (US)

(72) Inventors: Shinsuke Yada, Yokkaichi (JP); Hiroyuki Ogawa, Yokkaichi (JP)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/614,757

(22) Filed: Feb. 5, 2015

(51) Int. Cl.
| | |
|---|---|
| *H01L 29/788* | (2006.01) |
| *H01L 27/115* | (2006.01) |
| *H01L 23/522* | (2006.01) |
| *H01L 21/768* | (2006.01) |

(52) U.S. Cl.
CPC .... *H01L 27/11556* (2013.01); *H01L 21/76802* (2013.01); *H01L 21/76877* (2013.01); *H01L 23/5226* (2013.01); *H01L 27/1157* (2013.01); *H01L 27/11524* (2013.01); *H01L 27/11582* (2013.01)

(58) Field of Classification Search
CPC .................. H01L 27/11556; H01L 27/11524; H01L 27/11551; H01L 27/1157; H01L 27/11578; H01L 27/11582; H01L 21/76802; H01L 21/76877
USPC ........................................................ 257/316
See application file for complete search history.

(56) References Cited

U.S. PATENT DOCUMENTS

| | | |
|---|---|---|
| 7,002,825 B2 | 2/2006 | Scheuerlein |
| 7,005,350 B2 | 2/2006 | Walker et al. |
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,696,559 B2 | 4/2010 | Arai et al. |

(Continued)

FOREIGN PATENT DOCUMENTS

WO   WO02/15277 A2   2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Tu-Tu Ho
(74) *Attorney, Agent, or Firm* — The Marbury Law Group PLLC

(57) ABSTRACT

A three-dimensional NAND device includes a first set of word line contacts in contact with a contact portion of respective odd numbered word lines in a first stepped word line contact region, and a second set of word line contacts in contact with a contact portion of respective even numbered word lines in a second stepped word line contact region. The even numbered word lines in the first word line contact region do not contact a word line contact while the odd numbered word lines in the second word line contact region do not contact a word line contact.

22 Claims, 40 Drawing Sheets

(56) References Cited

U.S. PATENT DOCUMENTS

| | | | |
|---|---|---|---|
| 7,745,265 | B2 | 6/2010 | Mokhlesi et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,102,711 | B2 | 1/2012 | Maejima |
| 8,187,936 | B2 | 5/2012 | Alsmeier et al. |
| 8,295,089 | B2 | 10/2012 | Jeong et al. |
| 8,349,681 | B2 | 1/2013 | Alsmeier et al. |
| 8,394,716 | B2 | 3/2013 | Hwang et al. |
| 8,461,000 | B2 | 6/2013 | Alsmeier et al. |
| 8,580,639 | B2 | 11/2013 | Alsmeier et al. |
| 8,765,543 | B2 | 7/2014 | Alsmeier et al. |
| 9,000,510 | B2 * | 4/2015 | Hong ............... H01L 29/7926 257/324 |
| 2007/0210338 | A1 | 9/2007 | Orlowski |
| 2007/0252201 | A1 | 11/2007 | Kito et al. |
| 2009/0230449 | A1 | 9/2009 | Sakaguchi et al. |
| 2009/0242967 | A1 | 10/2009 | Katsumata et al. |
| 2010/0013049 | A1 | 1/2010 | Tanaka et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0031546 | A1 | 2/2011 | Uenaka et al. |
| 2011/0076819 | A1 | 3/2011 | Kim et al. |
| 2011/0133606 | A1 | 6/2011 | Yoshida et al. |
| 2011/0169071 | A1 | 7/2011 | Uenaka et al. |
| 2011/0266606 | A1 | 11/2011 | Park et al. |
| 2011/0284943 | A1 | 11/2011 | Hwang et al. |
| 2012/0001247 | A1 | 1/2012 | Alsmeier |
| 2012/0001249 | A1 | 1/2012 | Alsmeier |
| 2012/0001250 | A1 | 1/2012 | Alsmeier |
| 2012/0012920 | A1 | 1/2012 | Shin et al. |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2014/0131787 | A1 | 5/2014 | Alsmeier |
| 2014/0175530 | A1 | 6/2014 | Chien et al. |
| 2014/0175534 | A1 | 6/2014 | Kofuji et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

International Search Report, PCT/US2013/035567, Sep. 30, 2013, 6pgs.

U.S. Appl. No. 14/133,979, filed Dec. 19, 2013, SanDisk 3D LLC.

U.S. Appl. No. 14/136,103, filed Dec. 20, 2013, SanDisk 3D LLC.

U.S. Appl. No. 14/150,162, filed Jan. 8, 2014, SanDisk 3D LLC.

U.S. Appl. No. 14/320,865, filed Jul. 1, 2014, SanDisk Technologies, Inc.

U.S. Appl. No. 14/611,785, filed Feb. 2, 2015, SanDisk Technologies, Inc.

U.S. Appl. No. 14/133,979, filed Dec. 19, 2013, SanDisk Technologies Inc.

U.S. Appl. No. 14/225,116, filed Mar. 25, 2014, SanDisk Technologies Inc.

U.S. Appl. No. 14/225,176, filed Mar. 25, 2014, SanDisk Technologies Inc.

U.S. Appl. No. 14/317,274, filed Jun. 27, 2014, SanDisk Technologies Inc.

International Search Report and Written Opinion of International Searching Authority for International Application No. PCT/US2015/047932 issued Mar. 2, 2016, 22 pages.

* cited by examiner

US 9,356,034 B1

MULTILEVEL INTERCONNECT STRUCTURE AND METHODS OF MANUFACTURING THE SAME

FIELD

The present disclosure relates generally to the field of electrically conductive interconnect structures, and specifically to multilevel metal interconnect structures, and methods of manufacturing the same.

BACKGROUND

Multilevel metal interconnect structures are routinely employed to provide electrical wiring for a high density circuitry, such as semiconductor devices on a substrate. Continuous scaling of semiconductor devices leads to a higher wiring density as well as an increase in the number of wiring levels. Recently, ultra high density storage devices have been proposed using a three-dimensional (3D) stacked memory structure sometimes referred to as a Bit Cost Scalable (BiCS) architecture. Such ultra high density storage devices include a large number of interconnect wiring levels. For example, a 3D NAND stacked memory device may include at least as many number of wiring levels as the total number of control gate electrodes employed for the 3D NAND stacked memory device.

SUMMARY

According to an aspect of the present disclosure, a three-dimensional NAND device includes a substrate having a major surface and a stack of plurality of alternating word lines and insulating layers located over the major surface of the substrate and extending substantially parallel to the major surface of the substrate. The plurality of word lines comprise odd numbered word lines located in odd numbered device levels and even numbered word lines located in a even numbered device levels over the major surface of the substrate. The three-dimensional NAND device further includes a plurality of semiconductor channels located in a device region of the stack, and a plurality of memory films located in the device region of the stack, where each of the plurality of memory films is located adjacent to a respective one of the plurality of semiconductor channels. At least one end portion of each of the plurality of the semiconductor channels extends substantially perpendicular to the major surface of the substrate through the stack. The three-dimensional NAND device further includes a first stepped word line contact region located in a first side of the stack adjacent to a first side of the device region, where the odd numbered word lines contain contact portions which extend laterally beyond all overlying layers of the stack in the first stepped word line contact region; and a second stepped word line contact region located in a second side of the stack adjacent to a second side of the device region opposite to the first side of the device region, where the even numbered word lines contain contact portions which extend laterally beyond all overlying layers of the stack in the second stepped word line contact region. A first plurality of word line contacts extends substantially perpendicular to the major surface of the substrate in the first stepped word line contact region, where each of the first plurality of word line contacts is in contact with a respective contact portion of one of the plurality of odd numbered word lines, and where at least a portion of the plurality of even numbered word lines in the first word line contact region do not contact a word line contact. A second plurality of word line contacts extends substantially perpendicular to the major surface of the substrate in the second stepped word line contact region, where each of the second plurality of word line contacts is in contact with a respective contact portion of one of the plurality of even numbered word lines, and where at least a portion of the plurality of odd numbered word lines in the second word line contact region do not contact a word line contact.

According to another aspect of the present disclosure, a method of making multi-level contacts includes providing an in-process multilevel device having a device region and a contact region including a stack of plurality of alternating insulating layers and material layers located over a major surface of a substrate. A first mask is provided over the stack exposing a first side of the stack. A first step is formed in a first side of the stack by etching a first insulating layer and a first material layer to expose a second insulating layer. A second mask is provided over the stack exposing a second side of the stack and an outer portion of the first step while covering an inner portion the first step. A second step is formed in a second side of the stack by etching the first and the second insulating layers and the first and a second material layers to expose a third insulating layer in the second side of the stack. A third step is formed in the first side of the stack by etching the second and third insulating layers and the second and a third material layers in the outer portion of the first step to expose a fourth insulating layer in the first side of the stack.

DETAILED DESCRIPTION

Figure 1:
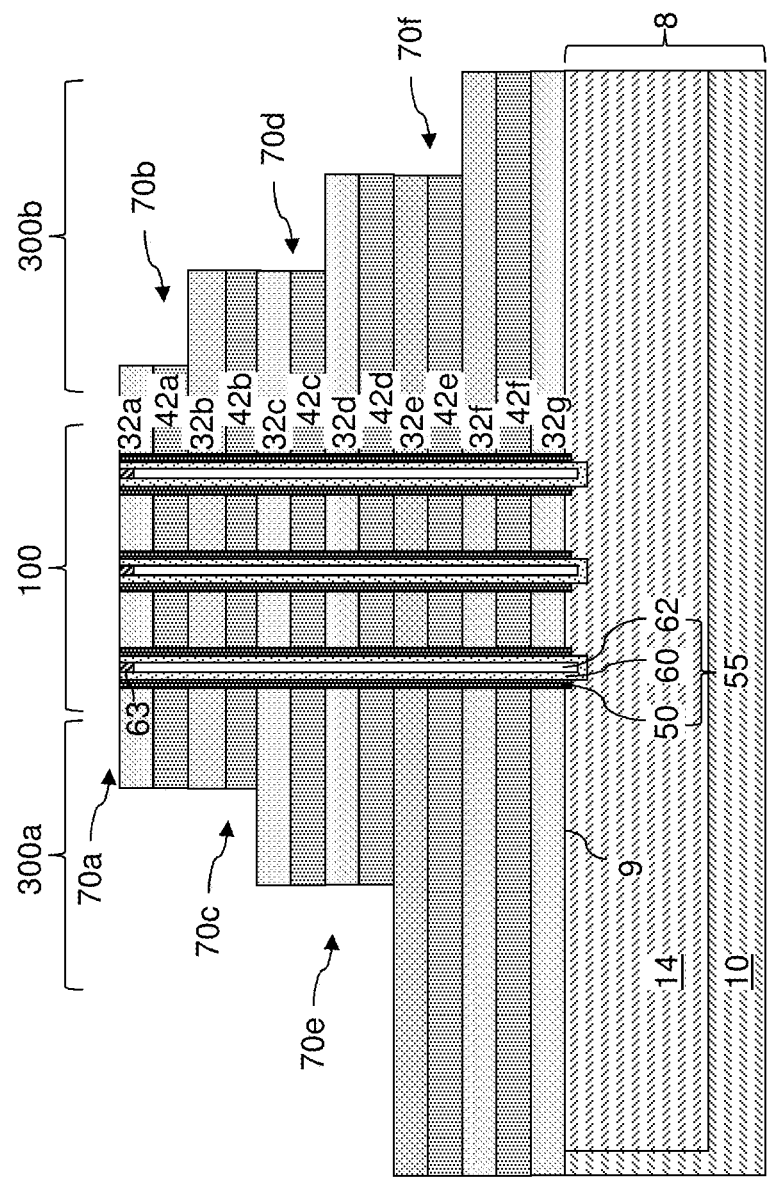
FIG. 1 illustrates a vertical cross-sectional view of an embodiment of an in-process device structure containing vertical NAND memory devices according to an embodiment of the disclosure.

The present disclosure is directed to multilevel interconnect structures, and methods of manufacturing the same, the various aspects of which are described below. The embodiments of the disclosure can be employed to form various structures including a multilevel interconnect structure, a non-limiting example of which includes semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. The various three dimensional memory devices of the present disclosure include a monolithic three-dimensional NAND string memory device, and can be fabricated employing the various embodiments described herein.

At least some embodiments of the present disclosure provide methods for forming two high density multilevel interconnect structures without significant restrictions on the design of various interconnect components and/or with minimal processing complexity and cost.

According to various embodiments of the present disclosure, a three-dimensional NAND device includes two high density multilevel interconnect structures, for example two stepped word line contact regions, each having a terrace structure. Word line contacts in a first stepped word line contact region are electrically connected to a set of odd numbered word lines, and word line contacts in a second stepped word line contact region are electrically connected to a set of even numbered word lines.

In various embodiments, the two stepped word line contact regions are located on opposite sides of the three-dimensional NAND device. However, because each stepped word line contact region contacts half the number of word lines, the area required for each is reduced by half. In addition, the height difference between each adjacent terrace opening in each stepped word line contact region is doubled.

In one embodiment, the two stepped word line contact regions, each having a terrace structure, are simultaneously formed by alternating etching terrace openings in each of the stepped word line contact regions. A first mask is formed over the stack, exposing a first side of the stack, and a first terrace opening is etched. In some embodiments, the first mask is then removed. A second mask is formed over the stack, exposing a second side of the stack, and a second terrace opening is etched. In some embodiments, the second mask is then removed. A third mask is formed over the stack, exposing the first side of the stack, and a third terrace opening is etched. The process is continued until each stepped word line contact region having a terrace structure is complete.

Referring to FIG. 1, a first embodiment of a device structure containing vertical NAND memory device according to a first embodiment of the present disclosure is illustrated. The first embodiment includes a substrate 8, which can be a semiconductor substrate. Various semiconductor devices can be formed on, or over, the substrate 8 employing methods known in the art. For example, an array of memory devices can be formed in a device region 100. Electrically conductive contacts to the electrically conductive electrodes of the devices in the device region 100 can be subsequently formed in two contact regions 300a, 300b.

The substrate 8 can include a substrate semiconductor layer 10. The substrate semiconductor layer 10 may be a semiconductor material layer formed over an underlying substrate 8 or it may be an upper portion of a semiconductor substrate 8. The substrate semiconductor layer 10 can include at least one elemental semiconductor material, at least one III-V compound semiconductor material, at least one II-VI compound semiconductor material, at least one organic semiconductor material, or other semiconductor materials known in the art. The substrate 8 has a major surface 9, which can be, for example, a topmost surface of the substrate semiconductor layer 10. The major surface 9 can be a semiconductor surface. In one embodiment, the major surface 9 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition.

Optionally, at least one doped well 14 (e.g., p-type well) can be formed within the substrate semiconductor layer 10, such as a single crystalline silicon surface. In one embodiment, the substrate 8 can comprise a silicon substrate, and the vertical NAND device can comprise a monolithic, three-dimensional array of NAND strings that includes a monolithic three-dimensional NAND string located over the silicon substrate. For example, at least one memory cell that is located in a first device level of the three-dimensional array of NAND strings can be located over another memory cell in a second device level of the three-dimensional array of NAND strings. The silicon substrate can contain an integrated circuit comprising a driver circuit for the at least one memory cell.

Figure 2A:
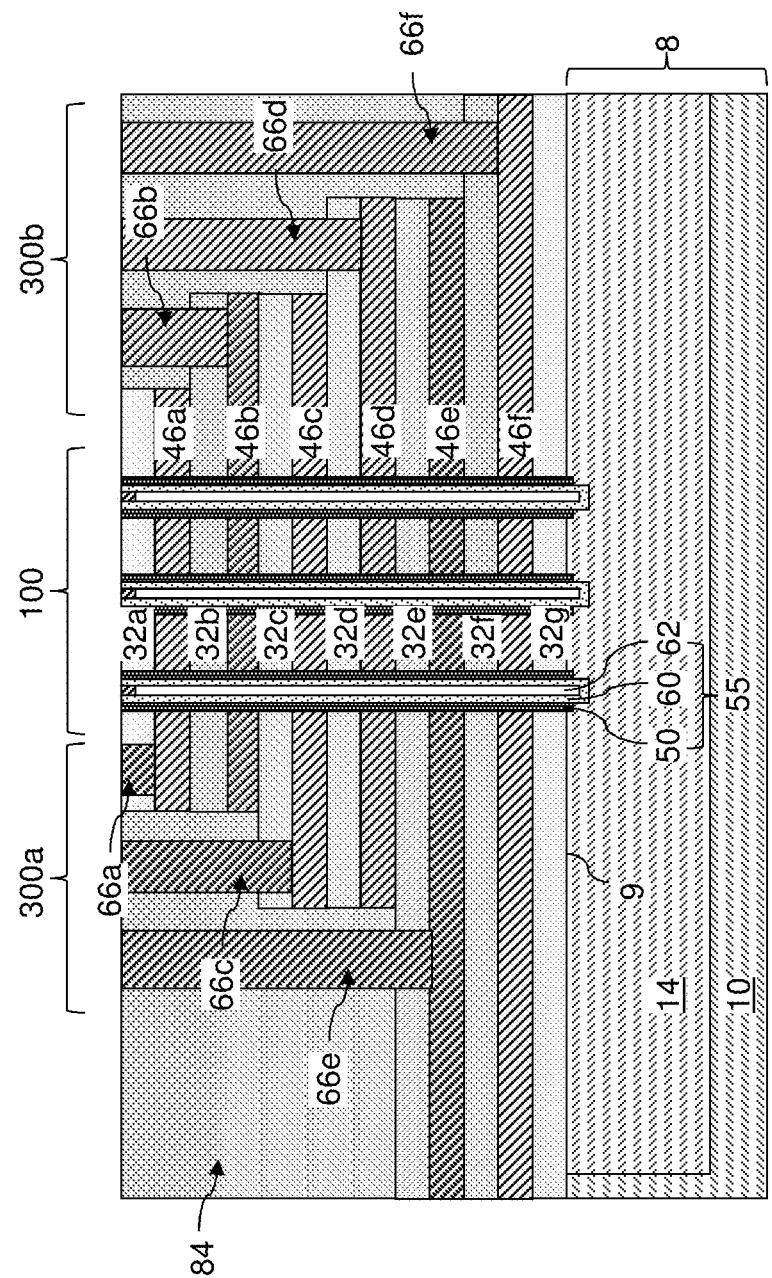
FIG. 2A illustrates a vertical cross-sectional view along line A-A' in FIG. 2B of a device structure containing vertical NAND memory devices according to an embodiment of the disclosure.
Figure 2B:
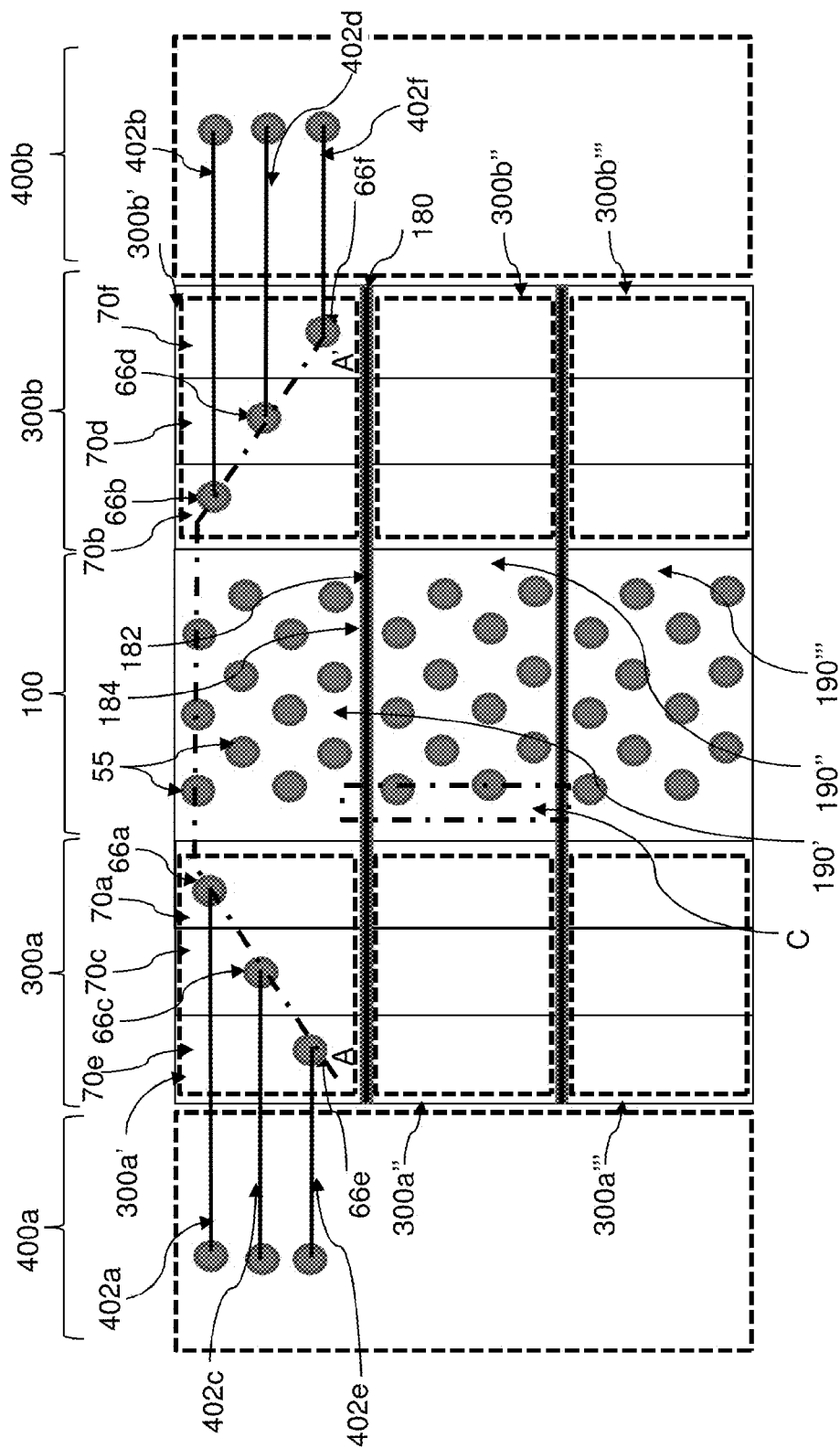
FIG. 2B illustrates a plan view of an embodiment of a device structure containing vertical NAND memory devices according to an embodiment of the disclosure shown in FIG. 2A.
Figure 2C:
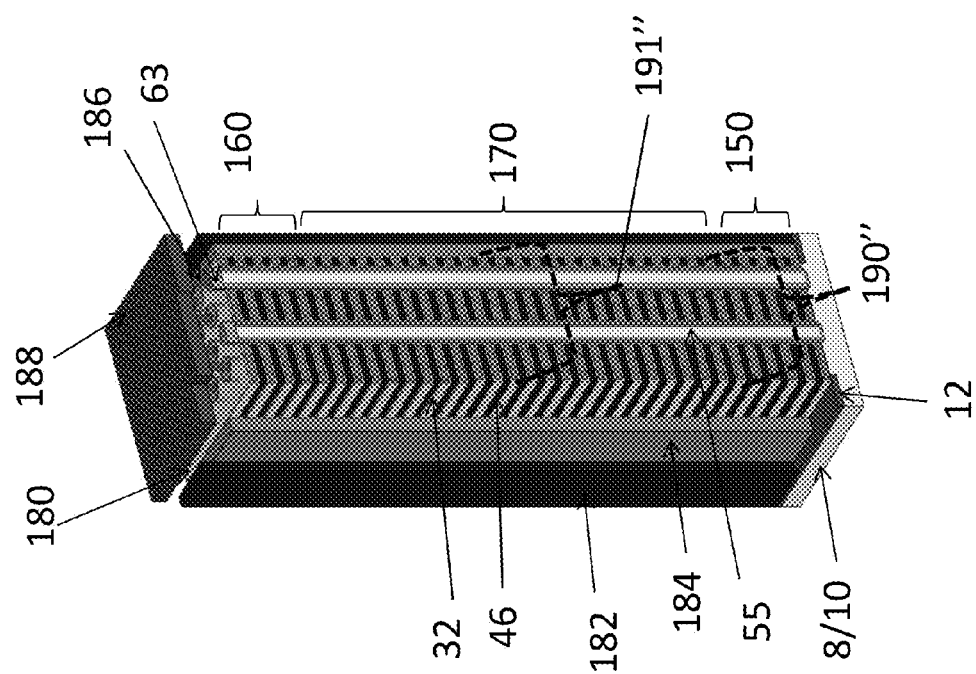
FIG. 2C is a three dimensional perspective view of region C in FIG. 2B.

Optionally, select gate electrodes (in respective source side select gate level(s) 150 and drain side select gate level(s) 160 shown in FIG. 2C) can be formed within, or on top of, the substrate semiconductor layer 10 using any suitable methods for implementing the array of vertical NAND strings. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference. While the present disclosure is described employing an embodiment in which a source region 12 is formed in a region laterally offset from a vertical portion of each channel and memory structure 55 (as shown in FIG. 2C), and a horizontal portion of the substrate semiconductor layer 10 or the at least one doped well 14 that contacts the vertical portion of the channel and memory structure 55 can function as a horizontal portion of the channel, embodiments are expressly contemplated herein in which a first electrode or source region 12 is formed directly underneath channel and memory structures 55 of memory cells, as described in U.S. patent application Ser. No. 14/317,274, filed on Jun. 27, 2014, which is incorporated herein by reference. One or more source side select transistors can be formed in the source side select gate level(s) 150 between the top of the substrate semiconductor layer 10 and the bottommost control gate of the memory devices in the memory device levels 170, and one or more drain side select transistors can be formed in the drain side select gate level(s) 160 above the memory device levels 170.

A stack of alternating layers of a first material and a second material different from the first material is formed over the major 9 surface of the substrate 8. The major surface 9 of the substrate 8 can optionally include the top surface of a source electrode (e.g. such as the horizontal source line describe in U.S. patent application Ser. No. 14/317,274 filed on Jun. 27, 2014, incorporated herein by reference in its entirety) or the source region 12 (shown in FIG. 2C) and/or a surface of a body region of a field effect transistor. In one embodiment, the stack can include an alternating plurality of insulator layers 32 and sacrificial layers 42. As used herein, an "an alternating plurality" of first elements and second elements refers to a structure in which an instance of the first elements and an instance of the second elements form a unit that is repeated within a stacked structure. The first elements may have the same thickness, or may have different thicknesses. The second elements may have the same thickness, or may have different thicknesses.

The stack of the alternating layers is herein referred to as an alternating stack (32, 42). In one embodiment, the alternating stack (32, 42) can include insulator layers 32 composed of the first material, and sacrificial layers 42 composed of a second material different from that of insulator layers 32. The sacrificial layers 42 may comprise an electrically insulating material, a semiconductor material, or a conductive material. The second material of the sacrificial layers 42 can be subsequently replaced with electrically conductive electrodes which can function, for example, as control gate electrodes of a vertical NAND device.

The first material of the insulator layers 32 can be at least one electrically insulating material. As such, each insulator layer 32 can be an insulating material layer. Electrically insulating materials that can be employed for the insulator layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials.

The second material of the sacrificial layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. Non-limiting examples of the second material include silicon nitride, an amorphous semiconductor material (such as amorphous silicon), and a polycrystalline semiconductor material (such as polysilicon).

In one embodiment, the insulator layers 32 can include silicon oxide, and sacrificial layers 42 can include silicon nitride sacrificial layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial layers 42 can be formed, for example, CVD or atomic layer deposition (ALD).

The sacrificial layers 42 can be suitably patterned so that conductive material portions to be subsequently formed by replacement of the sacrificial layers 42 can function as electrically conductive electrodes, such as the control gate electrodes of the monolithic three-dimensional NAND string memory devices to be subsequently formed. In various embodiments, the sacrificial layers 42 comprise a portion having a planar shape extending substantially parallel to the major surface 9 of the substrate 8.

In some embodiments, the thicknesses of the insulator layers 32 and the sacrificial layers 42 can be in a range from 20 nm to 50 nm, although lesser and greater thicknesses can be employed for each insulator layer 32 and for each sacrificial layer 42. The number of repetitions of the pairs of an insulator layer 32 and a sacrificial layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial layer 42 in the alternating stack (32, 42) can have a uniform thickness that is substantially invariant within each respective sacrificial layer 42.

The portion of the stack in the embodiment illustrated in FIG. 1 includes seven insulator layers 32a-32g and six sacrificial layers 42a-42f for clarity. However, more than six sacrificial layers 42 may be used in the stack, as shown in FIGS. 2C and 34-36.

A lithographic material stack (not shown) including at least a photoresist layer can be formed over the alternating stack (32, 42), and can be lithographically patterned to form openings therein. The pattern in the lithographic material stack can be transferred through the entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings. In other words, the transfer of the pattern in the patterned lithographic material stack through the alternating stack (32, 42) forms the memory opening through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, a sacrificial etch stop layer (not shown) may be employed between the alternating stack (32, 42) and the substrate 8. The sidewalls of the memory openings can be substantially vertical, or can be tapered. The patterned lithographic material stack can be subsequently removed, for example, by ashing.

Any remaining portion of the bottommost first material layer 32 underneath each memory opening is subsequently etched so that the memory openings extend from the top surface of the alternating stack (32, 42) to the substrate semiconductor layer 10, for example to the at least one doped well 14.

As used herein, a first element "overlies" a second element if a first horizontal plane including the bottommost point of the first element is within, or above, a second horizontal plane including a topmost point of the second element and if there exists an overlap between the area of the first element and the area of the second element in a see-through view along a direction perpendicular to the first and second horizontal planes. If a first element overlies a second element, the second element "underlies" the first element.

Each of the memory openings can include a sidewall (or a plurality of sidewalls) that extends substantially perpendicular to the major surface of the substrate 8 and is defined by the physically exposed sidewall surfaces of the alternating stack (32, 42,). Each of the memory openings can further include a bottom surface that corresponds to the major (i.e., top) surface 9 of the substrate 8 or that is located above or below the major surface of the substrate 8.

A channel and memory structure (e.g., pillar structure) 55 can be formed within each memory opening through the alternating stack (32, 42). The channel and memory structures 55 can be formed, for example, by depositing a memory film layer in the memory openings and over the alternating stack (32, 42), and by anisotropically etching the memory film layer. The memory film layer can be a stack of contiguous material layers that overlie the entirety of the alternating stack (31, 42). The memory film layer contacts all sidewall surface(s) and all bottom surface(s) of the memory openings. The memory film layer is a contiguous film stack that provides the functionality of charge storage in the absence of an external electrical bias voltage, while enabling charge transfer in the presence of a suitable external electrical bias voltage.

In one embodiment, the memory film layer can be a stack, in the order of formation, of a blocking dielectric, a charge storage region (e.g., a charge storage layer), and a tunnel dielectric. In one embodiment, the charge storage region comprises a plurality of floating gates or a charge storage dielectric which is located between the tunneling dielectric layer and the blocking dielectric layer.

The blocking dielectric layer contacts the sidewalls of the memory openings. Specifically, the blocking dielectric layer can contact the sidewalls of the sacrificial layers 42. The blocking dielectric layer may include one or more dielectric material layers that can function as the dielectric material(s) of a control gate dielectric between the sacrificial layers 42 and charge storage regions to be subsequently formed out of the charge storage layer. The blocking dielectric layer can include silicon oxide, a dielectric metal oxide, a dielectric metal oxynitride, or a combination thereof. In one embodiment, the blocking dielectric layer can include a stack of at least one silicon oxide layer and at least one dielectric metal oxide layer. The blocking dielectric layer can be formed by a conformal deposition process such as chemical vapor deposition (CVD) and/or atomic layer deposition (ALD), and/or by deposition of a conformal material layer (such as an amorphous silicon layer) and subsequent conversion of the conformal material layer into a dielectric material layer (such as a silicon oxide layer). The thickness of the blocking dielectric layer can be in a range from 6 nm to 24 nm, although lesser and greater thicknesses can also be employed. Alternatively, the blocking dielectric layer may be omitted from the memory opening, and instead be formed through the backside contact trenches 180 shown in FIGS. 2B and 2C in recesses formed by removal of the sacrificial layers 42 prior to forming the metal control gate electrodes through the backside contact trench.

The charge storage layer includes a dielectric charge trapping material, which can be, for example, silicon nitride, or a conductive material such as doped polysilicon or a metallic material. In one embodiment, the charge storage layer includes silicon nitride. The charge storage layer can be formed as a single charge storage layer of homogeneous composition, or can include a stack of multiple charge storage material layers. The multiple charge storage material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer may comprise an insulating charge trapping material, such as one or more silicon nitride segments. Alternatively, the charge storage layer may comprise conductive nanoparticles such as metal nanoparticles, which can be, for example, ruthenium nanoparticles. The charge storage layer can be formed, for example, by chemical vapor deposition (CVD), atomic layer deposition (ALD), physical vapor deposition (PVD), or any suitable deposition technique for the selected material(s) for the charge storage layer. The thickness of the charge storage layer can be in a range from 2 nm to 20 nm, although lesser and greater thicknesses can also be employed.

The tunnel dielectric layer includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer can include a stack of a first silicon oxide layer, a silicon oxynitride layer, and a second silicon oxide layer, which is commonly known as an ONO stack. In one embodiment, the tunneling dielectric layer can include a silicon oxide layer that is substantially free of carbon or a silicon oxynitride layer that is substantially free of carbon. The thickness of the tunnel dielectric layer can be in a range from 2 nm to 20 nm, although lesser and greater thicknesses can also be employed.

Optionally, a permanent channel material layer (such as a polysilicon layer) and/or a sacrificial layer (such as a dielectric material layer) may be formed on the memory film layer. The memory film layer (and any additional layer such as a permanent channel material layer or a sacrificial layer) can be anisotropically etched so that horizontal portions of the memory film layer (and any additional layer) are removed from above the top surface of the alternating stack (32, 42) and at the bottom of each memory opening. Each remaining vertical portion of the memory film layer that remains within a memory opening after the anisotropic etch constitutes a memory film 50.

A semiconductor channel 60 can be formed on inner sidewalls of each memory film 50 by deposition of a semiconductor material layer and a subsequent anisotropic etch of the semiconductor material layer. The semiconductor material layer can include a doped polycrystalline semiconductor material (such as doped polysilicon), or can include a doped amorphous semiconductor material (such as amorphous silicon) that can be subsequently converted into a doped polycrystalline semiconductor material after a suitable anneal at an elevated temperature.

Optionally, a dielectric core 62 can be formed within a cavity inside each semiconductor channel 60, for example, by deposition of a dielectric material such as silicon oxide, and subsequent planarization of the dielectric material. The planarization of the dielectric material removes the portion of the deposited dielectric material from above the top surface of the horizontal plane including the top surface of the alternating stack (32, 42). The planarization of the dielectric material can be performed, for example, by chemical mechanical planarization. Each remaining portion of the dielectric material inside a memory opening constitutes a dielectric core 62. The dielectric core 62 is an optional component, and a combination of a memory film 50 and a semiconductor channel 60 may completely fill a memory opening. A memory film 50, a semiconductor channel 60, and a dielectric core 62 within a same memory opening constitutes a channel and memory structure 55.

Drain regions 63 can be formed by recessing a top portion of each dielectric core 62 and depositing a doped semiconductor material. The doped semiconductor material can be, for example, doped polysilicon. Excess portions of the deposited semiconductor material can be removed from above the top surface of the alternating stack (32, 42), for example, by chemical mechanical polishing (CMP) or a recess etch.

As shown in FIG. 1, an embodiment of the present disclosure includes a first stepped word line contact region 300a having a first terrace structure, and a second stepped word line contact region 300b.

The first stepped word line contact region 300a includes a plurality of steps 70. Each step 70 of the first stepped word line contact region 300a exposes a portion of a top surface of a respective insulator layer 32. In various embodiments, a step 70 corresponds to a terrace opening. In some embodiments, each step 70 of the first stepped word line contact region 300a exposes a portion of a top surface of an odd numbered insulator layer and a side of an even numbered sacrificial layer 42 located immediately above the odd numbered insulator layer (except for the top most insulator layer 32a). The second stepped word line contact region 300b includes a plurality of steps 70. Each step 70 of the second stepped word line contact region 300b exposes a portion of a top surface of a respective insulator layer 32. In some embodiments, each step 70 of the second stepped word line contact region 300b exposes a portion of a top surface of an even numbered insulator layer and a side of an odd numbered sacrificial layer 42 located immediately above the even numbered insulator layer.

The first stepped word line contact region 300a in the embodiment illustrated in FIG. 1 includes a first step 70a exposing a top surface of insulator layer 32a. The first stepped word line contact region 300a further includes a third step 70c exposing a side of insulator layers 32a and 32b, a side of sacrificial layers 42a and 42b, and a portion of a top surface of third insulator layer 32c. The first stepped word line contact region 300a further includes a fifth step 70e exposing a side of insulator layers 32c and 32d, a side of sacrificial layers 42c and 42d, and a portion of a top surface of fifth insulator layer 32e.

The second stepped word line contact region 300b in the embodiment illustrated in FIG. 1 includes a second step 70b exposing a side of insulator layer 32a and sacrificial layer 42a, and a portion of a top surface of second insulator layer 32b. The second stepped word line contact region 300b further includes a fourth step 70d exposing a side of insulator layers 32b and 32c, a side of sacrificial layers 42b and 42c, and a portion of a top surface of fourth insulator layer 32d. The second stepped word line contact region 300b further includes a sixth step 70f exposing a side of insulator layers 32d and 32e, a side of sacrificial layers 42d and 42e, and a portion of a top surface of sixth insulator layer 32f. The sacrificial layers 42 are subsequently replaced with electrically conductive word electrodes (e.g., NAND word lines/control gate electrodes) 46 through the back side trenches 180, as shown in FIGS. 2A-2C and 22-23.

An embodiment of the disclosure includes an alternating stack of insulator layers 32 and electrically conductive electrodes 46, and an insulating fill layer 84. A plurality of electrically conductive via contacts (e.g., word line contacts) 66 are each in electrical contact with a corresponding electrically conductive electrode 46 of the plurality of electrically conductive electrodes 46. The embodiment shown in FIG. 2A includes seven insulator layers 32a-32g and six electrically conductive via contacts 66a-66f, each in electrical contact with a corresponding one of six electrically conductive electrodes 46a-46f.

The respective plan (i.e., top) and perspective (i.e., three dimensional) views of the device shown in FIG. 2A are illustrated in FIGS. 2B and 2C, respectively. As shown in FIGS. 2A and 2B, the first stepped word line contact region 300a includes via contacts 66a, 66c, and 66e that are electrically connected to odd numbered word lines 46a, 46c, and 46e, respectively. The second stepped word line contact region 300b includes via contacts 66b, 66d, and 66f that are electrically connected to even numbered word lines 46b, 46d, and 46f, respectively.

Referring to FIGS. 2B and 2C, an insulating material 184, such as silicon oxide, is located on the sidewalls of the backside trenches 180 and conductive source lines 182, such as tungsten or titanium nitride/tungsten bilayer lines, are located over the insulating material 184 in the backside trenches 180 in contact with the source regions 12. Drain electrodes 186 and drain lines 188 are located over the stack in electrical contact with the drain regions 63, as shown in FIG. 2C. One or more source side select transistors are located in the source side select gate level(s) 150 between the top of the substrate semiconductor layer 10 and the bottommost control gate/word line 46 of the memory devices in the memory device levels 170, and one or more drain side select transistors are located in the drain side select gate level(s) 160 above the memory device levels 170.

In some embodiments, the plurality of odd numbered word lines 46 (e.g., 46a, 46c, and 46e) include a plurality of odd numbered word line fingers 190', 190" and 190'''. The odd numbered word line fingers in a respective device level are spaced apart from one another by the respective backside trench 180 in a horizontal direction which is substantially parallel to the major surface 9 of the substrate 8. According to various embodiments, the first stepped word line contact region 300a includes a plurality of adjacent first sub-regions (e.g., 300a', 300a", 300a''') that correspond to the respective word line fingers 190', 190" and 190'''. The sub-regions are spaced apart from one another in the horizontal direction which is substantially parallel to the major surface of the substrate 8, as shown in FIG. 2B. The via contacts 66 include a first plurality of sub-sets of via contacts 66a, 66c, 66e. The via contacts 66 in each respective one of the first plurality of sub-sets are in contact with the odd numbered word line 46 fingers 190', 190", 190''' in a respective one of the plurality of adjacent first sub-regions 300a', 300a", 300a'''. Each via contact 66a, 66c, 66e is in electrically contact with a respective word line interconnect 402a, 402c, 402e which contacts peripheral devices (e.g., driver circuits containing transistors) located in peripheral region 400a. The contact region 300a is located between the device region 100 and the peripheral region 400a.

In some embodiments, the plurality of even numbered word lines 46 (e.g., 46b, 46d, and 460 include a plurality of even numbered word line fingers 191', 191" and 191'''. The even numbered word line fingers in a respective device level are spaced apart from one another by the respective backside trench 180 in a horizontal direction which is substantially parallel to the major surface 9 of the substrate 8. According to various embodiments, the second stepped word line contact region 300b includes a plurality of adjacent second sub-regions (e.g., 300b', 300b", 300b''') that correspond to the respective even numbered word line fingers 191', 191" and 191". The sub-regions are spaced apart from one another in the horizontal direction which is substantially parallel to the major surface of the substrate 8, as shown in FIG. 2B. The via contacts 66 include a second plurality of sub-sets of via contacts 66b, 66d, 66f. The via contacts 66b, 66d, 66f in each respective one of the second plurality of sub-sets are in contact with the even numbered word line 46 fingers 191', 191", 191''' in a respective one of the plurality of adjacent second sub-regions 300b', 300b", 300b'''. Each via contact 66b, 66d, 66f is in electrically contact with a respective word line interconnect 402b, 420d, 420f which contacts peripheral devices (e.g., driver circuits containing transistors) located in peripheral region 400b. The contact region 300b is located between the device region 100 and the peripheral region 400b.

Thus, as shown in FIG. 2B, each sub-region in the respective contact region 300a, 300b contains via contacts 66. The via contacts 66 in each sub-region contact only some of the word lines (e.g., only even or odd word lines) that extend into the sub-region. Thus, the number of via contacts 66 and interconnects 402 required for each sub-region is reduced by about half or by exactly half (depending on whether there are odd or even number of total word lines in the stack) compared to a prior art device.

Figure 2D:
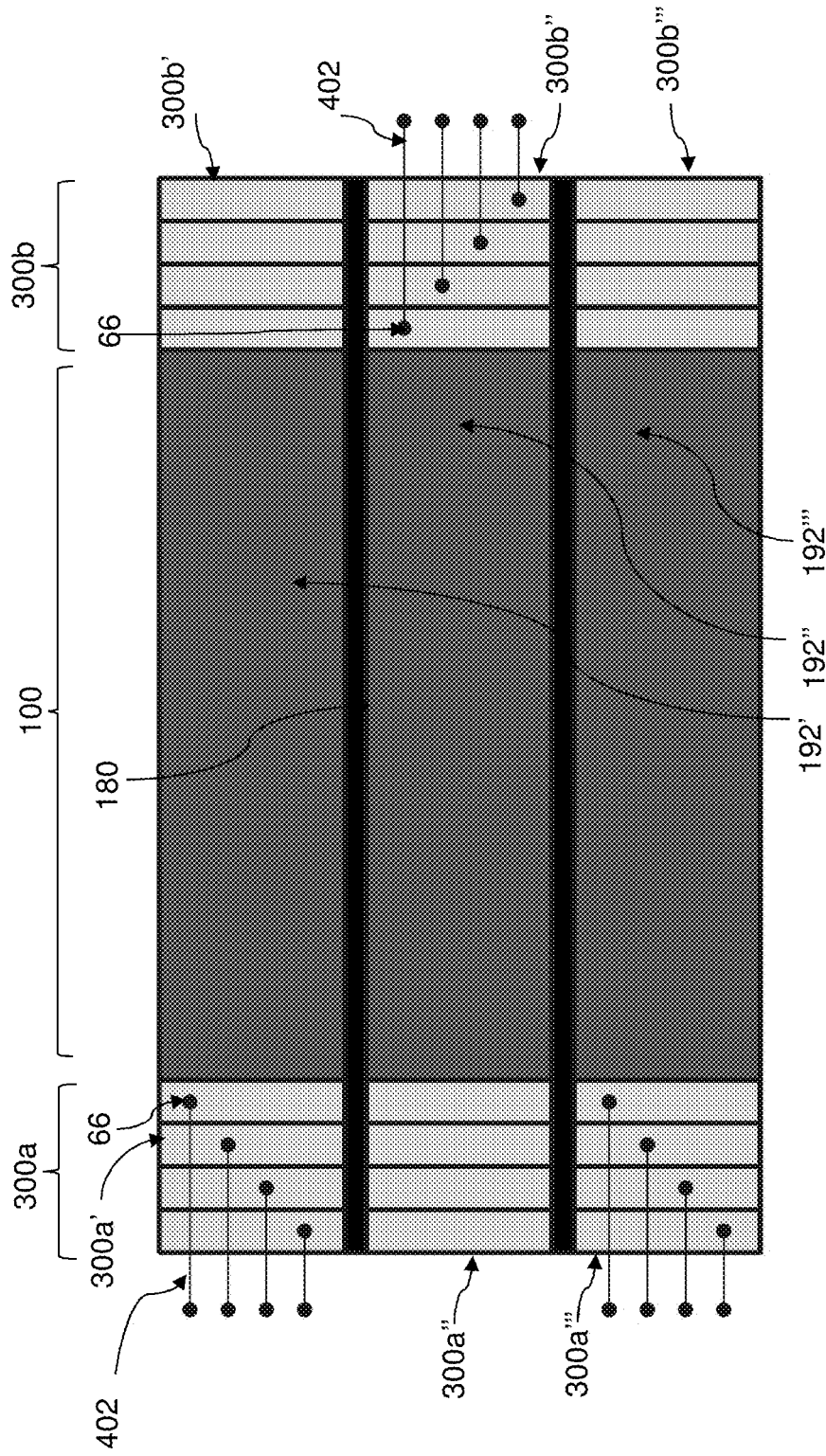
FIGS. 2D and 2E are plan views of prior art structures.
Figure 2E:
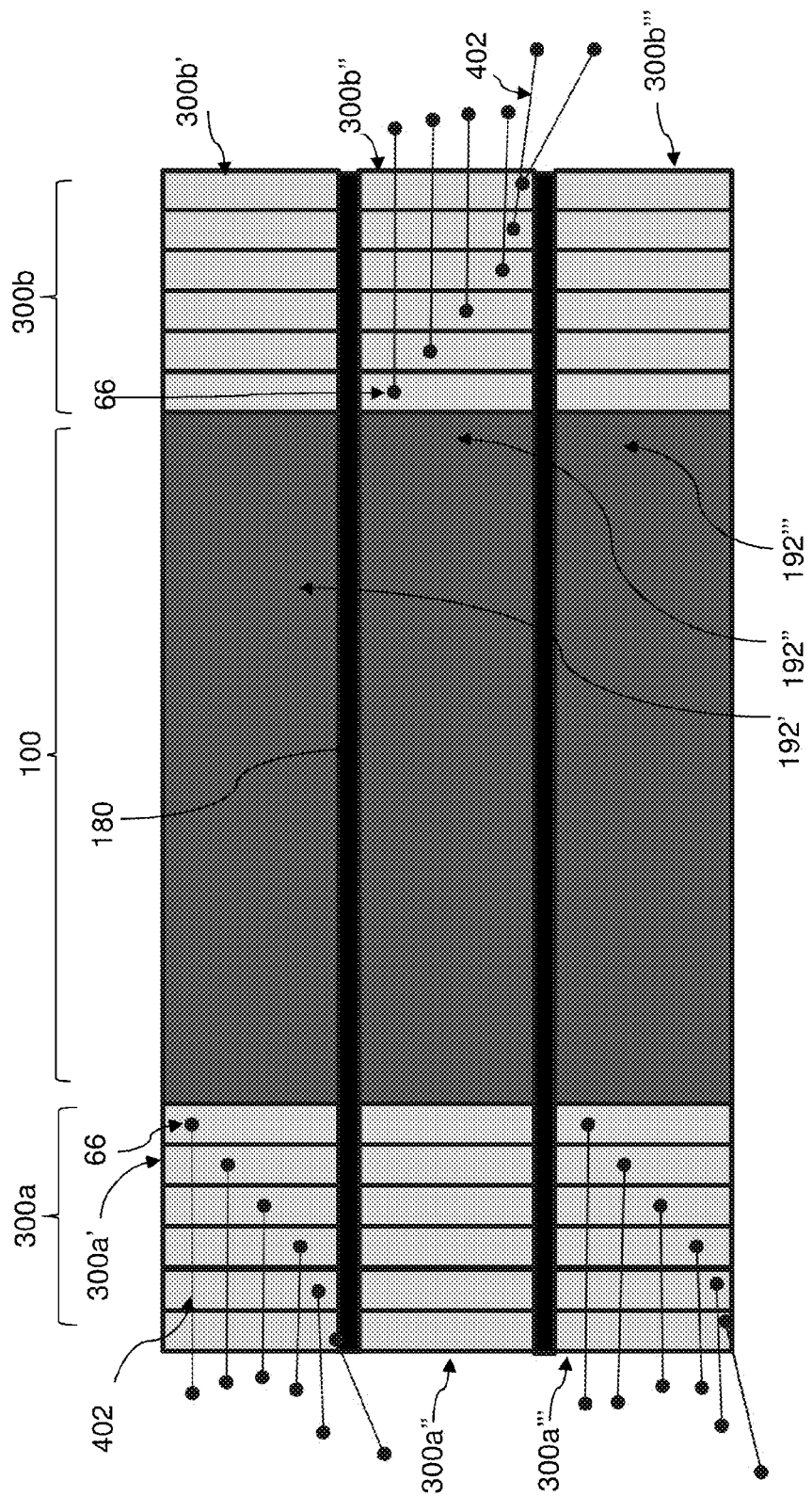

FIGS. 2D and 2E illustrate top views of the structures of the prior art devices. In the prior art devices, every other sub-region in each contact region 300a, 300b contains via contacts 66 and interconnects 402. For example, sub-regions 300a', 300a''' and 300b" contain via contacts 66 and interconnects 402, while opposite sub-regions 300b', 300b''' and 300a" are dummy sub-regions which contain no via contacts 66 and interconnects 402. However, the via contacts 66 in each sub-region 300a', 300a''' and 300b" are in contact with both odd numbered and even numbered word line fingers 192', 192" and 192''' that extend into the respective sub-region. Thus, for a given number of word levels in a stack, there are twice as many via contacts 66 and respective interconnects 402 in each non-dummy sub-region 300a', 300a''' and 300b" than in each sub-region of the device of FIG. 2B according to an embodiment of the present disclosure.

As can be seen from FIGS. 2D and 2E, the width of each sub-region in the horizontal direction between adjacent backside trenches 180 depends on the number of word lines in the stack in the device. For a stack with relatively few word lines shown in FIG. 2D, each sub-region contains a sufficient width to accommodate all required via contacts 66 and interconnects 402. However, once the number of word lines in the stack increases, as shown in FIG. 2E, the width of each sub-region becomes too small to accommodate all requires via contacts 66 and interconnects 402. In other word, the required word line contact area size become larger than that allocated in the terraced steps (i.e., in the staircase).

The device of the embodiments of the present disclosure shown in FIGS. 2A-2C solves this area problem by splitting the word line contacts to sub-regions located on both sides of the word line fingers in each finger stack between adjacent back side trenches 180. Each sub-region contains about half of the via contacts 66 and interconnects 402 compared to those of the prior art devices.

In one embodiment, the configuration of the embodiments of the disclosure is advantageous because it does not require radical process changes and because it cuts the required sub-region area (i.e., the area of each step 70) by about half compared to the that of prior art devices. The vertical height of each step 70 (except the top step 70a) is two times that of the steps of the prior art devices, since each step contains two word lines. Thus, a step is needed for only about half of all word lines in the stack. In contrast, a step is formed on both sides of the memory region 100 for every word line in the prior art devices, and about half of the sub-regions are left unused as dummy sub-regions. Thus, the prior art devices utilize valuable space over the substrate less efficiently.

Steps of a method of fabricating an in-process device structure containing vertical NAND memory devices according to an embodiment of the present disclosure shown in FIG. 1 is illustrated in FIGS. 3-17.

The process according to the embodiment illustrated includes applying a mask having at least one mask opening and performing an anisotropic etch. The steps are sequentially repeated with different masks to form at least two stepped word line contact regions.

The locations of the mask openings in the masks can be selected to include areas of the electrically conductive via contacts to be subsequently formed and to extend to different levels of the alternating stack (32, 42). As used herein, a "level" of a structure including alternating layers is defined as the relative position of a unit of repetition, which is a pair of a first material layer and a second material layer, within the structure. Each adjoining pair of a first material layer and a second material layer within a structure containing the alternating layers can be assigned an integer selected from a set of positive integers such that the assigned integer increases by 1, or decreases by one, as one counts each pair of the first and second material layers from one end of the structure to the opposite end of the structure. Each integer corresponds to a level (e.g., level 1) within the structure.

Figure 3:
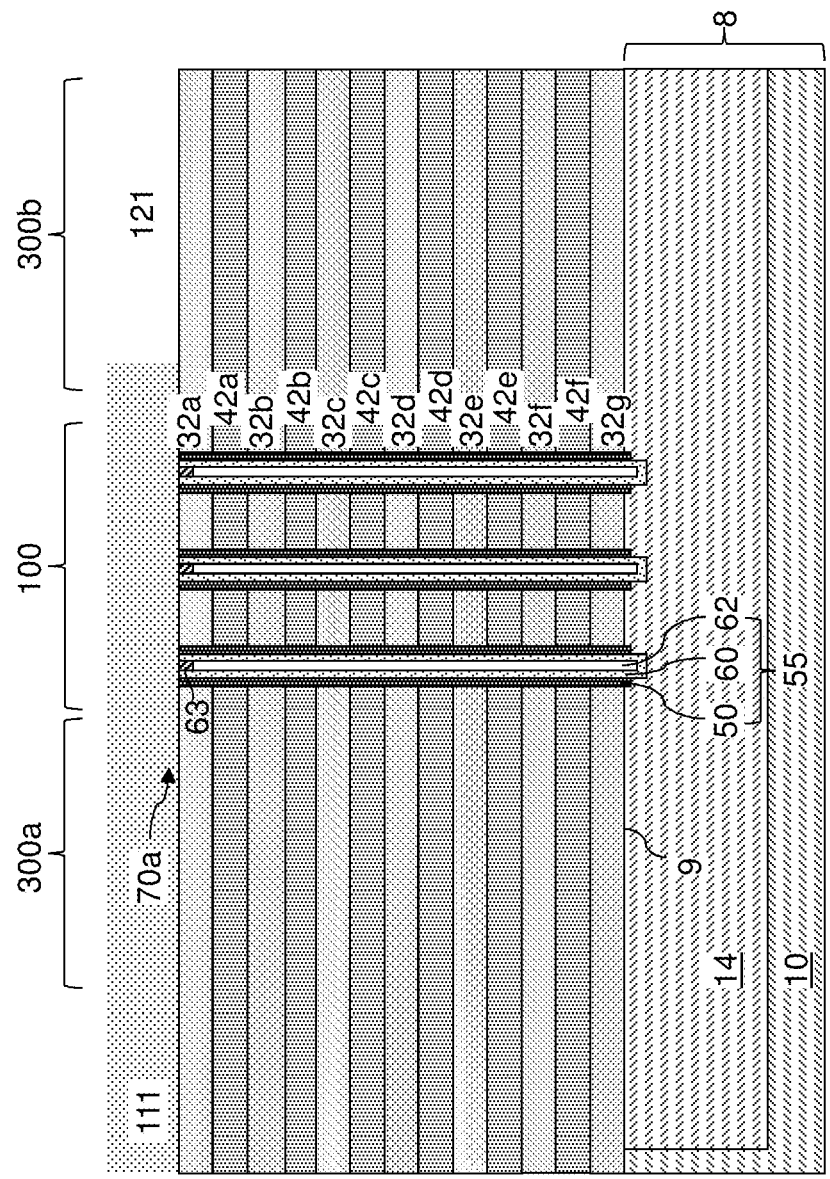
FIGS. 3-17 illustrate sequential vertical cross-sectional views of processing steps to fabricate an in-process device structure containing vertical NAND memory devices according to an embodiment of the present disclosure shown in FIG. 1.

For the purpose of facilitating description of the various embodiments of the present disclosure, the different levels of the material layers of the present disclosure are assigned different level names. The topmost layer among the insulator layers 32 is herein referred to as a first insulator layer 32a, as shown in FIGS. 1, 2A, and 3. In an alternating stack (32, 42) including a total of N sacrificial layers, the sacrificial layer 42 contacting the bottom surface of the first insulator layer 32a is herein referred to as a first sacrificial layer 42a or an N-th-from-bottom sacrificial layer. The first sacrificial layer 42a and the first insulator layer 32a collectively constitute a first-from-top level or an N-th-from-bottom level. The insulator layer 32 contacting the bottom surface of the first sacrificial layer 42a (which is the N-th-from-bottom sacrificial layer) is herein referred to as a second insulator layer 32b. For every integer i that is greater than 1 and not greater than the total number N of the sacrificial layers 42 in the alternating stack (32, 42), the sacrificial layer 42 contacting the bottom surface of the i-th insulator layer is herein referred to as the i-th sacrificial layer or the (N+1−i)-th-from-bottom sacrificial layer. Similarly, for every integer i that is greater than 1 and not greater than the total number of the sacrificial layers 42 in the alternating stack (32, 42), the insulator layer 32 contacting the bottom surface of the i-th sacrificial layer is herein referred to as the (i−1)-th insulator layer or the (N+1−i)-th-from-bottom insulator layer. If a total of N sacrificial layers 42 exist in the alternating stack (32, 42), the N-th insulator layer is the insulator layer that is the most proximal to the substrate 8 among the insulator layers 32 in the alternating stack (32, 42).

Thus, the alternating stack (32, 42) having N=6 sacrificial layers 42 includes, from top to bottom, a first insulator layer 32a, a first sacrificial layer 42a, a second insulator layer 32b, a second sacrificial layer 42b, a third insulator layer 32c, a third insulator layer 42c, at least one intermediate insulator layer 32d and at least one intermediate sacrificial layer 42d, an (N−1)-th insulator layer 32e, an (N−1)-th sacrificial layer 42e, an N-th insulator layer 32f, an N-th sacrificial layer 42f, and an (N+1)-th bottom insulator layer 32g. It is understood that an insulator layer 32 can refer to any of, or each of, the various N+1 insulator layers (32a, 32b, 32c, 32d, 32e, 32f, 32g), and a sacrificial layer 42 can refer to any of, or each of, the various N sacrificial layers (42a, 42b, 42c, 42d, 42e, 42f). Further, insulator layers 32 can refer to any plurality of, or all of, the various insulator layers (32a, 32b, 32c, 32d, 32e, 32f, 32g), and sacrificial layers 42 can refer to any plurality of, or all of, the various sacrificial layers (42a, 42b, 42c, 42d, 42e, 42f). While the stack includes six sacrificial layers for clarity, the stack may contain more than six sacrificial layers, as shown in FIGS. 2C and 34-36.

As shown in FIG. 3, a first step 70a corresponds to a portion of the first insulator layer 32a in a first stepped word line contact region 300a.

A first mask 111 is formed over the alternating stack (32, 42), the channel and memory structures 55 and the drain regions 63, as shown in FIG. 3. The first mask 111 includes a first mask opening 121, which exposes a portion of the stack in a second stepped word line contact region 300b corresponding to a terrace opening that forms second step 70b. As used herein, a terrace opening refers to a cavity having sidewalls that extend from, and adjoin, a top surface of a structure and extend to a depth within the structure. The bottom of a terrace opening may have a surface vertically recessed from the top surface of the structure, or can have an opening that is connected to another cavity underlying the terrace opening. A terrace opening as initially formed may be a cavity having an opening, and can be subsequently filled with at least one material portion.

In some embodiments, the first mask 111 is a hard mask layer. In certain embodiments, the first mask layer 111 comprises, for example, a photoresist layer, an organic material layer, a dielectric material layer, a semiconductor material layer, or a stack of plural layers, such as a hard mask and photoresist layer stack. In one embodiment, the first mask 111 is a hard mask layer, and can be a dielectric material layer including a material that is different from the material of the insulator layers 32 and the sacrificial layers 42, and that can be uniformly etched or recessed by a wet etch or a dry etch. In one embodiment, first mask 111 can include a dielectric material such as silicon oxide or an insulating metal oxide (such as $Al_2O_3$, $HfO_2$, $Ta_2O_5$, etc.). The first mask 111 can be deposited, for example, by chemical vapor deposition. The thickness of the first mask 111 can be in a range from 30 nm to 10 microns, although lesser and greater thicknesses can also be employed. In another embodiment, the first mask 111 can be a photoresist layer having a thickness in a range from 2 microns to 5 microns.

If the first mask 111 is a photoresist layer, then the first mask 111 can be lithographically patterned, i.e., by a combination of lithographic exposure and development. If the first mask 111 is not a photoresist layer, the first mask 111 can be patterned by application of a photoresist layer thereupon, lithographic patterning of the photoresist layer, and etching of the portions of the first mask 111 that are not covered by the remaining portion of the photoresist layer, for example, by an anisotropic etch. The photoresist layer may be removed after patterning the first mask 111.

Figure 4:
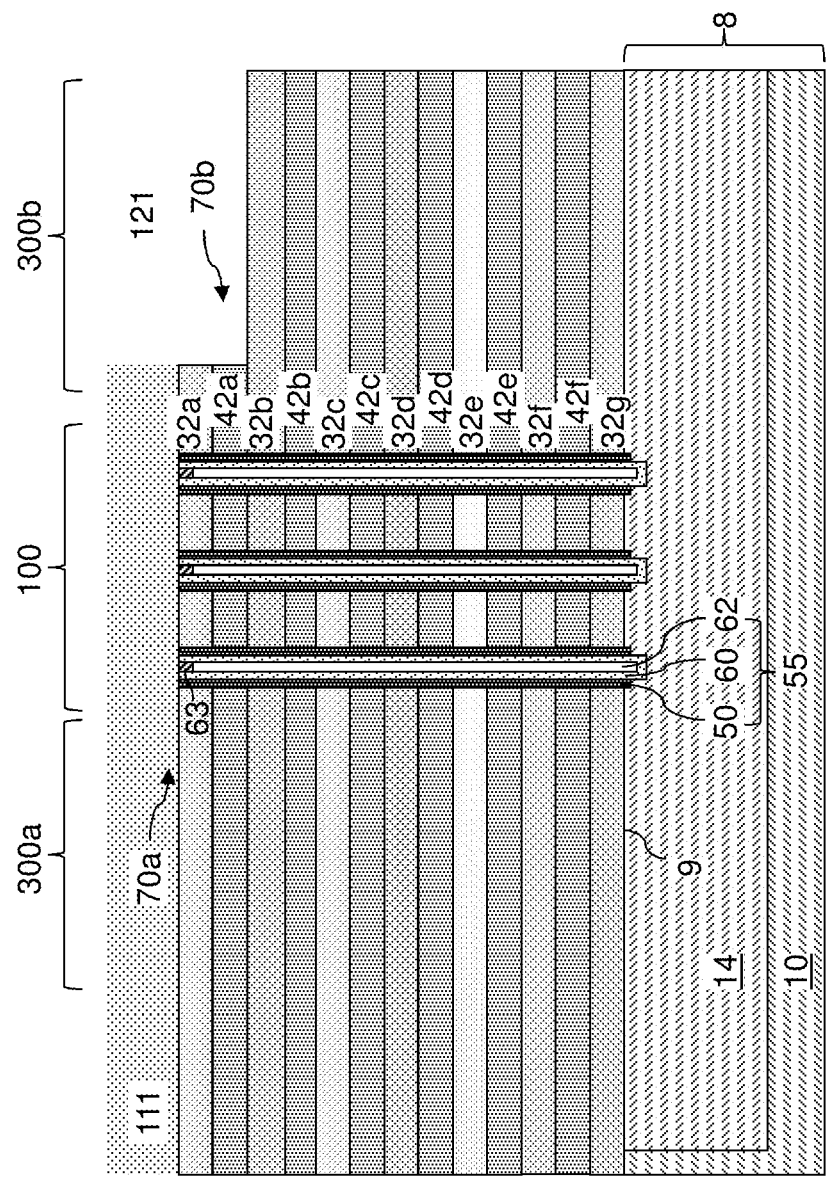

Each portion of the first insulator layer 32a and the first sacrificial layer 42a underlying the first mask opening 121 is anisotropically etched employing the first mask 111 as an etch mask to form a terrace opening forming second step 70b, as shown in FIG. 4. In some embodiments, the terrace opening forming second step 70b extends substantially perpendicular to the major surface of the substrate 8. In one embodiment, the chemistry of the anisotropic etch can be selected such that the bottom surface of the terrace opening forming second step 70b is formed between the top surface and the bottom surface of first sacrificial layer 42a, or at the bottom surface of first sacrificial layer 42a, or at the top surface of second insulator layer 32b, or between the top surface and the bottom surface of second insulator layer 32b at the end of the processing step shown in FIG. 4. In one embodiment, the chemistry of the anisotropic etch process can be such that portions of the first insulator layer 32a and the first sacrificial layer 42a underlying the first mask opening 121 can be etched by the anisotropic etch. In this case, the bottom surface of the terrace opening forming second step 70b can be formed at the top surface of the second insulator layer 32b, which is coplanar with the bottom surface of the first sacrificial layer 42a. In some embodiments, the anisotropic etch can include multiple steps. Alternately, the chemistry of the anisotropic etch can be selective to the second material, i.e., the material of the sacrificial layers 42, and the bottom surface of an intermediate terrace opening can be formed at the top surface of the first sacrificial layer 42a. In this case, a second anisotropic etch can be selective to the first material, i.e., the material of the insulator layers 32, and the bottom surface of the terrace opening can be formed at the top surface of the second insulator layer 32b.

Figure 5:
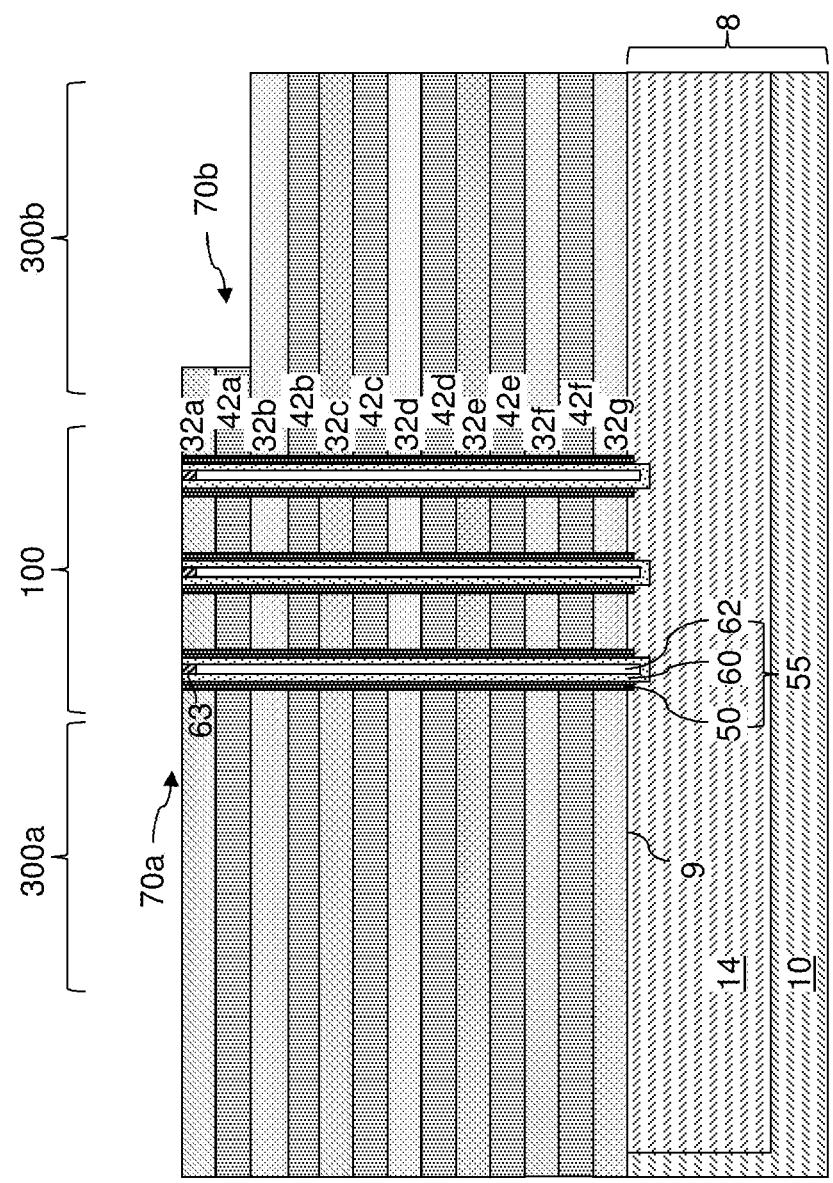

As shown in FIG. 5, the first mask 111 is then removed. In some embodiments, the first mask 111 is photoresist, and can be removed, for example, by ashing.

Figure 6:
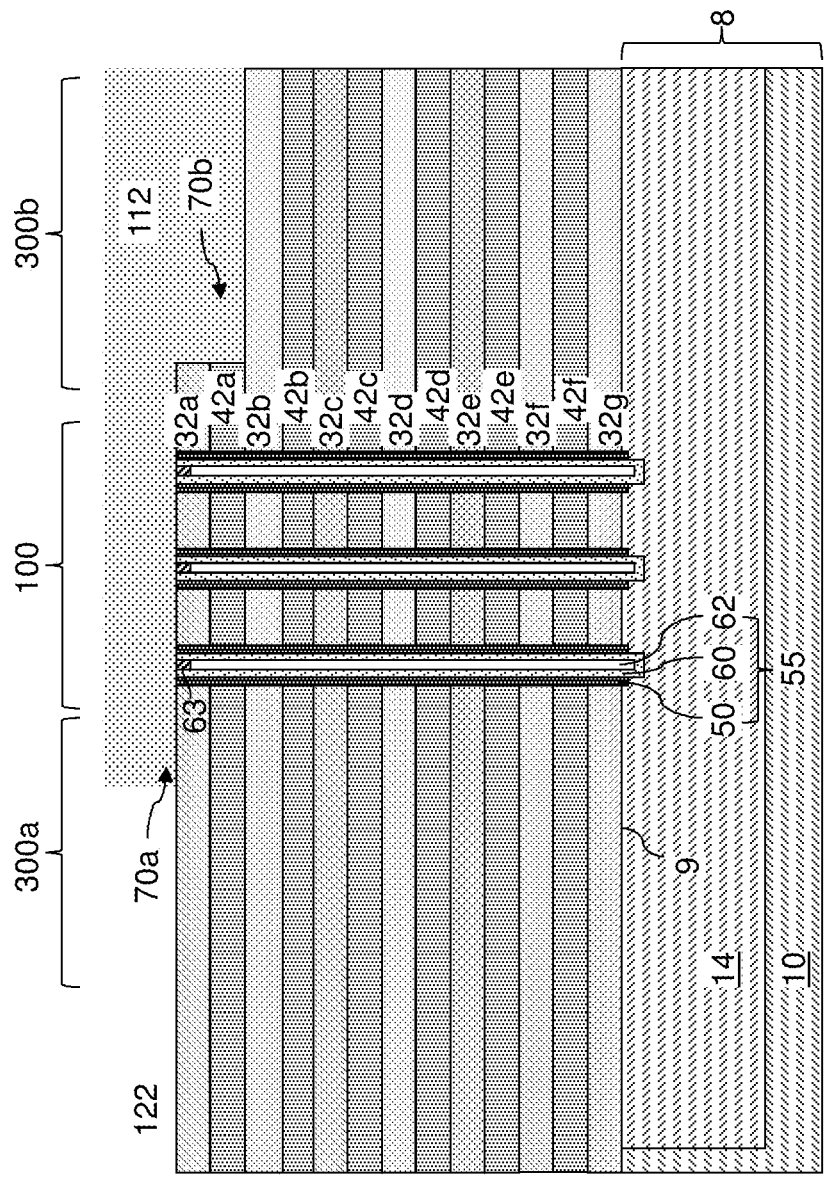

Referring to FIG. 6, a second mask 112 is formed over the alternating stack (32, 42), the channel and memory structures 55 and the drain regions 63, and in the second step 70b. In various embodiments, the second mask 112 comprises, for example, a photoresist layer, an organic material layer, a dielectric material layer, or a semiconductor material layer. In some embodiments, the second mask 112 comprises the same material as the first mask 111.

The thickness of the second mask 112 can be in a range from 30 nm to 10 microns, although lesser and greater thicknesses can also be employed. In one embodiment, the second mask 112 has approximately the same thickness as the first mask 111.

Similar to the first mask 111, the second mask 112 can be patterned with at least one second mask opening 122 to physically expose a portion of the alternating stack (32, 42) that is different from the portion of the alternating stack (32, 42) exposed by the first mask opening 121. In the embodiment shown in FIG. 6, second mask opening 122 is in the first stepped word line contact region 300a. The second mask 112 may be patterned by any method, for example a method described above with respect to the first mask 111.

Figure 7:
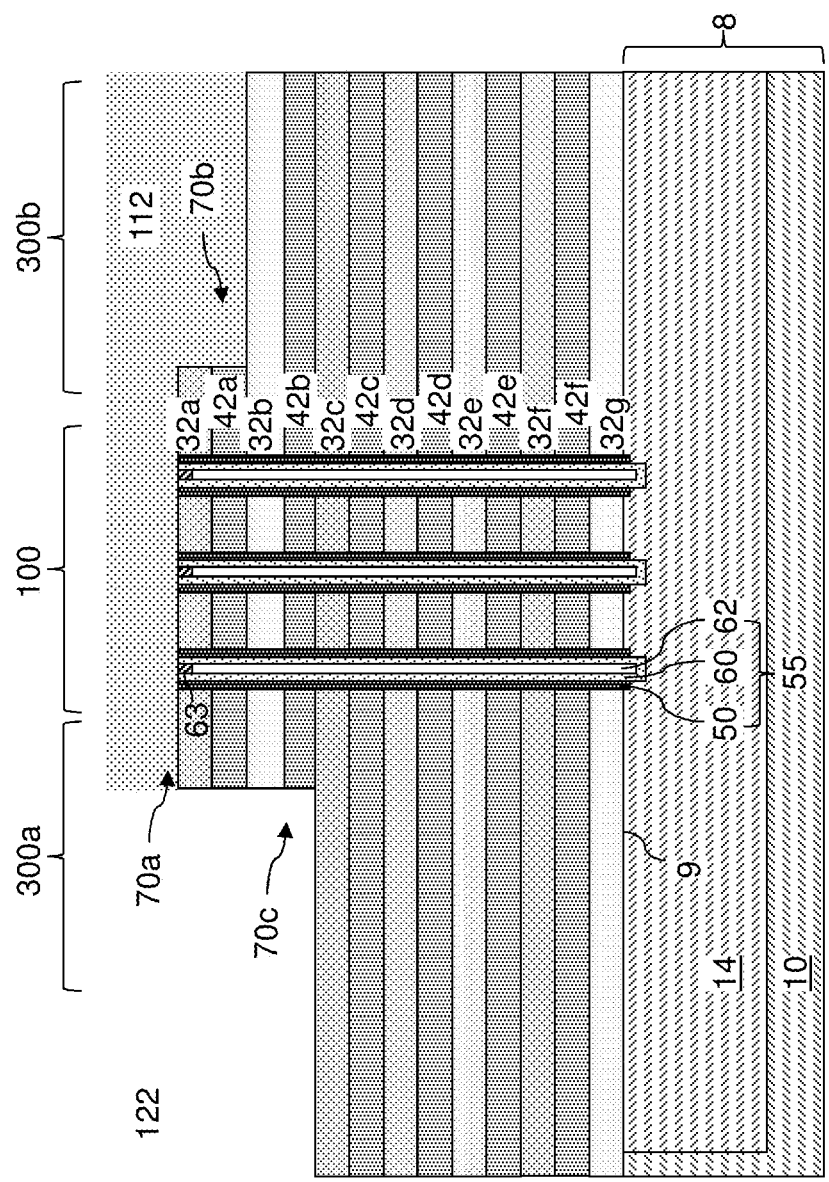

A portion of the stack (32,42) underlying the second mask opening 122 is anisotropically etched employing the second mask 112 as an etch mask to form a terrace opening forming third step 70c, as shown in FIG. 7. As shown in FIG. 7, an anisotropic etch process is performed to form a vertical terrace opening through the first insulator layer 32a, the first sacrificial layer 42a, the second insulator layer 32b, and the second sacrificial layer 42b, to expose the third insulator layer 32c. In some embodiments, the anisotropic etch process shown in FIG. 7 includes more than one anisotropic etch, for example a first etch to etch a terrace opening through first insulator layer 32a, a second etch to etch through first sacrificial layer 42a, a third etch to etch through second insulator layer 32b, and a fourth etch to etch through second sacrificial layer 42b to form a terrace opening forming third step 70c. In other embodiments, the anisotropic etch process shown in FIG. 7 includes one, two or three etch steps.

Figure 8:
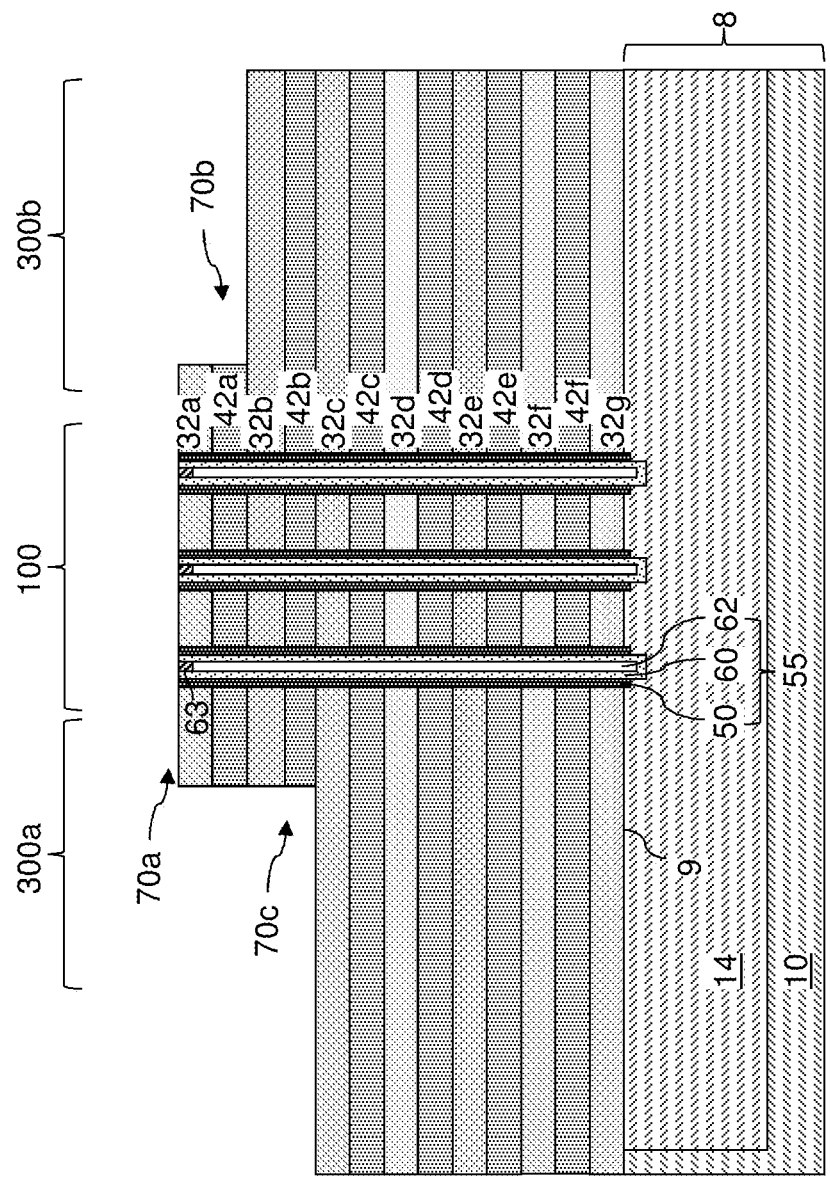

As shown in FIG. 8, the second mask 112 is then removed.

Figure 9:
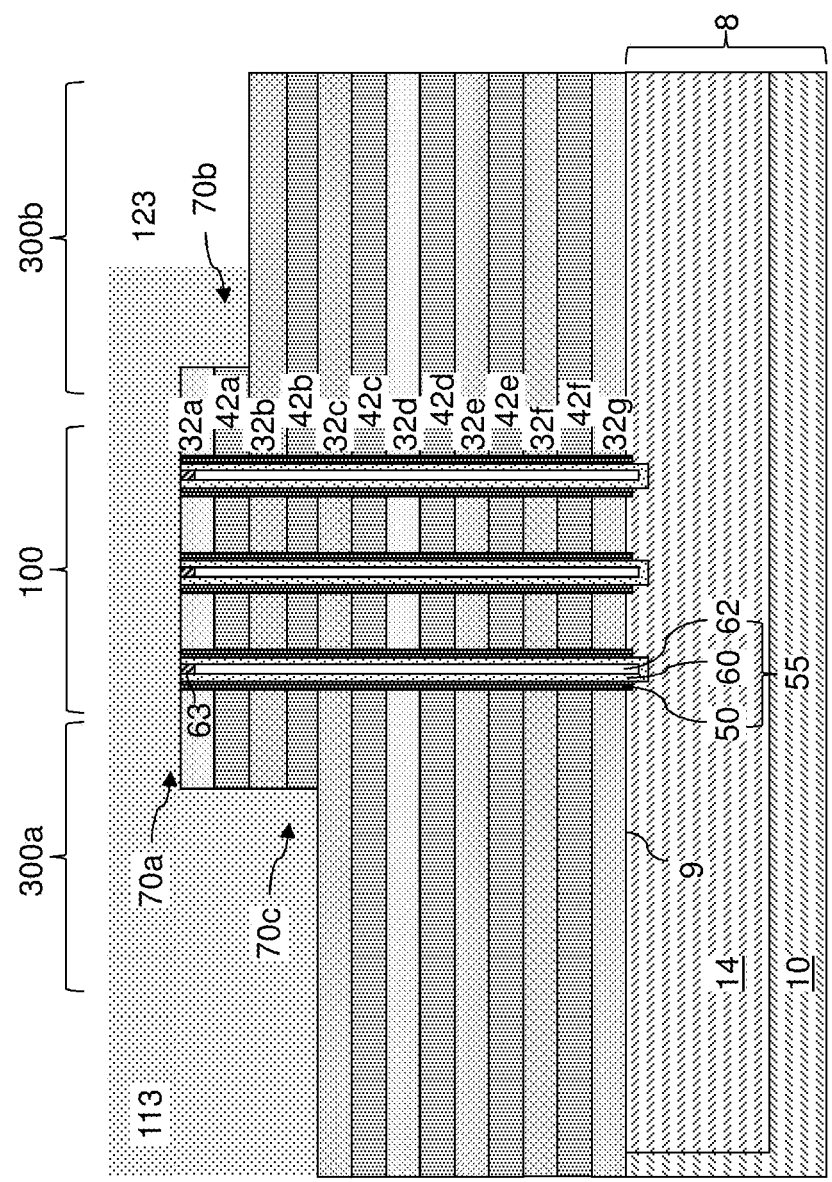

Referring to FIG. 9, a third mask 113 is formed over the alternating stack (32, 42), the channel and memory structures 55 and the drain regions 63, and in the third step 70c and a portion of second step 70b. In various embodiments, the third mask 113 comprises, for example, a photoresist layer, an organic material layer, a dielectric material layer, or a semiconductor material layer. In some embodiments, the third mask 113 comprises the same material as the first mask 111 or the second mask 112.

The thickness of the third mask 113 can be in a range from 30 nm to 10 microns, although lesser and greater thicknesses can also be employed. In one embodiment, the third mask 113 has approximately the same thickness as the first mask 111 or the second mask 112.

Similar to the first mask 111, the third mask 113 can be patterned with at least one third mask opening 123 to physically expose a portion of the alternating stack (32, 42) that is different from the portions of the alternating stack (32, 42) exposed by the first mask opening 121 and the second mask opening 122. In the embodiment shown in FIG. 9, third mask opening 123 is in the second stepped word line contact region 300b exposing an outer portion of the insulator layer 32b in step 70b distal from the device region 100. The third mask 113 covers the inner portion of the insulator layer 32b proximal to the device region 100. The third mask 113 may be patterned by any method, for example a method described above with respect to the first mask 111.

Figure 10:
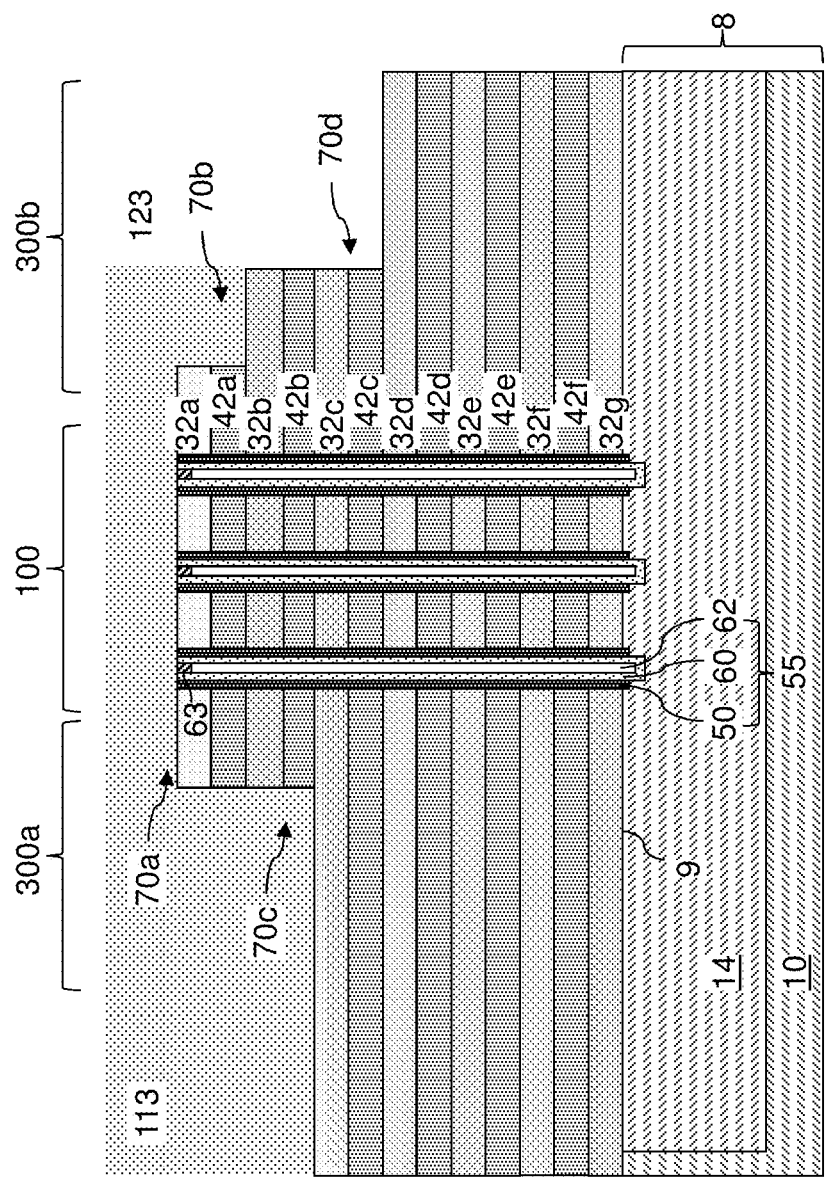

A portion of the stack (32,42) underlying the third mask opening 123 is anisotropic ally etched employing the third mask 113 as an etch mask to form a terrace opening forming fourth step 70d, as shown in FIG. 10. As shown in FIG. 10, an anisotropic etch process is performed to form a vertical terrace opening through the second insulator layer 32b, the second sacrificial layer 42b, the third insulator layer 32c, and the third sacrificial layer 42c. In some embodiments, the anisotropic etch process shown in FIG. 10 includes more than one anisotropic etch, for example a first etch to etch a terrace opening through second insulator layer 32b, a second etch to etch through second sacrificial layer 42b, a third etch to etch through third insulator layer 32c, and a fourth etch to etch through third sacrificial layer 42c to form a terrace opening forming fourth step 70d. In other embodiments, the anisotropic etch process shown in FIG. 10 includes one, two or three etch steps.

Figure 11:
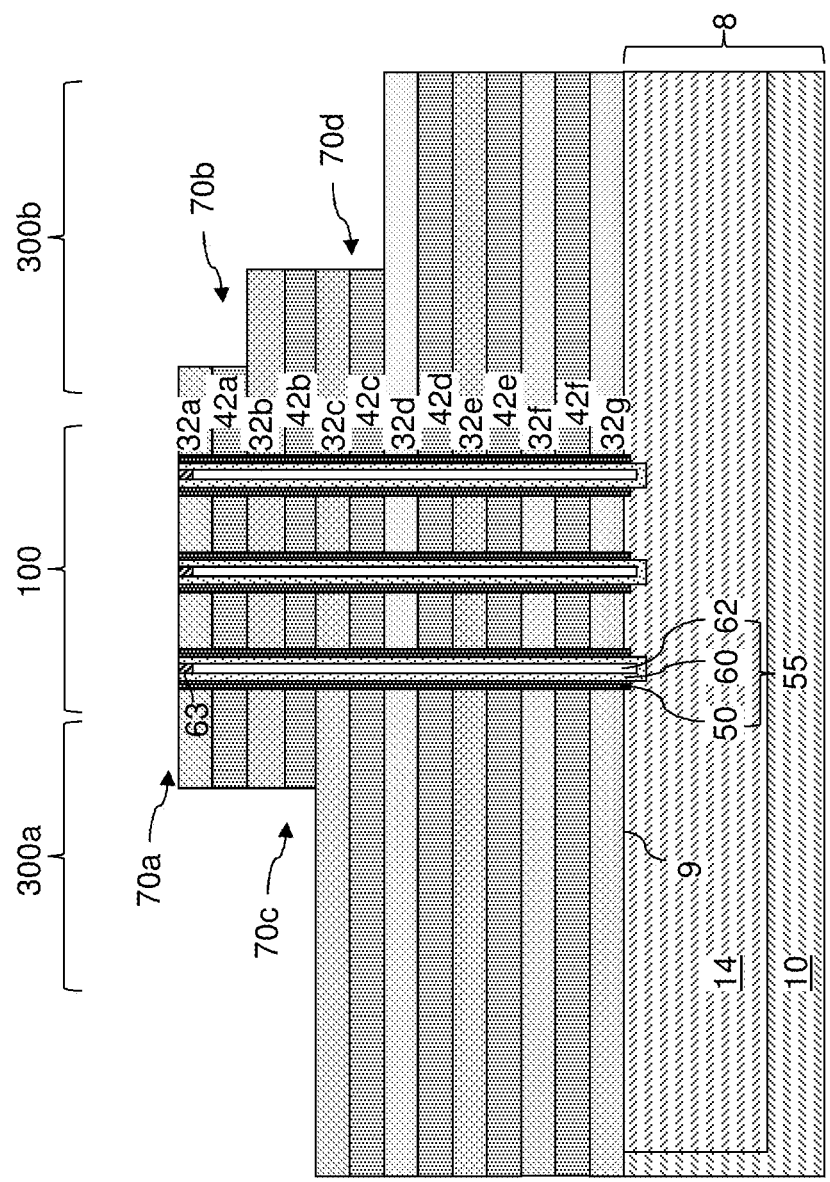

As shown in FIG. 11, the third mask 113 is then removed.

Figure 12:
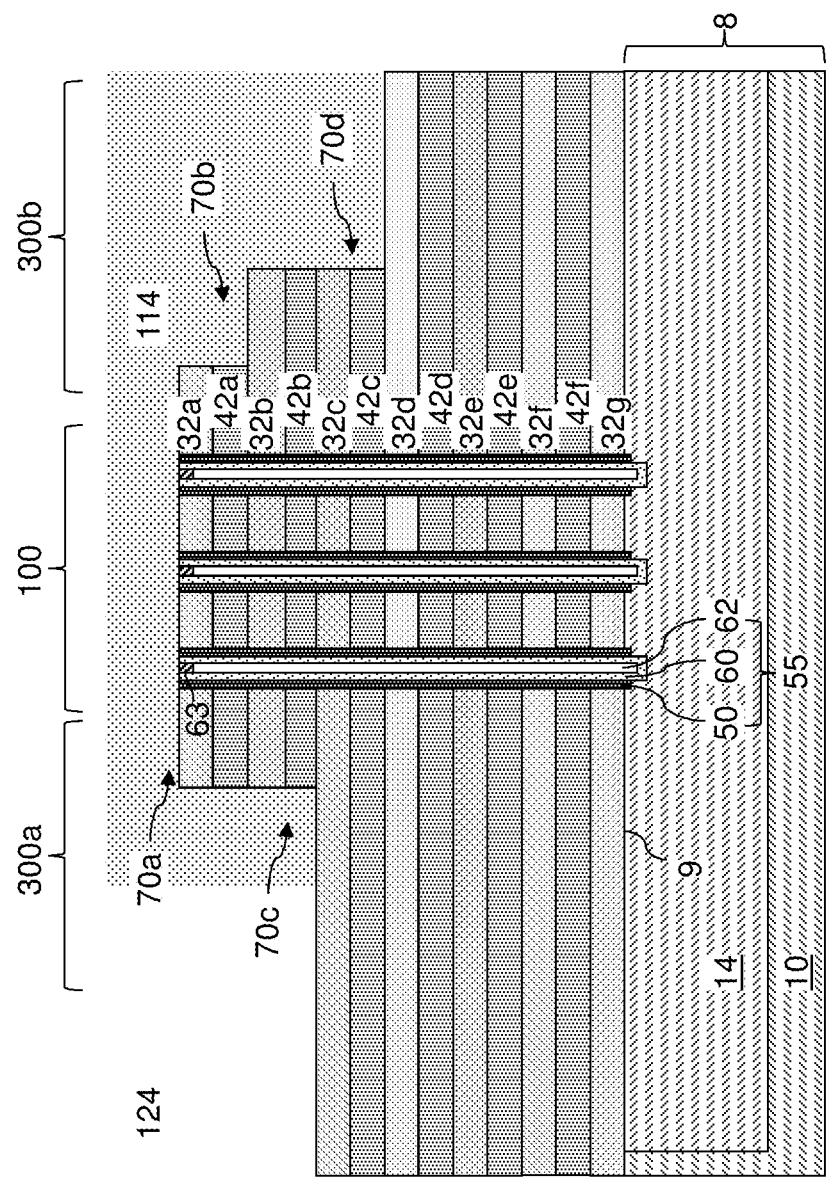

Referring to FIG. 12, a fourth mask 114 is formed over the alternating stack (32, 42), the channel and memory structures 55 and the drain regions 63, and in second step 70b, fourth step 70d, and a portion of third step 70c. In various embodiments, the fourth mask 114 comprises, for example, a photoresist layer, an organic material layer, a dielectric material layer, or a semiconductor material layer. In some embodiments, the fourth mask 114 comprises the same material as the first mask 111, the second mask 112, or the third mask 113.

The thickness of the fourth mask 114 can be in a range from 30 nm to 10 microns, although lesser and greater thicknesses can also be employed. In one embodiment, the fourth mask 114 has approximately the same thickness as the first mask 111, the second mask 112, or the third mask 113.

Similar to the first mask 111, the fourth mask 114 can be patterned with at least one fourth mask opening 124 to physically expose a portion of the alternating stack (32, 42) that is different from the portions of the alternating stack (32, 42) exposed by the first mask opening 121, the second mask opening 122, and the third mask opening 123. In the embodiment shown in FIG. 12, fourth mask opening 124 is in the first stepped word line contact region 300a exposing an outer portion of the insulator layer 32c in step 70c distal from the device region 100. The fourth mask 114 covers the inner portion of the insulator layer 32c proximal to the device region 100. The fourth mask 114 may be patterned by any method, for example a method described above with respect to the first mask 111.

Figure 13:
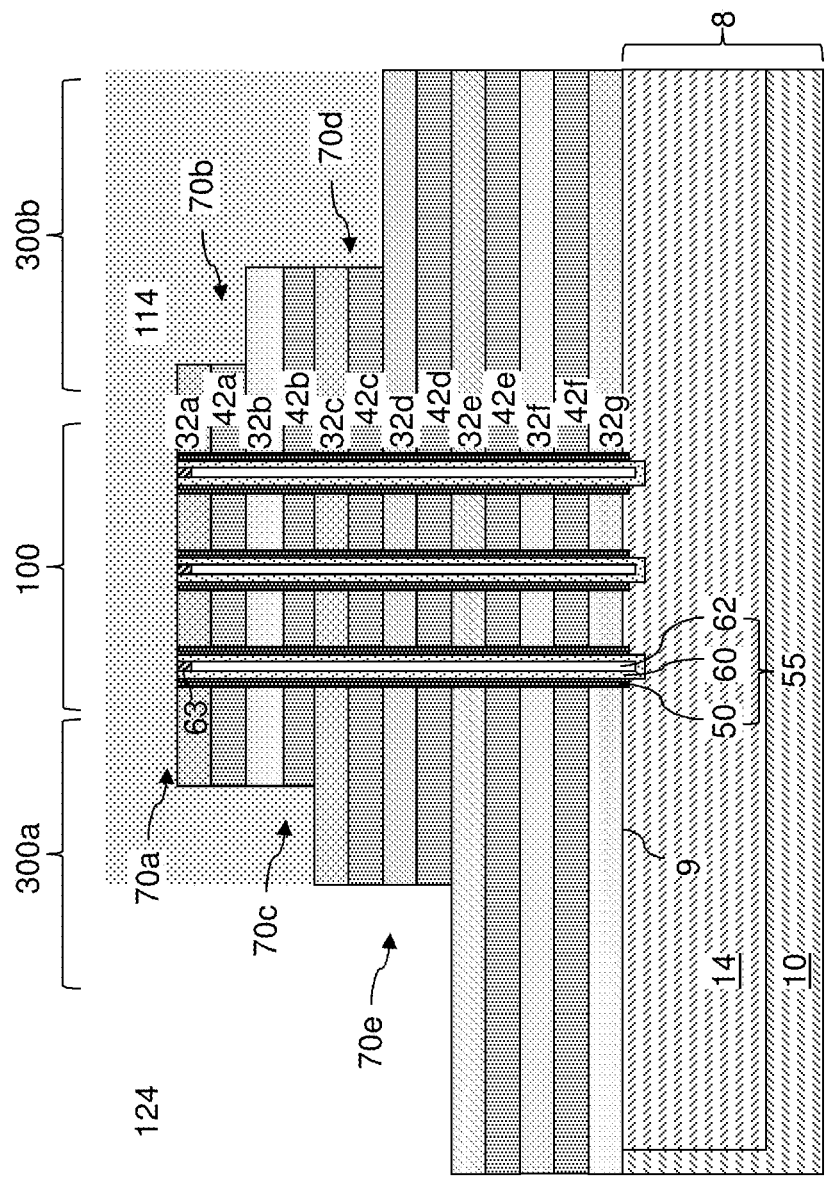

A portion of the stack (32,42) underlying the fourth mask opening 124 is anisotropically etched employing the fourth mask 114 as an etch mask to form a terrace opening forming fifth step 70e, as shown in FIG. 13. As shown in FIG. 13, an anisotropic etch process is performed to form a vertical terrace opening through the third insulator layer 32c, the third sacrificial layer 42c, the fourth insulator layer 32d, and the fourth sacrificial layer 42d. In some embodiments, the anisotropic etch process shown in FIG. 13 includes one anisotropic etch step or more than one anisotropic etch steps, as described above.

Figure 14:
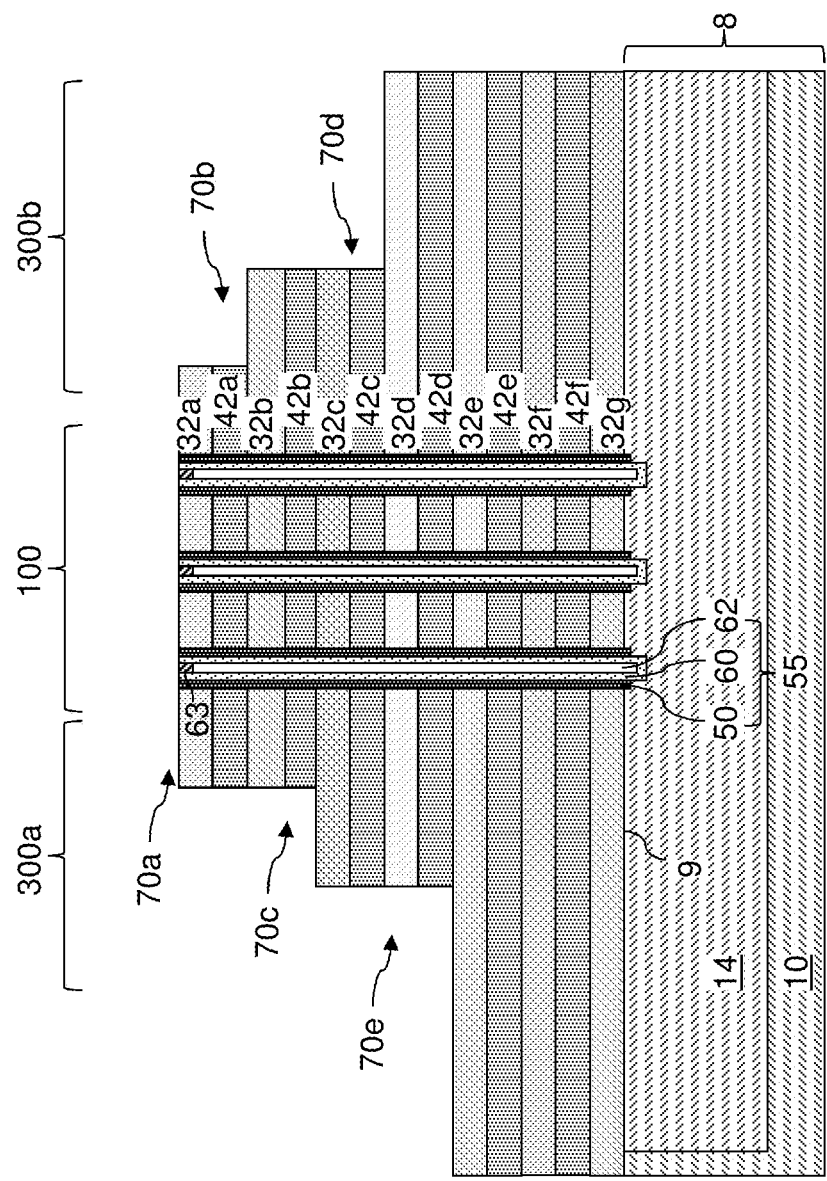

As shown in FIG. 14, the fourth mask 114 is then removed.

Figure 15:
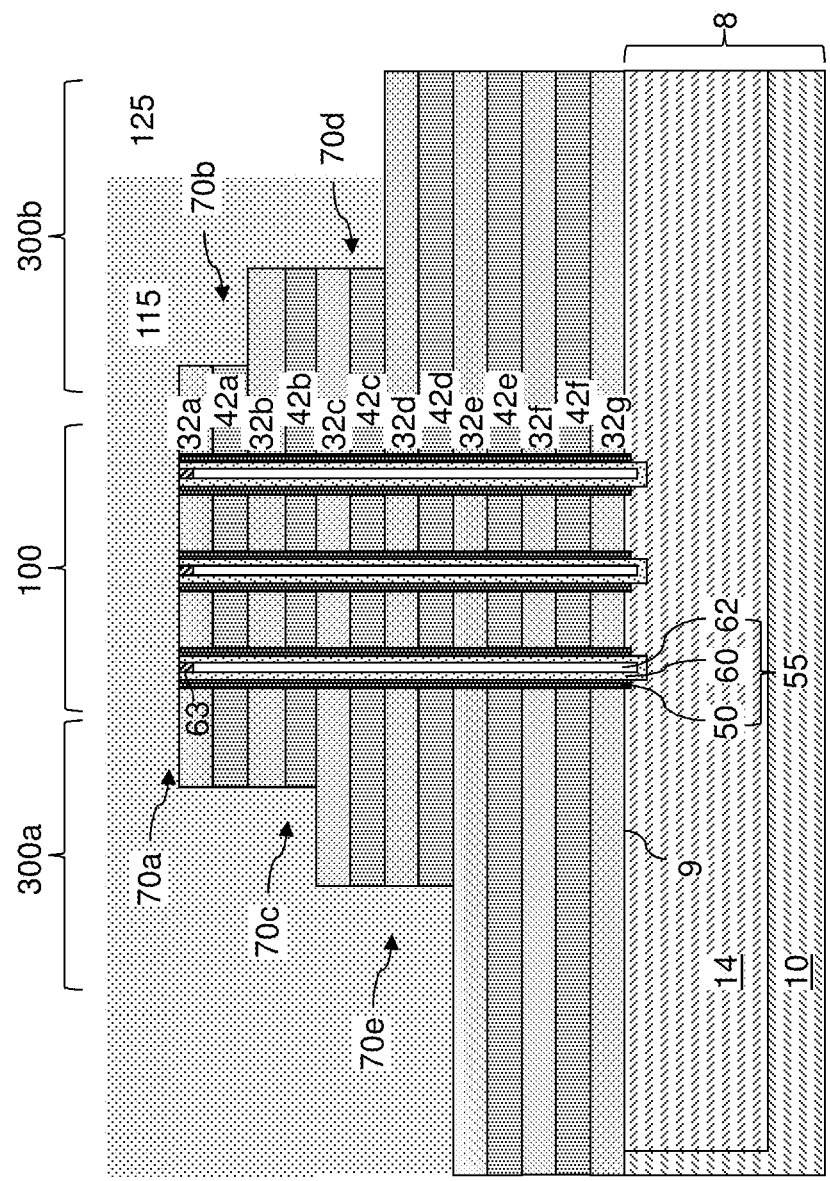

Referring to FIG. 15, a fifth mask 115 is formed over the alternating stack (32, 42), the channel and memory structures 55 and the drain regions 63, and in third step 70c, fifth step 70e, and a portion of second step 70b and fourth step 70d. In various embodiments, the fifth mask 115 comprises, for example, a photoresist layer, an organic material layer, a dielectric material layer, or a semiconductor material layer. In some embodiments, the fifth mask 115 comprises the same material as the first mask 111, the second mask 112, the third mask 113, or the fourth mask 114.

The thickness of the fifth mask 115 can be in a range from 30 nm to 10 microns, although lesser and greater thicknesses can also be employed. In one embodiment, the fifth mask 115 has approximately the same thickness as the first mask 111, the second mask 112, the third mask 113, or the fourth mask 114.

Similar to the first mask 111, the fifth mask 115 can be patterned with at least one fifth mask opening 125 to physically expose a portion of the alternating stack (32, 42) that is different from the portions of the alternating stack (32, 42) exposed by the first mask opening 121, the second mask opening 122, the third mask opening 123, and the fourth mask opening 124. In the embodiment shown in FIG. 15, fifth mask opening 125 is in the second stepped word line contact region 300b exposing an outer portion of the insulator layer 32d in step 70d distal from the device region 100. The fifth mask 115 covers the inner portion of the insulator layer 32d proximal to the device region 100. The fifth mask 115 may be patterned by any method, for example a method described above with respect to the first mask 111.

Figure 16:
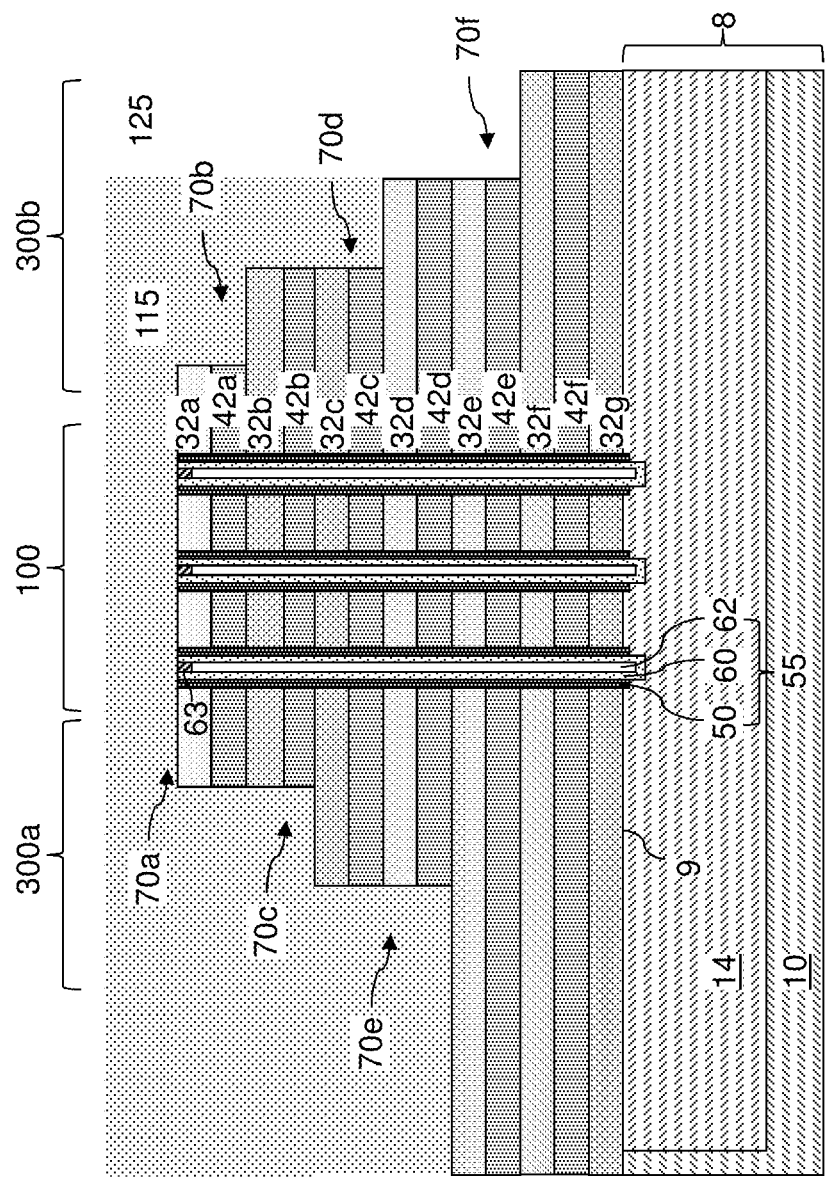

A portion of the stack (32,42) underlying the fifth mask opening 125 is anisotropic ally etched employing the fifth mask 115 as an etch mask to form a terrace opening forming sixth step 70f as shown in FIG. 16. As shown in FIG. 16, an anisotropic etch process is performed to form a vertical terrace opening through the fourth insulator layer 32d, the fourth sacrificial layer 42d, the fifth insulator layer 32e, and the fifth sacrificial layer 42e. In some embodiments, the anisotropic etch process shown in FIG. 16 includes one anisotropic etch step or more than one anisotropic etch steps, as described above.

Figure 17:
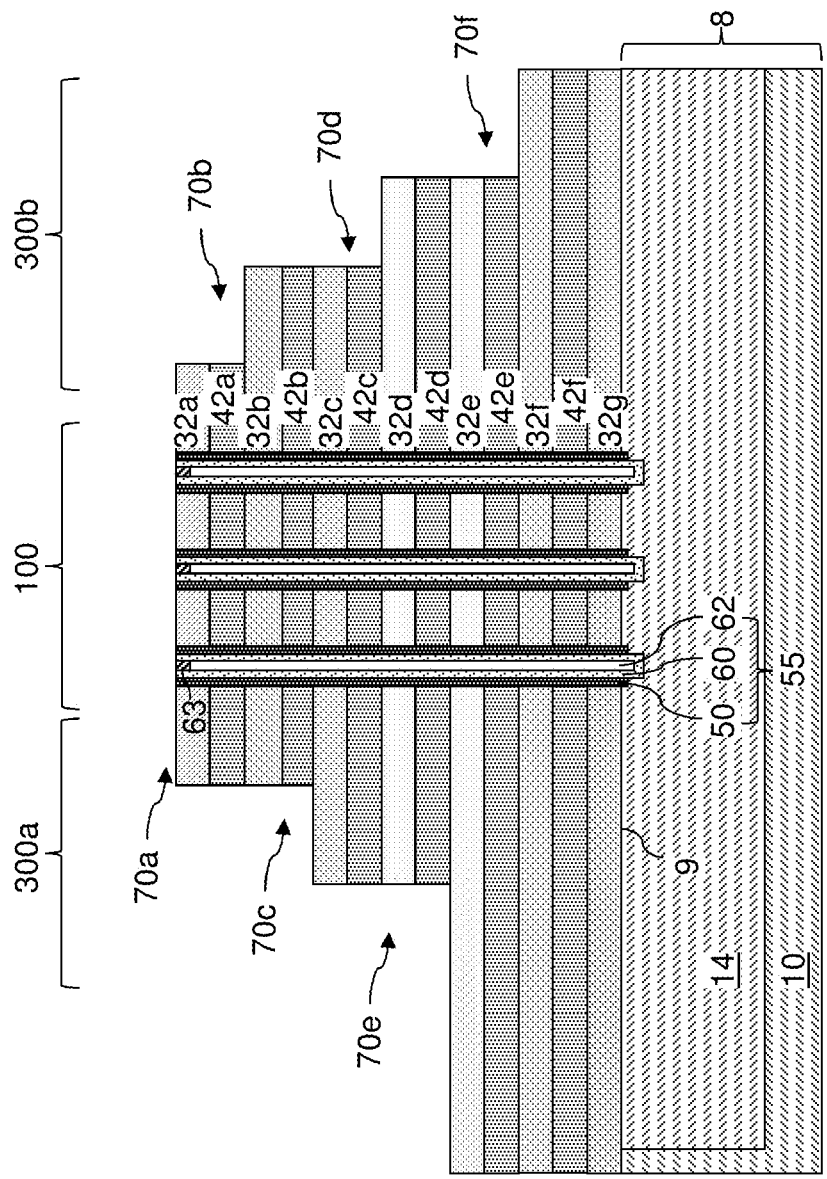

As shown in FIG. 17, the fifth mask 115 is then removed.

A cycle of applying a mask (e.g., first mask 111, second mask 112, third mask 113, fourth mask 114, fifth mask 115, etc.) over the alternating stack (32, 42) to expose a portion of the alternating stack (32, 42) and an etch process through the exposed portion of the alternating stack (32, 42) has the effect of forming a plurality of terrace openings forming at least two stepped word line contact regions having a terrace structure.

Additional terrace openings can be formed by iteratively, and alternately, performing mask formation and etch processes. A sequential mask is formed over the alternating stack (32, 42), covering all existing steps 70 and exposing in upper portion of the first or the second side of the stack. The exposed portion of the next two pairs of insulator layers 32 and sacrificial layers 42 are etched to form a terrace step 70. The processing conditions of each mask formation and etch process can be substantially the same as in the corresponding mask formation of FIGS. 3, 6, 9, 12, and 15, and the corresponding etch process of FIGS. 4, 7, 10, 13, and 16. Portions of the alternating stack (32, 42) located underneath mask openings (e.g., mask openings 121, 122, 123, 124, 125, etc.) that are not covered by the mask (e.g., mask 111, 112, 113, 114, 115, etc.) are etched in each of the etch processes.

Each terrace opening extends downward during an etch process by the total thickness of one or more pairs of an insulator layer 32 and a sacrificial layer 42 that is exposed by the mask opening. In the embodiment shown in FIGS. 3-17, a first etch process forms a first terrace opening through one pair of an insulator layer 32 and a sacrificial layer 42, and subsequent etch processes each form a terrace opening through two pairs of an insulator layer 32 and a sacrificial layer 42.

In one embodiment, the etch chemistry for the step of etching the material of the sacrificial layers 42 can be selective to the material of the insulator layers 32, and the etch chemistry for the step of etching the material of the insulator layers 32 can be selective to the material of the sacrificial layers 42. Under such conditions, the recessing of the bottom surfaces of the terrace openings during a processing step that etches one type of material, i.e., the first material of the insulator layers 32 or the second material of the sacrificial layers 42, can be self-stopping on the top surface of the immediately underlying material.

In some embodiments, during the process for forming each mask, the mask material, for example photoresist, is applied over the alternating stack (32, 42) and also fills existing terrace openings. The mask material completely fills all the existing terrace openings on one side of the stack, and completely fills all the existing terrace openings on the opposite side of the stack except for the bottom opening, which has part proximal to the stack filled and part distal from the stack exposed. This configuration is alternated between the opposite sides of the stack for each masking and etching step to form the stepped configuration shown in FIG. 17.

In one embodiment, a step for etching the second material of the sacrificial layers 42 precedes a step for etching the first material of the insulator layers 32 in an etch process. In another embodiment, a step for etching the first material of the insulator layers 32 precedes a step for etching the second material of the sacrificial layers 42 in an etch process.

A method of fabricating a device structure containing vertical NAND memory devices according to an embodiment of the present disclosure shown in FIG. 2A is illustrated in FIGS. 18-24.

Figure 18:
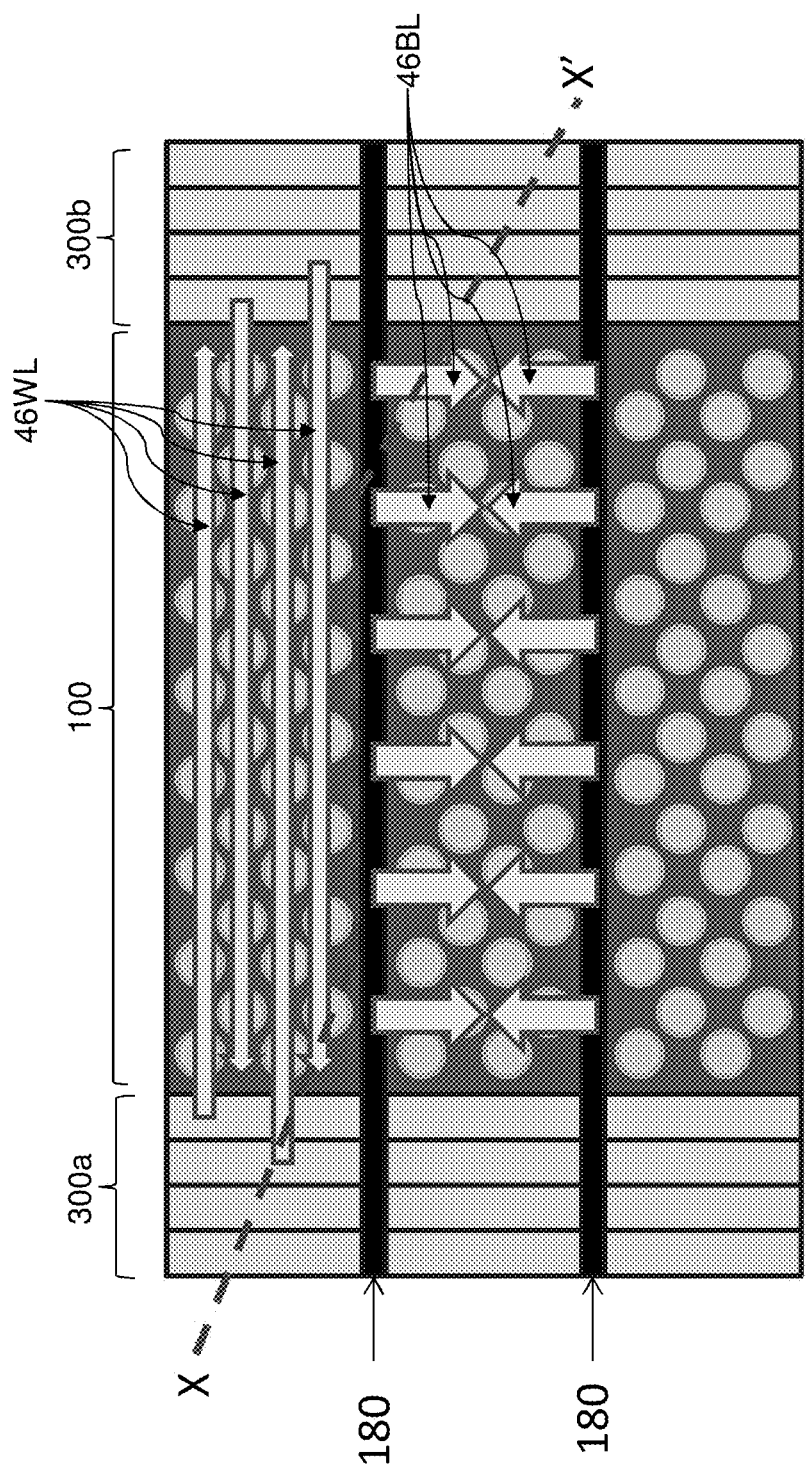
FIG. 18 illustrates a plan view of an embodiment of a device structure containing vertical NAND memory devices according to an embodiment of the disclosure.

FIG. 18 illustrates a plan view of an embodiment of a device structure containing vertical NAND memory devices according to an embodiment of the disclosure. FIGS. 19-24 illustrate sequential vertical cross-sectional views of processing steps to fabricate a device structure containing vertical NAND memory devices according to an embodiment of the present disclosure shown in FIG. 18 along the line X-X'.

Figure 19:
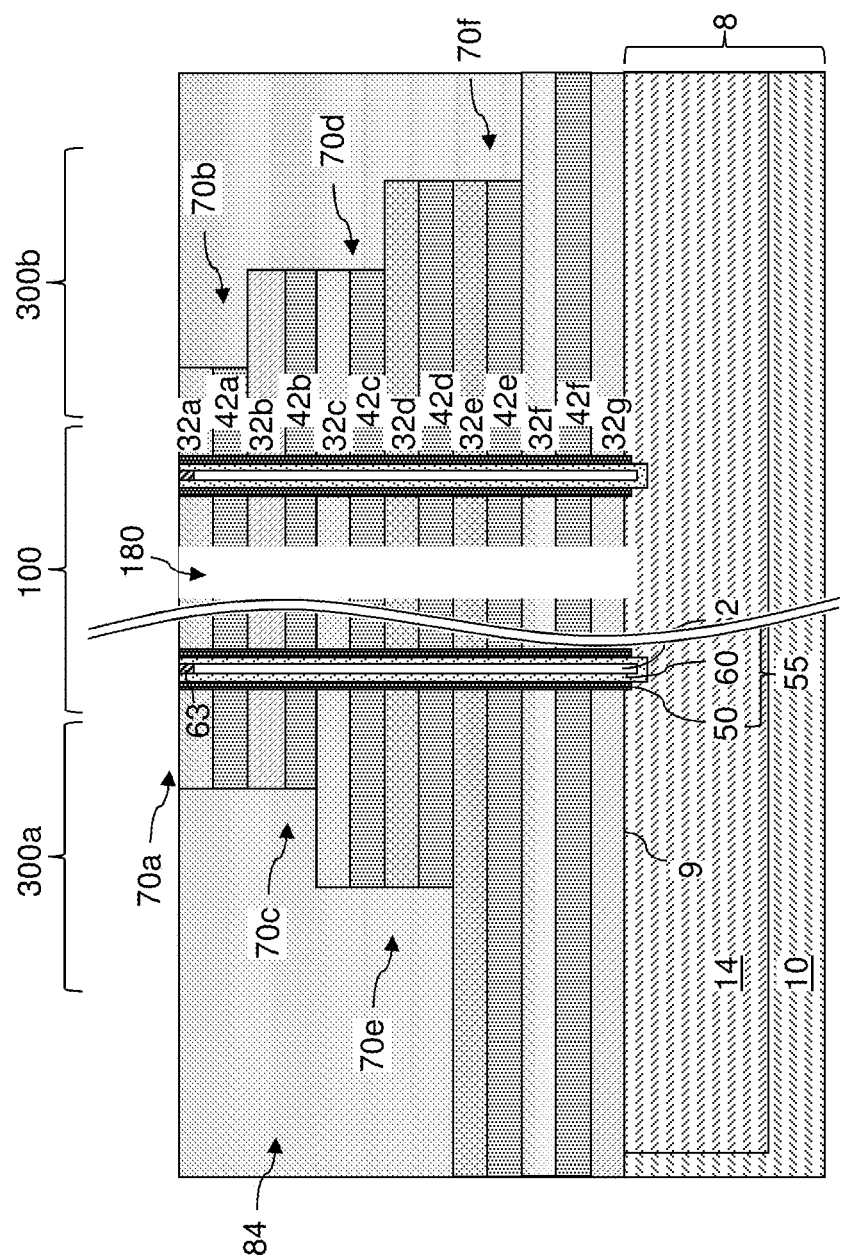
FIGS. 19-24 illustrate sequential vertical cross-sectional views of processing steps to fabricate a device structure containing vertical NAND memory devices according to an embodiment of the present disclosure shown in FIG. 18 along the line X-X'.

An insulating fill layer 84 is formed in the terrace openings forming steps 70b-70f, as shown in FIG. 19. In some embodiments, the insulating fill layer 84 fills the entire terrace openings in first and second stepped word line contact regions 300a and 300b. The insulating fill layer 84 may be formed by depositing an insulating material over the entire in-process device followed a planarization (e.g., CMP). The insulating fill layer 84 is preferably made of the same material as the insulator layers 32 of the stack, such as silicon oxide.

As also shown in FIG. 19, a backside trench 180 is formed for example by employing an anisotropic etch to form a trench that extends at least to the top surface of the substrate 8.

Figure 20:
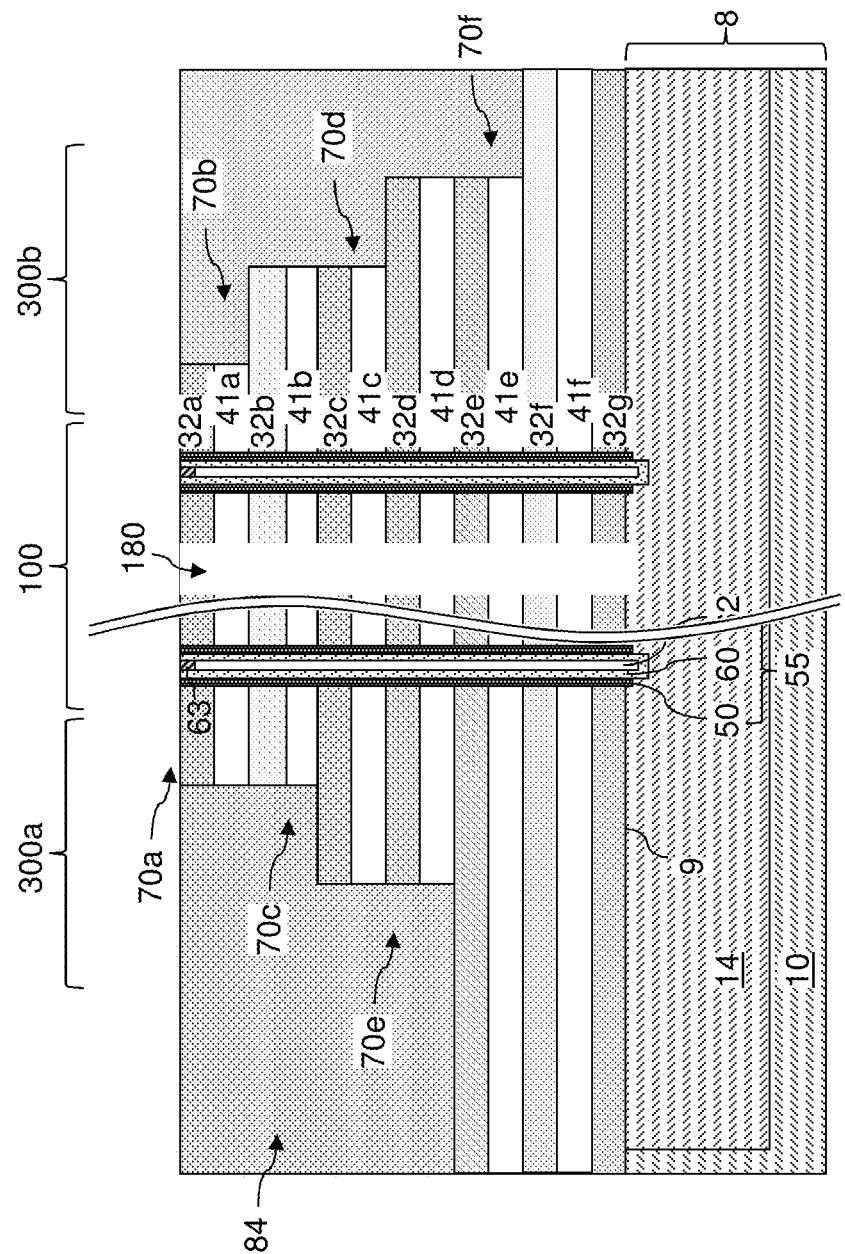

Referring to FIG. 20, an etchant that selectively etches the second material of the sacrificial layers 42 with respect to the first material of the insulator layers 32 can be introduced into the backside trench 180, for example, employing an etch process.

The removal of the second material of the sacrificial layers 42 through the backside trench 180 can be selective to the materials of the insulating fill layer 84, the first material of the insulator layers 32, and the material of the outermost layer of the memory films 50.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside trench 180 and optionally the at least one via opening, as will be described in more detail below. For example, if the sacrificial layers 42 include silicon nitride, then the etch process can be a wet etch process in which the first exemplary structure is immersed within a wet etch tank including phosphoric acid, which etches silicon nitride selective to silicon oxide, silicon, and various other materials employed in the art. The insulating fill layer 84, the channel and memory structures 55, and the insulator layers 32 structurally support the first exemplary structure. If desired, additional support pillars (e.g., insulating support pillars which are located outside the plane of FIG. 20) may extend through the stack to support the structure.

Each contiguous portion of the sacrificial layers 42 having a surface that is physically exposed to the backside trench 180 can be removed during the etch process to form a plurality of recesses 41, as shown in FIG. 20. Each recess 41 can be a laterally extending cavity having a lateral dimension in a direction substantially parallel to the substrate 8 that is greater than the vertical extent of the cavity. A plurality of recesses 41 can be formed in the volumes from which the second material of the sacrificial layers 42 is removed. The memory openings in which the channel and memory structures 55 are formed are herein referred to as front side cavities, and the recesses 41 are herein referred to as back side cavities. In one embodiment, the device region comprises an array of monolithic three dimensional NAND strings having a plurality of device levels disposed above the substrate 8. In this case, each recess 41 can define a space for receiving a respective word line of the array of monolithic three dimensional NAND strings.

Each of the plurality of recesses 41 can extending substantially parallel to the top surface of the substrate 8. In one embodiment, each recess 41 can be vertically bounded by a top surface of an underlying insulator layer 32 and a bottom surface of an overlying insulator layer 32 except in regions at which the recess is connected to the backside trench 180. In one embodiment, each recess 41 can have a uniform height throughout. The recesses 41 are formed across multiple levels, and as a result, a first recess 41a formed by removal of a portion of a first sacrificial layer 42a can be located at a different level than a second recess 41b formed by removal of a portion of a second sacrificial layer 42b that is different from the first sacrificial layer 42a.

Figure 21:
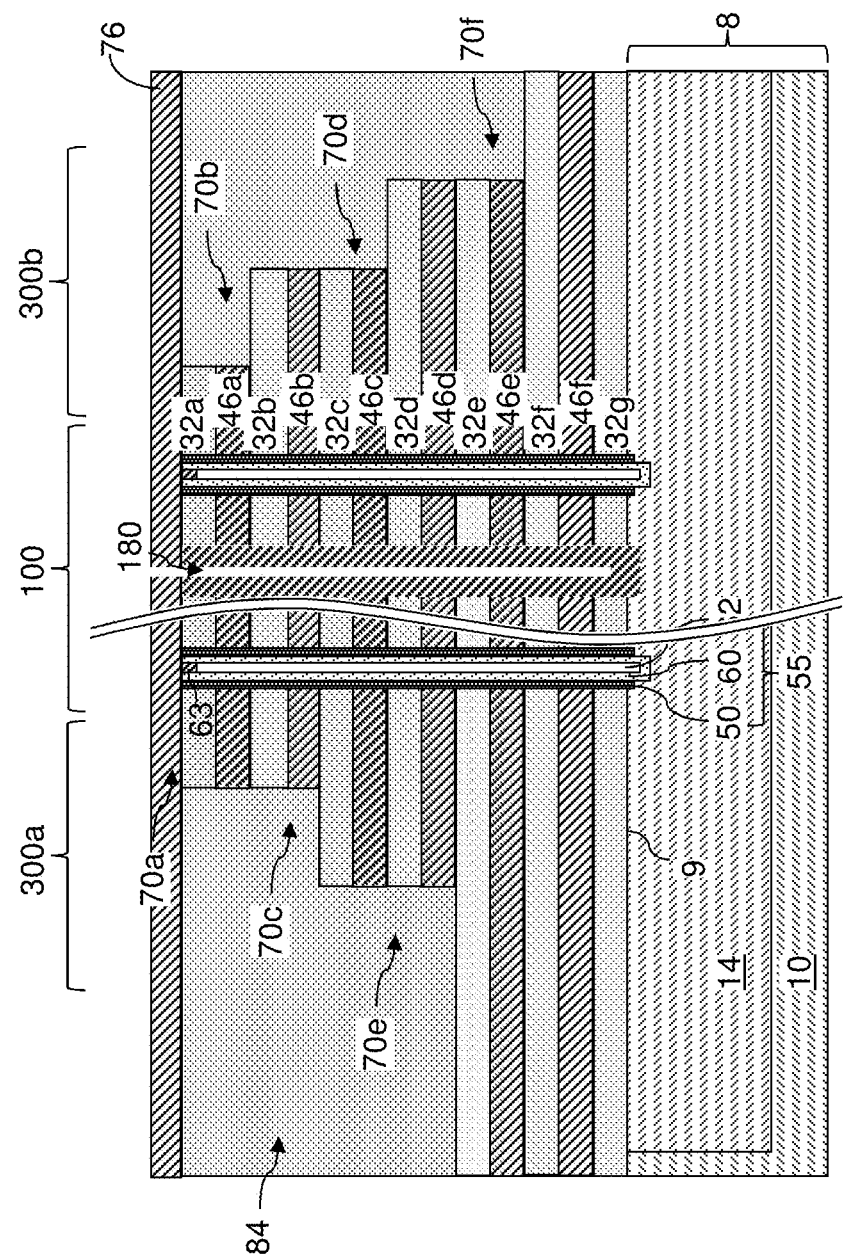

Optionally, a blocking dielectric and/or charge storage material is formed in the recesses 41 instead of or in addition to being formed in the memory openings as part of pillar structures 55. Referring to FIG. 21, a conductive material can be simultaneously deposited in the backside trench 180 and the plurality of recesses 41, and optionally in the at least one via opening, if formed at this time. The conductive material is herein referred to as a first conductive material, or an electrically conductive electrode material. The first conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the backside trench 180 and the plurality of recesses 41 include tungsten, tungsten nitride, titanium, titanium nitride, tantalum, and tantalum nitride. In one embodiment, the electrically conductive electrode material can comprise a metal such as tungsten and/or metal nitride. In one embodiment, the conductive material for filling the backside trench 180 and the plurality of recesses 41 can be selected from tungsten and a combination of titanium nitride and tungsten. In one embodiment, the conductive material can be deposited by chemical vapor deposition.

Simultaneous deposition of the conductive material in the backside trench 180, in the plurality of recesses 41, over the top surface of the device, and optionally in the at least one via opening forms a plurality of electrically conductive electrodes 46 in the plurality of recesses 41, a portion formed on the sidewalls and the bottom surface of the backside trench 180, and a contiguous conductive material layer 76 over the top surface of the device, as shown in FIG. 21. Each electrically conductive electrode 46 can be a conductive line structure. The contiguous conductive material layer 76, the plurality of electrically conductive electrodes 46, and the portion formed on the sidewalls and bottom surface of the backside trench 180 are formed as an integral structure, i.e., a single contiguous structure.

FIG. 18 includes arrows 46BL showing the fill direction (e.g., in the bit line direction) from the backside trenches 180 of the deposited conductive material that forms the electrically conductive electrode 46. Arrows 46WL show the hypothetical fill direction (e.g., in the word line direction) if the deposited conductive material that forms the electrically conductive electrode 46 was instead filled through via openings 64 in the word line contact regions 300a and 300b instead of through the trenches 180. As shown, arrows 46BL are shorter in length than arrows 46WL, which indicates that the deposited conductive material is required to travel a shorter distance when depositing the electrically conductive electrode 46 material through the backside trench 180 rather than through the via openings 64 in the word line contact regions 300a and 300b. In some embodiments, this shorter fill distance may result in a more uniform fill. However, in an alternative embodiment, the electrically conductive electrode 46 material may be deposited through the via openings 64 instead of or in addition to being deposited through the trenches 180.

Figure 22:
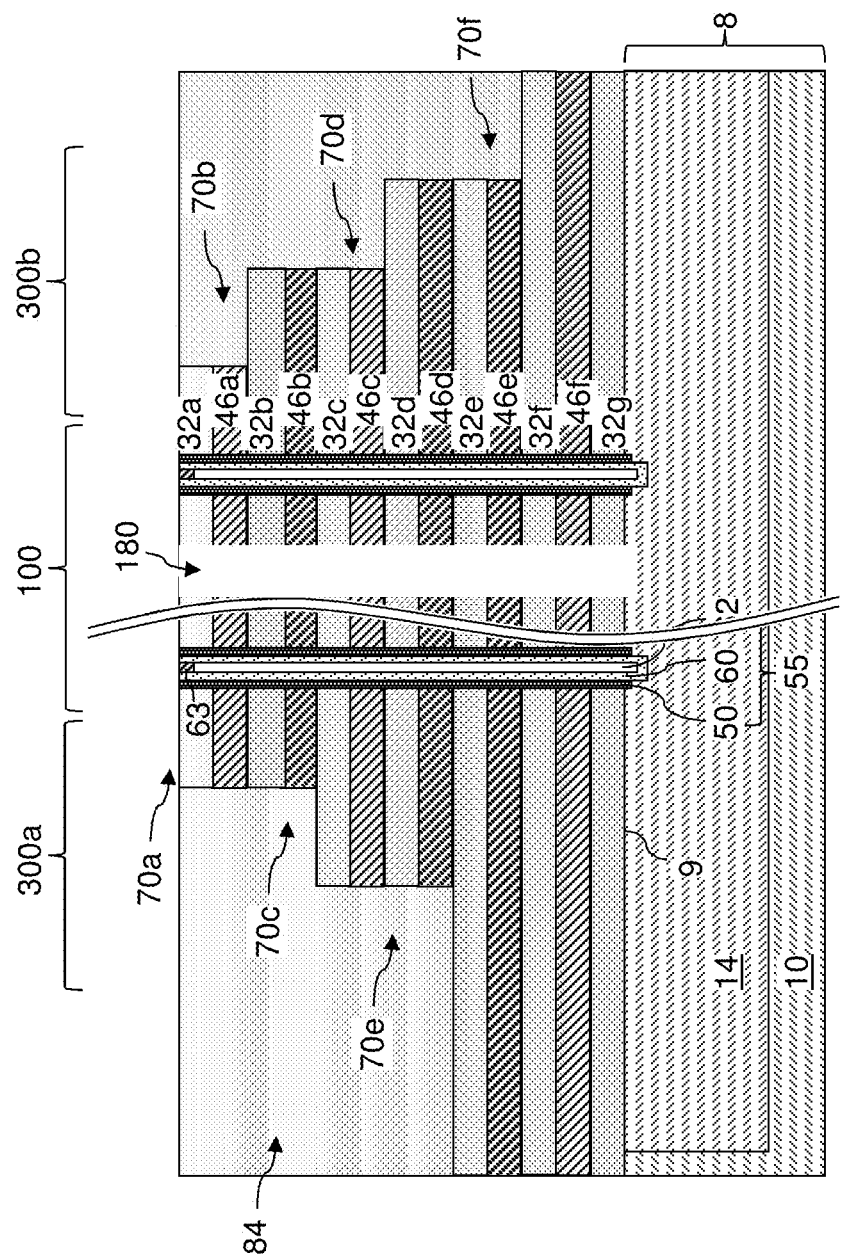

Referring to FIG. 22, portions of the deposited conductive material is etched back, for example, by an isotropic or anisotropic etch. The portion of the contiguous conductive material layer 76 overlying the top surface of the device and the portion located within the backside trench 180 are removed. Each remaining portion of the deposited conductive material in the recesses 41 constitutes an electrically conductive electrode 46. Each electrically conductive electrode 46 can be a conductive line structure.

Figure 23:
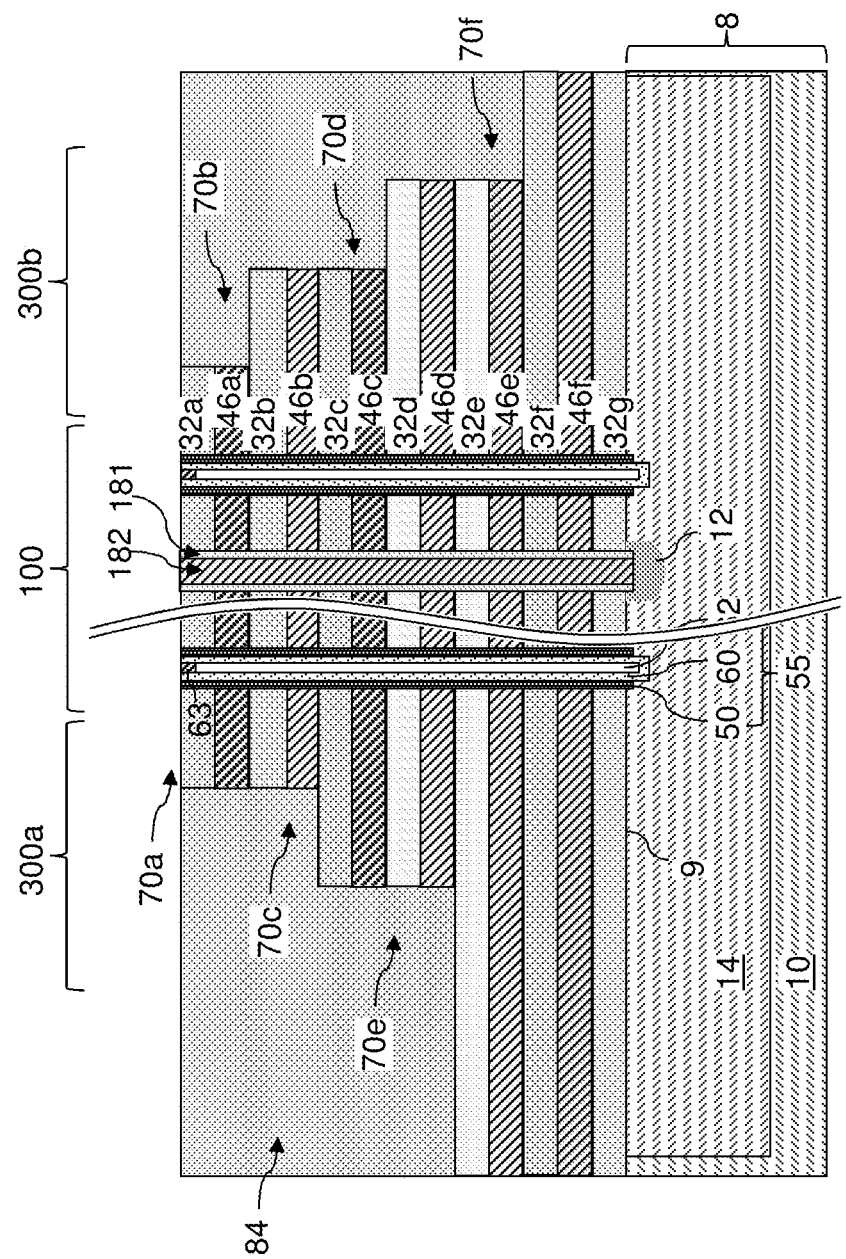

As shown in FIG. 23, a portion of the substrate underlying the backside trench 180 may be doped by ion implantation, etc. to form a source region 12, for example a n+ source. As also shown in FIG. 23, a dielectric is formed on the sidewalls of the backside trench 180 and etched by an isotropic spacer etch to form insulating spacers 181, and a contact metal is formed in the backside trench 180, surrounded by spacers 181. A bottom surface of the contact metal is in electrical contact with the source region 12 to form a source line 182.

Figure 24:
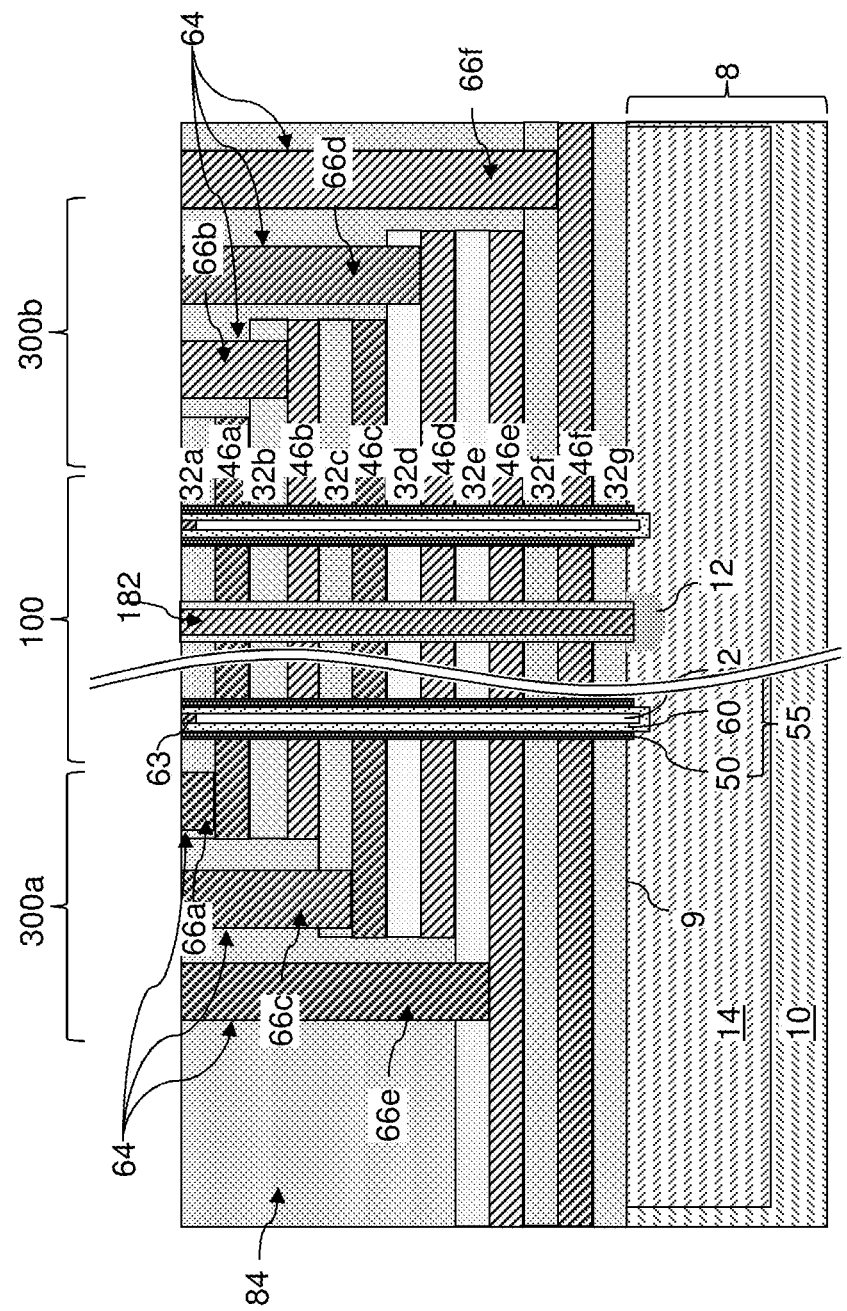

FIG. 24 shows a plurality of via contacts 66 (e.g., 66A-66F), with each via contact 66 electrically connected to at least one electrically conductive electrode 46. The plurality of via contacts 66 may be formed, for example, by forming a plurality of via openings 64 in the insulating fill layer 84, and filling the plurality of via openings 64 with an electrically conductive material to form a plurality of via contacts 66. In some embodiments, the plurality of via openings 64 may be formed by a selective anisotropic etch process using the electrically conductive material of the electrically conductive electrode 46 as an etch stop. A bottom portion of each of the plurality of via contacts 66 can be connected to an underlying electrically conductive electrode 46. During the etch process that forms the plurality of via openings 64, the insulating fill layer 84 can protect the sidewalls of the plurality of via openings 64. Thus, insulating fill layer 84 can laterally separate a particular via opening 64 from all electrically conductive electrodes 46 that are located above the electrically conductive electrode to which the via opening 64 is contiguously connected to through a bottom opening of the via opening 64. For example, insulating fill layer 84 separates fifth via opening 64e from electrically conductive electrodes 46a, 46b, 46c, and 46d that are located above fifth electrically conductive electrode 46e to which fifth via opening 64 is connected to through a bottom opening of the fifth via opening 64e.

Steps of a method of fabricating an in-process device structure containing vertical NAND memory devices according to another embodiment of the present disclosure shown in FIG. 1 is illustrated in FIGS. 25-33.

The process according to the embodiment illustrated in FIGS. 25-33 includes applying a mask having at least one mask opening and performing an anisotropic etch. The steps are sequentially repeated with different masks to form at least two stepped word line contact regions. In this embodiment, both of the at least two stepped word line contact regions are simultaneously etched in at least one of the etching steps, except in the first step. Furthermore, if a device contains an even number of sacrificial layers 42 in the stack (32, 42), then two pairs of adjacent layers 32, 42 are etched in each etching step except in the first step when one pair of top most adjacent layers 32a, 42a are etched.

Figure 25:
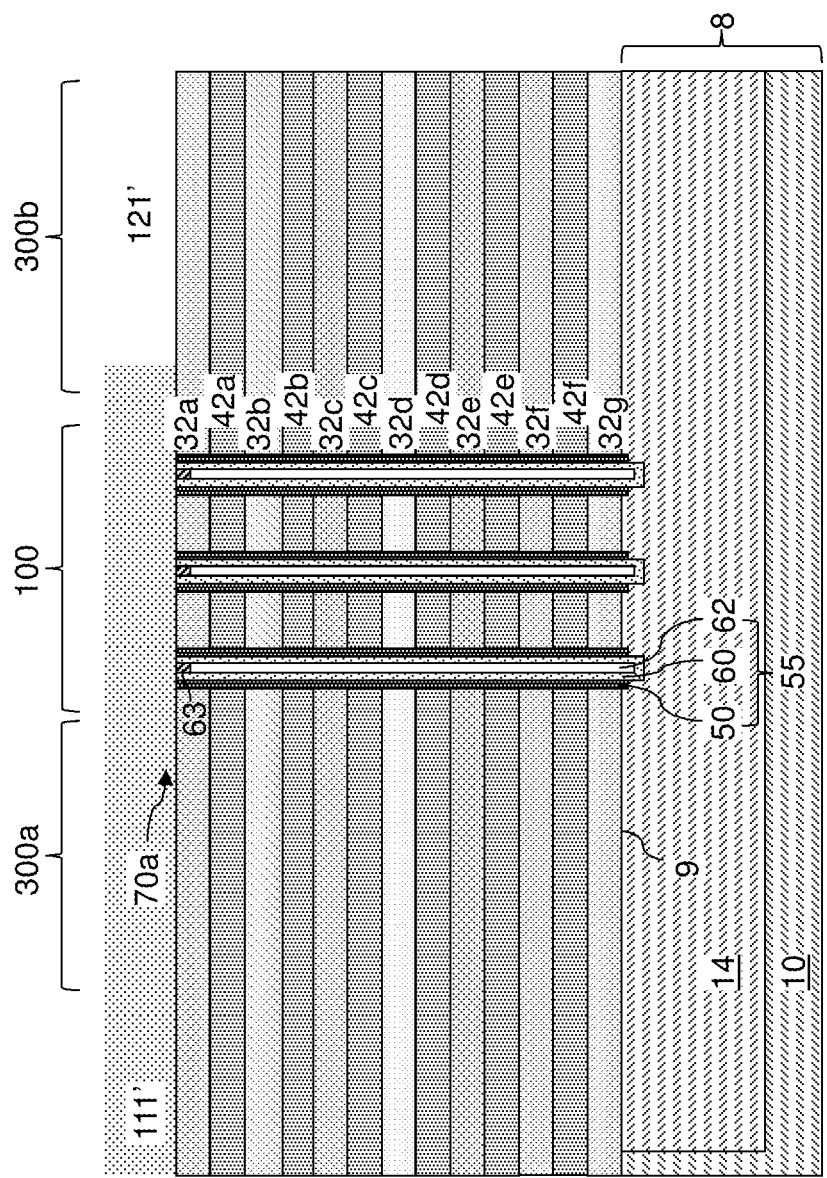
FIGS. 25-33 illustrate sequential vertical cross-sectional views of processing steps to fabricate a device structure containing vertical NAND memory devices according to another embodiment of the present disclosure shown in FIG. 2A.

As shown in FIG. 25, a first step 70a corresponds to a portion of the first (e.g., top most) insulator layer 32a in a first stepped word line contact region 300a.

A first mask 111' is formed over the alternating stack (32, 42), the channel and memory structures 55 and the drain regions 63, as shown in FIG. 25. The first mask 111' includes a first mask opening 121', which exposes a portion of the stack in a second stepped word line contact region 300b corresponding to a terrace opening that will be used to form second step 70b, a portion of fourth step 70d, and a portion of sixth step 70f, as will be described below.

The first mask 111' may be a photoresist mask and/or a hardmask, as described above for first mask 111.

Figure 26:
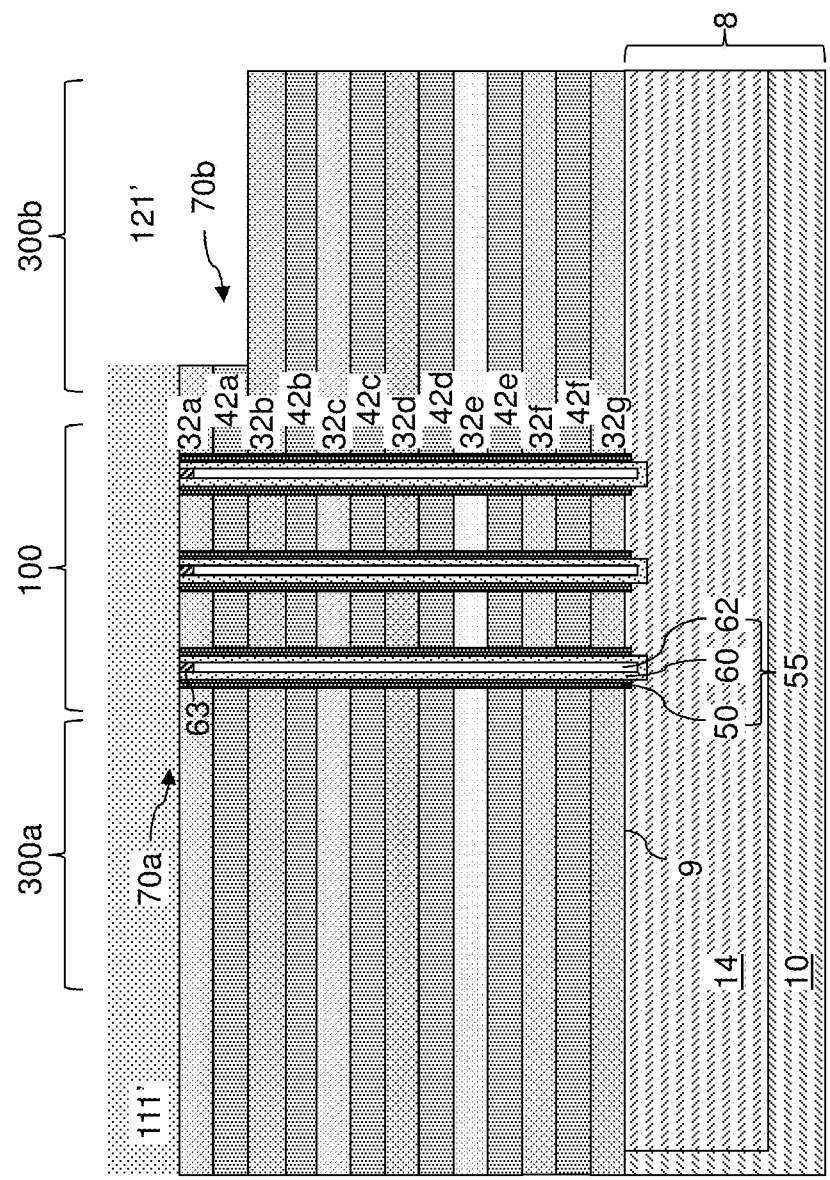

Each portion of the first insulator layer 32a and the first sacrificial layer 42a underlying the first mask opening 121' is anisotropically etched employing the first mask 111' as an etch mask to form a terrace opening forming second step 70b, as shown in FIG. 26. In some embodiments, the terrace opening forming second step 70b extends substantially perpendicular to the major surface 9 of the substrate 8. In one embodiment, the chemistry of the anisotropic etch can be selected such that the bottom surface of the terrace opening forming second step 70b is formed between the top surface and the bottom surface of first sacrificial layer 42a, or at the bottom surface of first sacrificial layer 42a, or at the top surface of second insulator layer 32b, or between the top surface and the bottom surface of second insulator layer 32b at the end of the processing step shown in FIG. 26. In one embodiment, the chemistry of the anisotropic etch process can be such that portions of the first insulator layer 32a and the first sacrificial layer 42a underlying the first mask opening 121 can be etched by the anisotropic etch to expose a portion of the second insulator layer 32b. In this case, the bottom surface of the terrace opening forming second step 70b can be formed at the top surface of the second insulator layer 32b, which is coplanar with the bottom surface of the first sacrificial layer 42a. In some embodiments, the anisotropic etch can include multiple steps. Alternately, the chemistry of the anisotropic etch can be selective to the second material, i.e., the material of the sacrificial layers 42, and the bottom surface of an intermediate terrace opening can be formed at the top surface of the first sacrificial layer 42a. In this case, a second anisotropic etch can be selective to the first material, i.e., the material of the insulator layers 32, and the bottom surface of the terrace opening can be formed at the top surface of the second insulator layer 32b.

Figure 27:
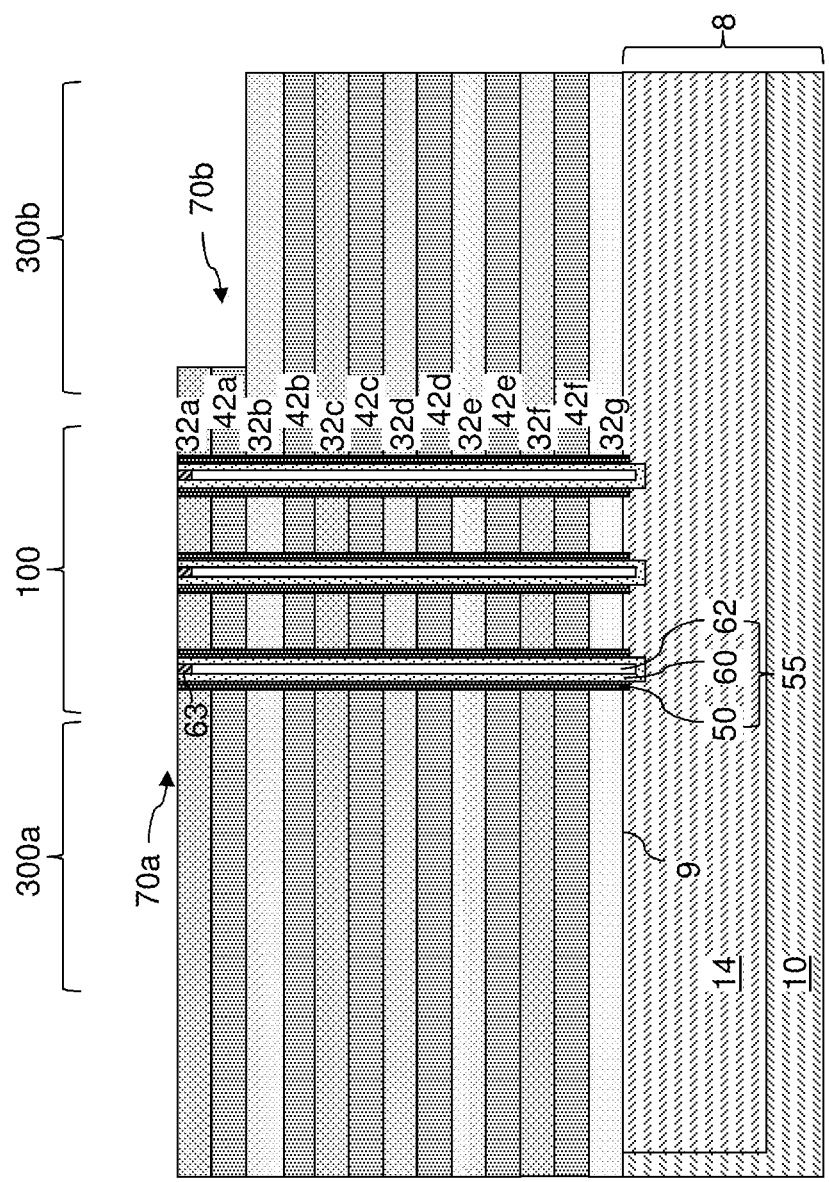

As shown in FIG. 27, the first mask 111' is then removed. In some embodiments, the first mask 111' is photoresist, and can be removed, for example, by ashing.

Figure 28:
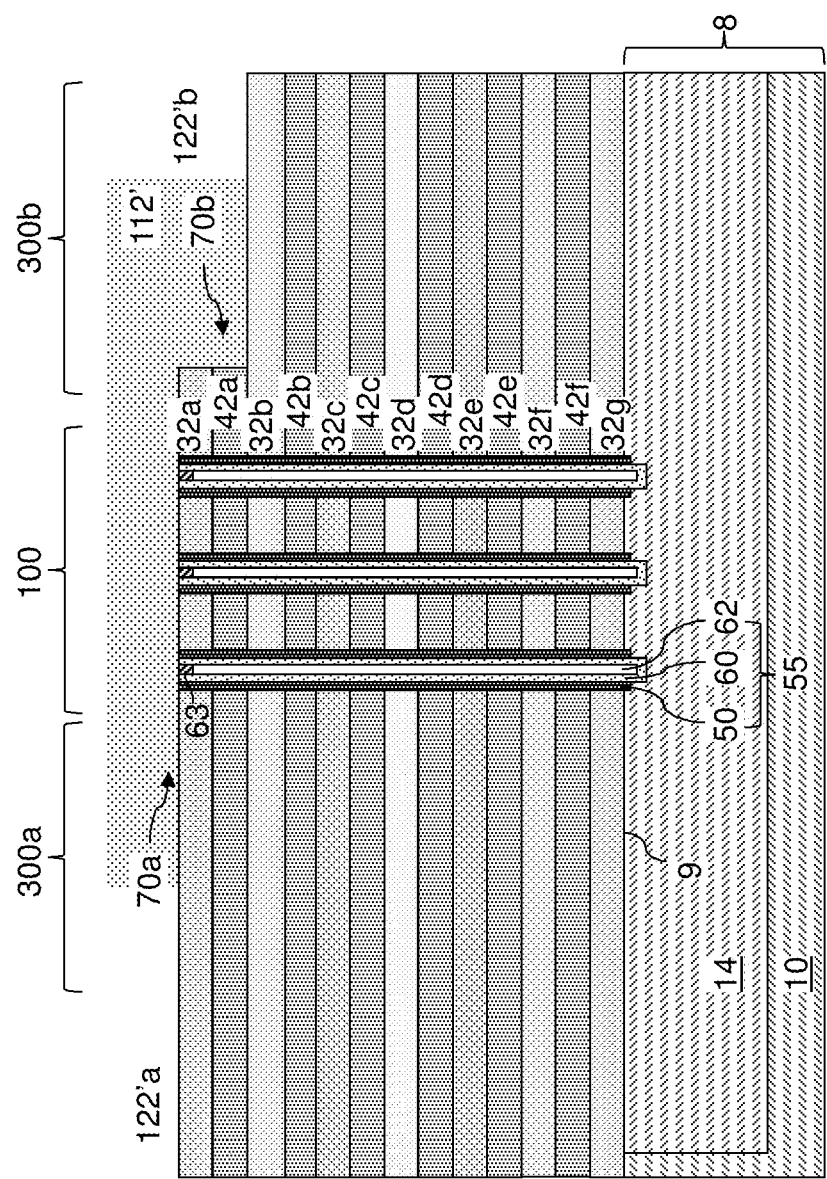

Referring to FIG. 28, a second mask 112' is formed over the alternating stack (32, 42), the channel and memory structures 55 and the drain regions 63, and in a portion of the second step 70b. The second mask 111' may be the same as the second mask 112 described above.

The second mask 112' can be patterned with at least two second mask openings 122'a and 122'b to physically expose two portions of the alternating stack (32, 42) that are respectively different from and not co-extensive with the portion of the alternating stack (32, 42) exposed by the first mask opening 121'. In the embodiment shown in FIG. 28, second mask opening 122'a is in the first stepped word line contact region 300a, and second mask opening 122'b is in the second stepped word line contact region 300b. The second mask opening 122'b exposes an outer portion of the second step 70b while covering an inner portion of the second step 70b.

Figure 29:
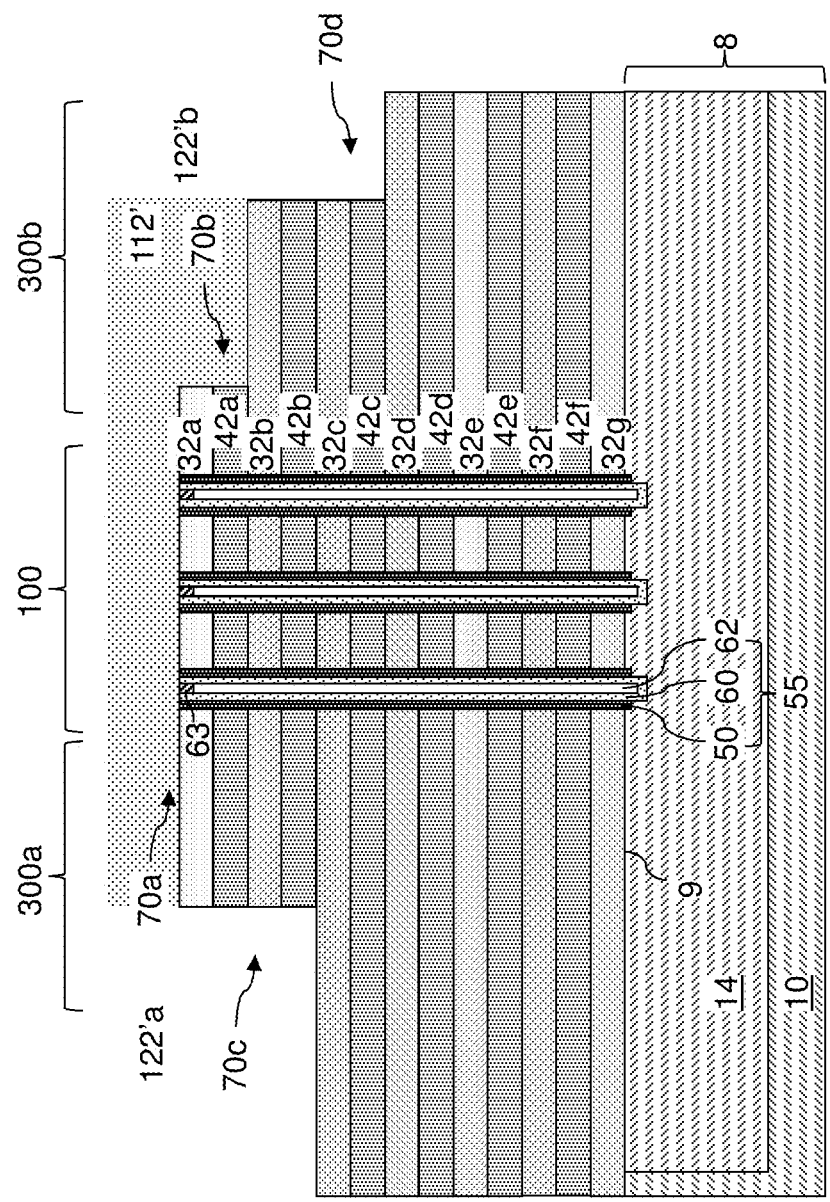

Portions of the stack (32,42) underlying the second mask openings 122'a and 122'b are anisotropically etched employing the second mask 112' as an etch mask to form a terrace opening forming a portion of third step 70c and a portion of fourth step 70d, respectively, as shown in FIG. 29. As shown in FIG. 29, an anisotropic etch process is performed in second mask opening 122'a to form a vertical terrace opening through the first insulator layer 32a, the first sacrificial layer 42a, the second insulator layer 32b, and the second sacrificial layer 42b, to expose a portion of the third insulator layer 32c. As also shown in FIG. 29, the same anisotropic etch process is performed in second mask opening 122'b to form a vertical terrace opening through the second insulator layer 32b, the second sacrificial layer 42b, the third insulator layer 32c, and the third sacrificial layer 42c, to expose a portion of the fourth insulator layer 32d. In some embodiments, the anisotropic etch process shown in FIG. 29 includes more than one anisotropic etch. In other embodiments, the anisotropic etch process shown in FIG. 29 includes one, two or three etch steps. Thus, two pairs of adjacent layers 32, 42 are etched in respective regions 300a, 300b at the same time during the same etching step using the same mask 112'.

Figure 30:
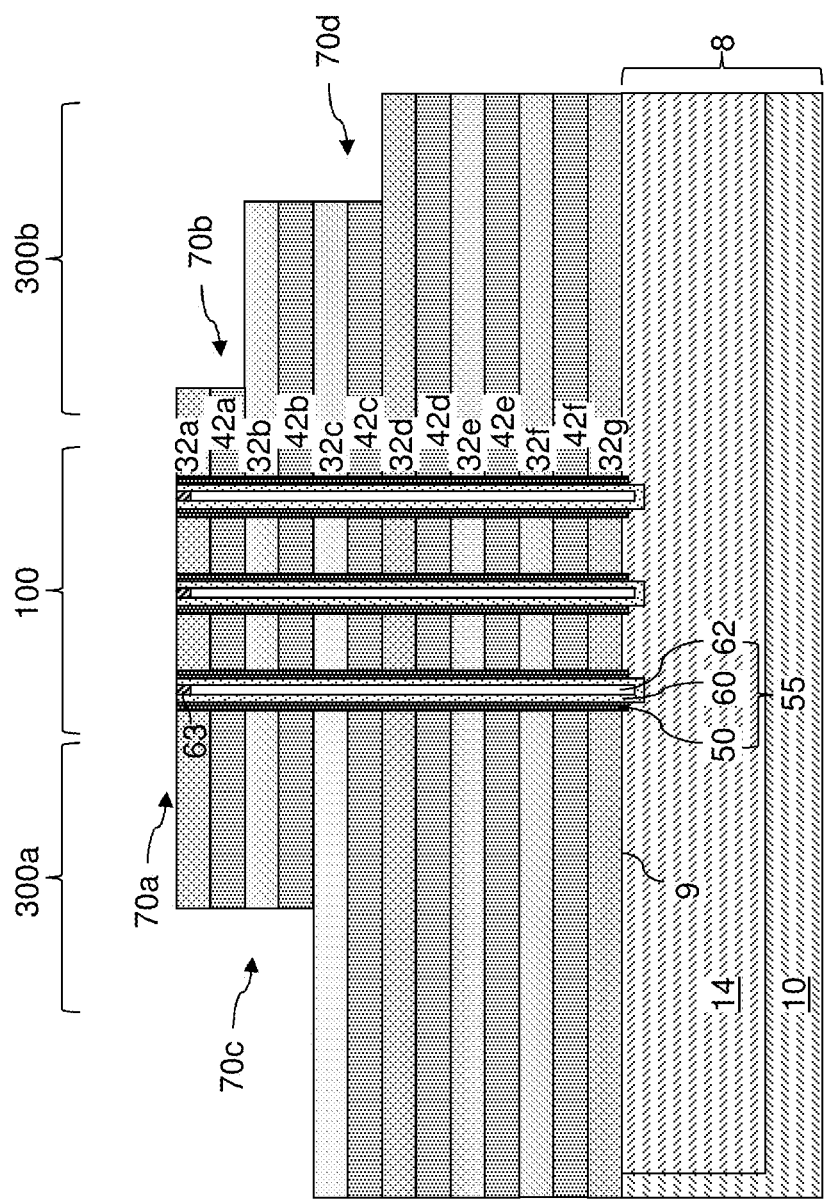

As shown in FIG. 30, the second mask 112' is then removed.

Figure 31:
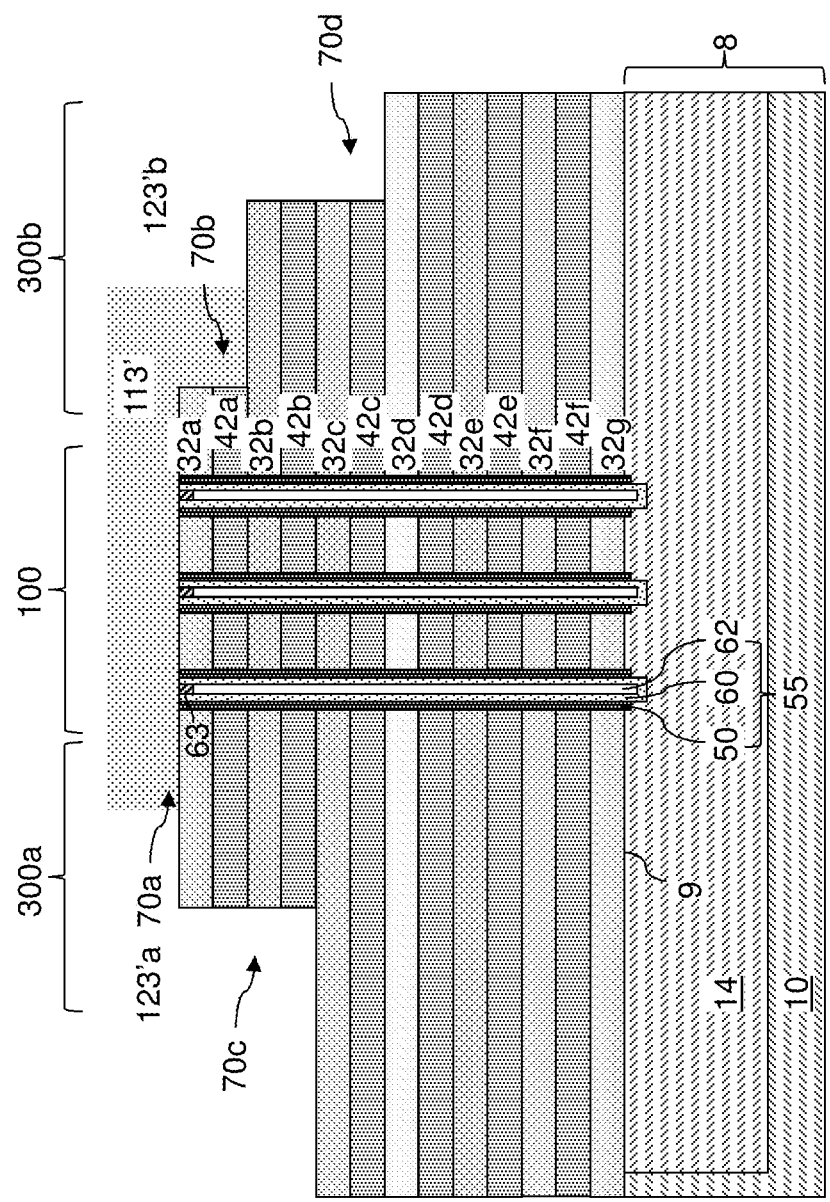

Referring to FIG. 31, a third mask 113' is formed over the alternating stack (32, 42), the channel and memory structures 55 and the drain regions 63, and in a portion of second step 70b. In various embodiments, the third mask 113' may be as third mask 113 described above.

Similar to the second mask 112', the third mask 113' can be patterned with at least two third mask openings 123'a and 123'b to physically expose portions of the alternating stack (32, 42) that are different from or non-coextensive with the portions of the alternating stack (32, 42) exposed by the first mask opening 121' and the second mask openings 122'a and 122'b, while covering a middle portion of the alternating stack (32, 42). In the embodiment shown in FIG. 31, third mask opening 123'a is in the first stepped word line contact region 300a and third mask opening 123'b is in the second stepped word line contact region 300b. The third mask opening 123'a exposes an outer portion of the first step 70a while covering an inner portion of the first step 70a. The third mask opening 123'b exposes an outer portion of the second step 70b while covering an inner portion of the second step 70b.

Figure 32:
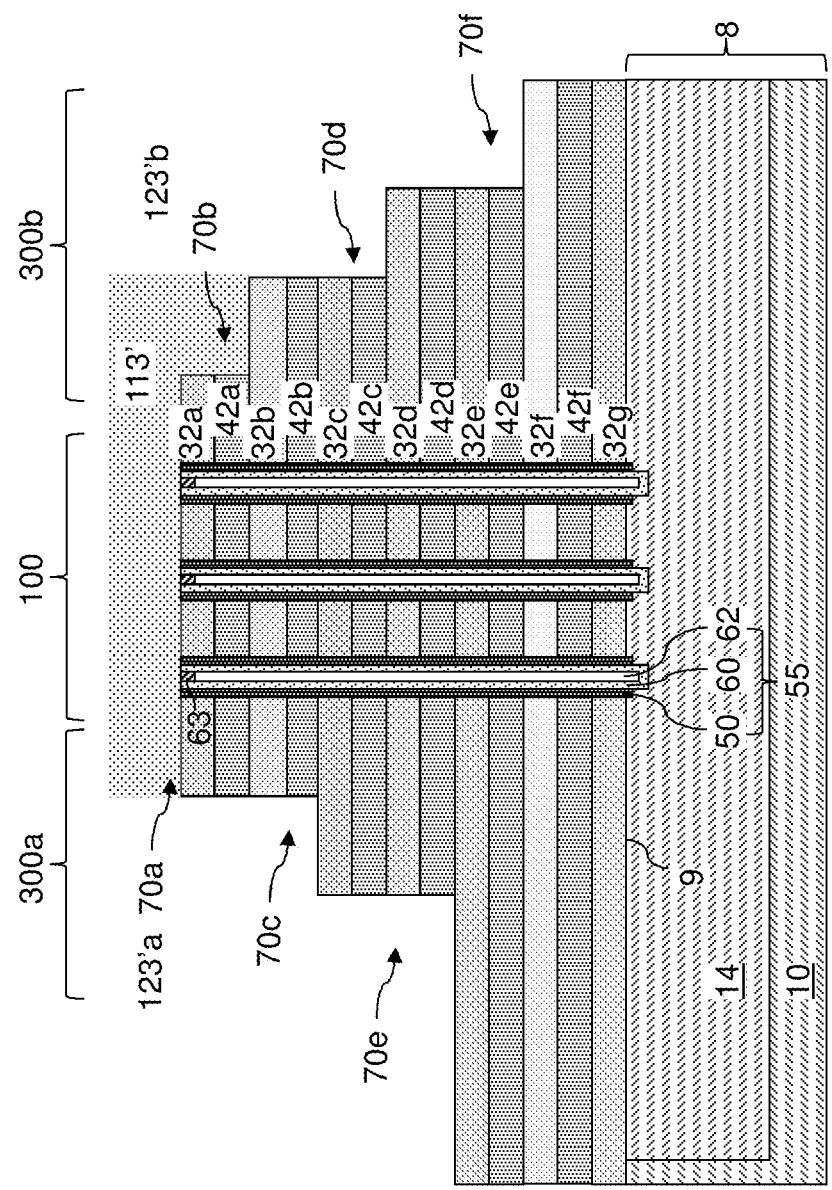

A portion of the stack (32,42) underlying the third mask opening 123'a is anisotropic ally etched employing the third mask 113' as an etch mask to form a terrace opening forming fifth step 70e, and to complete the third step 70c as shown in FIG. 32. As shown in FIG. 32, an anisotropic etch process is performed to form a vertical terrace opening through the first insulator layer 32a, the first sacrificial layer 42a, the second insulator layer 32b, and the second sacrificial layer 42b to expose a portion of the third insulator layer 32c and complete the third step 70c by shifting it inward toward the middle of the stack. As also shown in FIG. 32, the anisotropic etch process also extends the vertical terrace opening through the third insulator layer 32c, the third sacrificial layer 42c, the fourth insulator layer 32d, and the fourth sacrificial layer 42d to expose a portion of the fifth insulator layer 32e and complete fifth step 70e.

A portion of the stack (32,42) underlying the third mask opening 123'b is anisotropic ally etched employing the third mask 113' as an etch mask to form a terrace opening forming a sixth step 70f, and to complete the fourth step 70d as also shown in FIG. 32. As shown in FIG. 32, the anisotropic etch process forms a vertical terrace opening through the second insulator layer 32b, the second sacrificial layer 42b, the third insulator layer 32c, and the third sacrificial layer 42c to expose a portion of fourth insulator layer 32d and complete the fourth step 70d by shifting it inward toward the middle of the stack. As also shown in FIG. 32, the anisotropic etch process also extends the vertical terrace opening through the fourth insulator layer 32d, the fourth sacrificial layer 42d, the fifth insulator layer 32e, and the fifth sacrificial layer 42e to expose a portion of sixth insulator layer 32f and complete sixth step 70f.

In some embodiments, the anisotropic etch process shown in FIG. 32 includes more than one anisotropic etch. In other embodiments, the anisotropic etch process shown in FIG. 32 includes one, two or three etch steps.

Thus, the steps shown in FIGS. 31 and 32 include forming the third mask 113' over the stack exposing an upper portion of the left side (i.e., region 300a) of the stack and the steps 70a, 70b and 70c while covering a middle portion the stack. The etching step shown in FIG. 32 includes forming (e.g., shifting inward) step 70c in the left side (e.g., region 300a) of the stack by etching the first 32a and the second 32b insulating layers and the first 42a and the second 42b material layers to expose the third insulating layer 32c in the second side of the stack. The etching step shown in FIG. 32 also includes forming (e.g., shifting inward) another step 70d in the right side (e.g., in region 300b) of the stack by etching the second 32b and the third 32c insulating layers and the second 32b and the third 32c material layers below step 70b to expose a portion of the fourth insulating layer 32d.

The etching step shown in FIG. 32 also includes forming step 70e in the left side (e.g., in region 300a) of the stack by etching the third 32c and the fourth 32d insulating layers and the third 42c and the fourth 42d material layers below the step 70c to expose a portion of the fifth insulating layer 32e. The etching step shown in FIG. 32 also includes forming a step 70f in the right side (e.g., in region 300b) of the stack by etching the fourth 32d and the fifth 32e insulating layers and the fourth 32d and the fifth 32e material layers below step 70d to expose a portion of the sixth insulating layer 32f.

Figure 33:
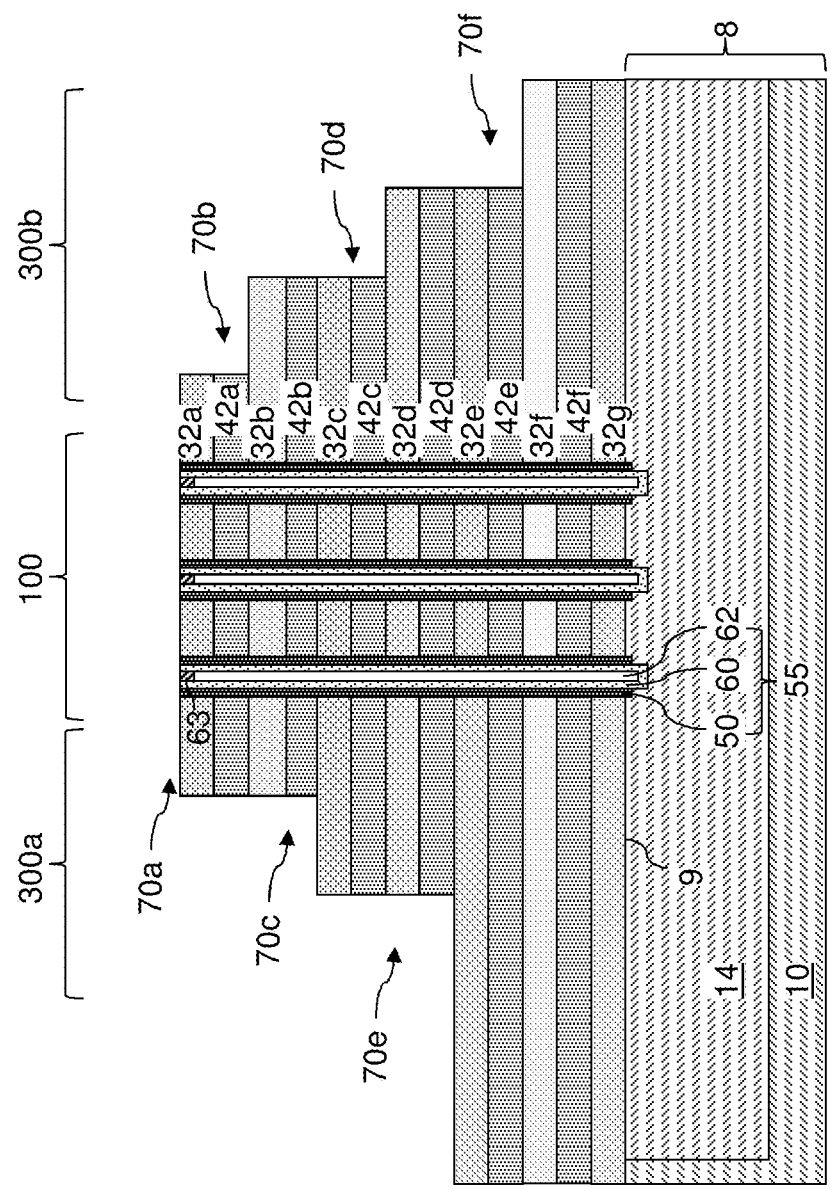

As shown in FIG. 33, the third mask 113' is then removed. The device as shown in FIG. 33 is substantially similar to the device as shown in FIG. 17, described above. While a stack with only six sacrificial layers 42 is shown for illustration, it should be understood that more than six (e.g., 26 to 128) sacrificial layers 42 may be included in the stack. The process steps shown in FIGS. 31-33 are repeated to form additional steps in the additional levels with additional masks which are sequentially narrower than the preceding mask (e.g., similar to mask 113' being narrower than the preceding mask 112').

Thus, additional process steps (a) and (b) are performed a plurality of times until all desired steps in the stack are formed. Step (a) includes forming an additional mask over the stack exposing all existing steps and an upper portion of the left or the right side of the stack. Step (b) includes etching the first insulating layer and the first material layer in the exposed upper portion of the stack and etching a next pair of insulating and material layers underlying each existing step to form additional steps.

In other embodiments, a mask (e.g., mask 112' or 113') is not removed after the etch step shown in FIG. 29 or FIG. 32, and instead, at least one dimension of the mask 112' or 113' is altered after the etch step. The altered preceding mask (e.g., second mask 112' or third mask 113') may be considered a subsequent mask (e.g., respective third mask 113' or fourth mask 114') for use in a subsequent etch step, for example the etch step shown in FIG. 29 or 32. Thus, altering the preceding mask may be considered forming the subsequent mask. In some embodiments, the mask is a photoresist mask, and the altering of at least one dimension of the mask includes a "resist-slimming" process whereby at least one portion of the first mask is removed following the etch step shown in FIGS. 29 and 32. This "resist-slimming" process may be repeated between any number of etch steps to expose an increasingly greater portion of the alternating stack (32, 42) for each etch step. Portions of the photoresist mask may be removed by any suitable process, for example by isotropic etching. Thus, any one or more mask removal steps in FIGS. 30, 33, and/or 36 may be omitted and can be replaced by one or more resist-slimming steps. Accordingly, any one of masks 113' or 114' may comprise the same photoresist as masks 112' or 113' after the resist-slimming process.

However, photoresist height is also reduced by slimming and after a number of slimming steps, the photoresist will disappear. Therefore, in another embodiment, for a large height stack with a large number of steps, one or more photoresist slimming steps may be followed by optional removal of any remaining slimmed photoresist, formation of a new photoresist layer and lithographic patterning of the new photoresist layer to form the mask, such as in the steps shown in FIGS. 31 and 34. Thus, in one embodiment, the steps may be formed by repeating a combination of a photoresist layer deposition and lithography steps, a stack step etching step, one or more slimming steps of the lithographically patterned photoresist, and additional stack step etching step(s) after each slimming step.

Processing steps for completing the device are the same as the steps described above in reference to FIGS. 18-24.

Figure 34:
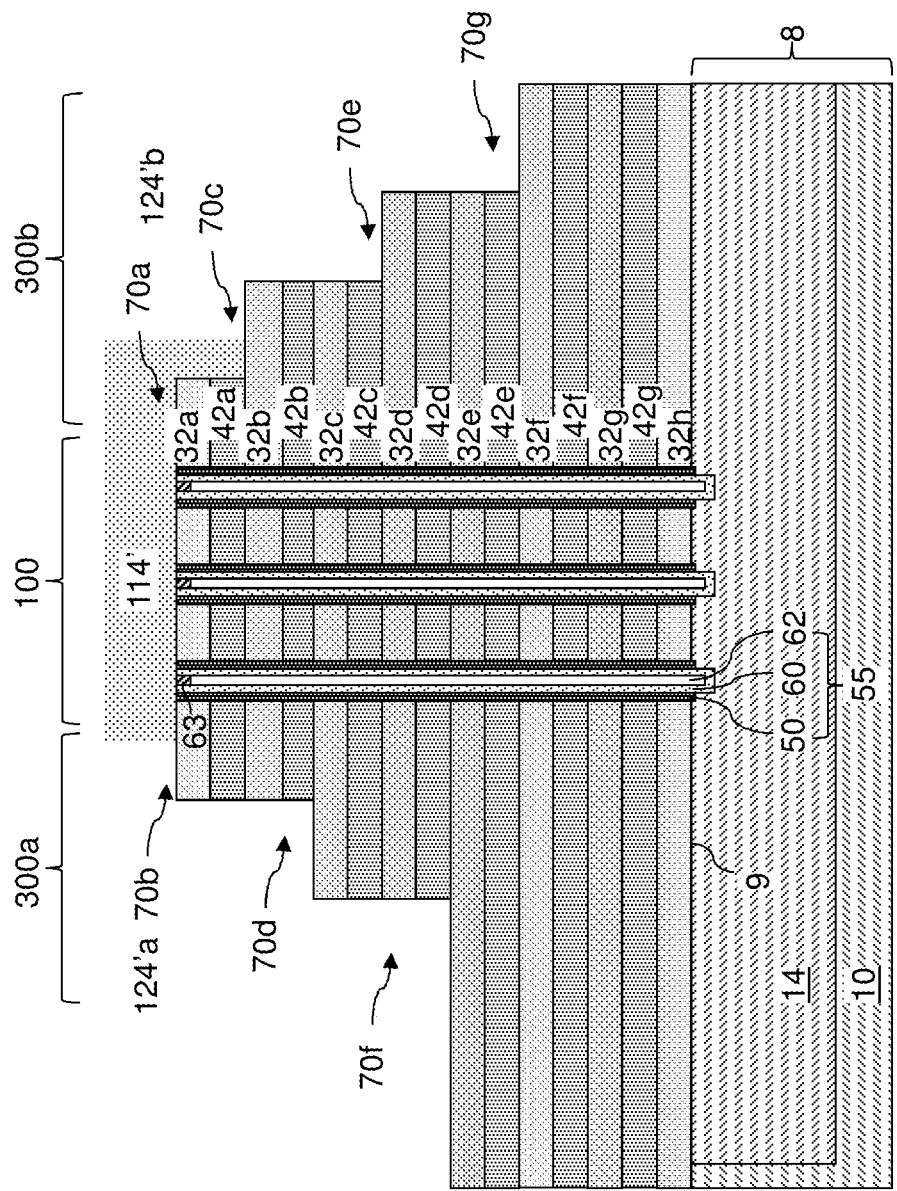
FIGS. 34-36 illustrate sequential vertical cross-sectional views of processing steps to fabricate a device structure containing vertical NAND memory devices according to yet another embodiment of the present disclosure.
Figure 35:
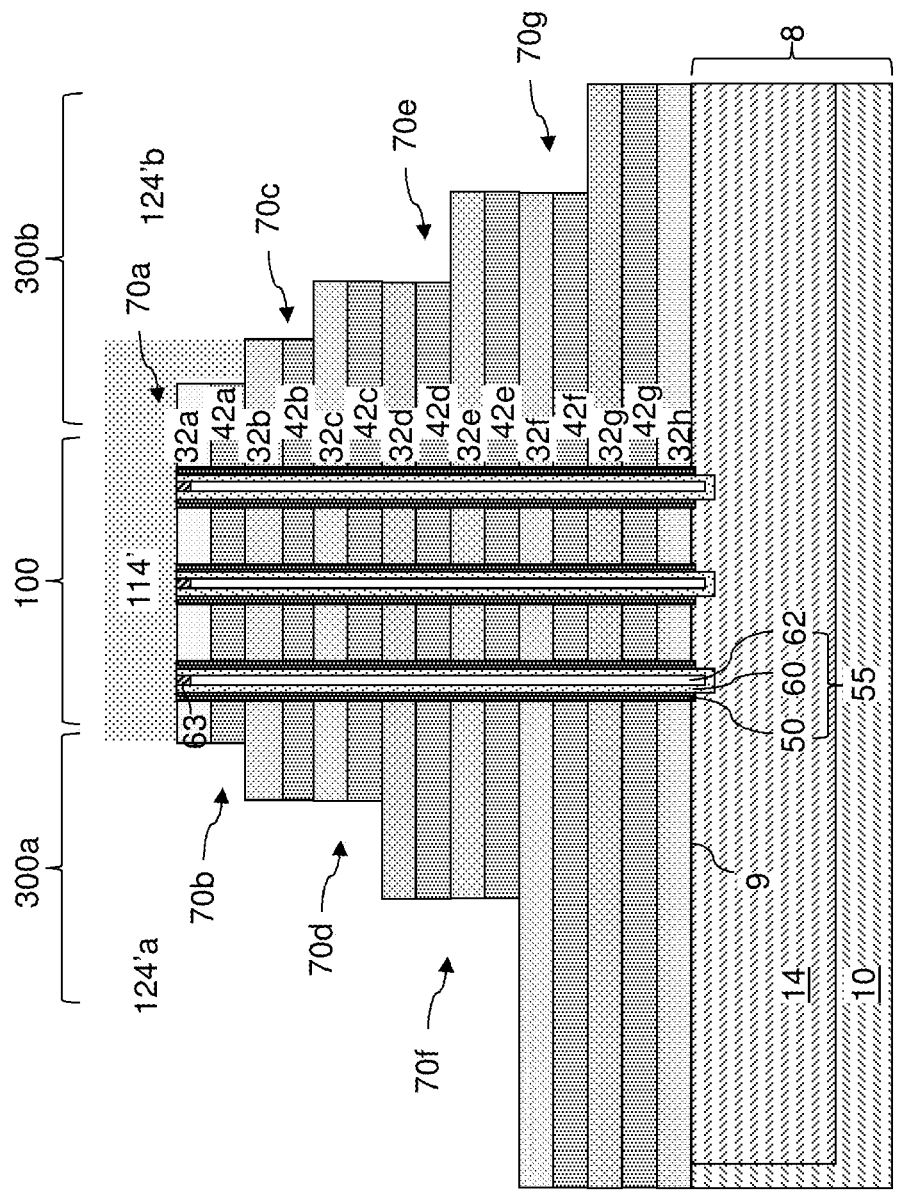
Figure 36:
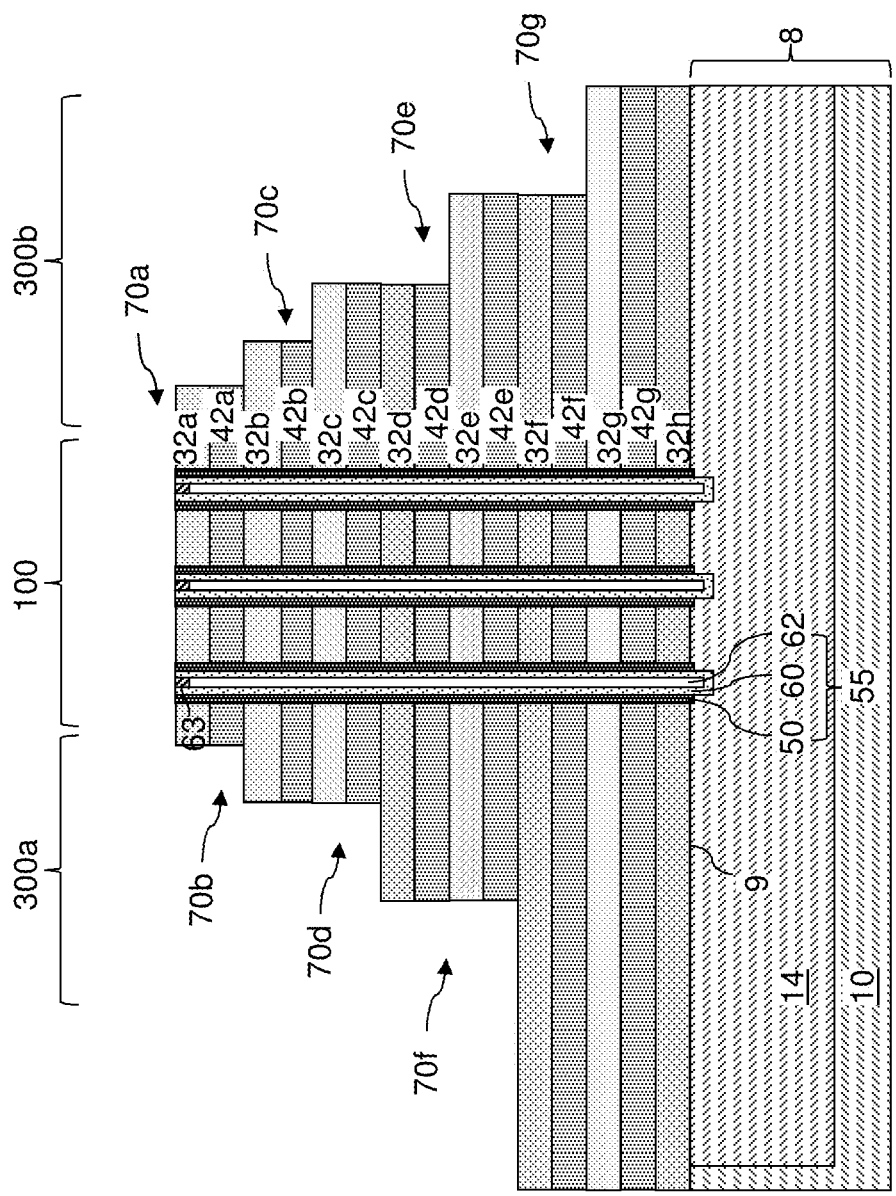

Steps of a method of fabricating an in-process device structure containing vertical NAND memory devices according to another embodiment of the present disclosure is illustrated in FIGS. 34-36. In this embodiment, the total number of sacrificial layers 42 is odd (rather than even as shown in FIG. 33) and the number of terrace steps in the first stepped word line region 300a differs by one from the number of terrace steps in the second stepped word line region 300b. This embodiment also includes seventh sacrificial layer 42g and eight insulator layer 32h. In this embodiment, both of the at least two stepped word line contact regions are simultaneously etched in at least one of the etching steps, except in the first step and in the final step.

The initial etch steps proceed as for the embodiment illustrated in FIGS. 24-33. In particular, each etch step except the first and the final etch step etches two insulator layers 32 and two sacrificial layers 42. The final etch step etches only one insulator layer 32 and one sacrificial layer 42. Thus, since the device contains an odd number of sacrificial layers 42 in the stack (32, 42), then two pairs of adjacent layers 32, 42 are etched in each etching step except in the first step and in the final step when one pair of adjacent layers 32, 42 are etched.

In the embodiment shown in FIGS. 34-36, the seven terrace steps are numbered 70a-70g, with steps 70a, 70c, 70e, and 70g in the second stepped word line region 300b, and steps 70b, 70d, and 70f in the first stepped word line region 300a. Thus, the step numbers are reversed between regions 300a and 300b with region 300a containing the even numbered steps and region 300b containing the odd numbered steps for consistency. However, each numbered step in FIGS. 34-36 exposes the same insulating layer in the stack as in the FIG. 33.

The steps used to form the stack shown in FIG. 34 may be the same as those shown in FIGS. 25-33 and are not repeated herein for brevity. Starting from the device with the steps in the stack shown in FIG. 33 (but containing an additional odd numbered sacrificial layer 42g and insulating layer 32h), a fourth mask 114' is formed over the alternating stack (32, 42), the channel and memory structures 55 and the drain regions 63, and in a portion of second step 70c, as shown in FIG. 34. In various embodiments, the fourth mask 114' may be the same as fourth mask 114 described above.

Similar to the first mask 111', the fourth mask 114' can be patterned with at least two third mask openings 124'a and 124'b to physically expose portions of the alternating stack (32, 42) that are different from or non-coextensive with the portions of the alternating stack (32, 42) exposed by the first mask opening 121', the second mask openings 122'a and 122'b, and the third mask openings 123'a and 123'b. In the embodiment shown in FIG. 34, fourth mask opening 124'a is in the first stepped word line contact region 300a and fourth mask opening 124'b is in the second stepped word line contact region 300b.

A portion of the stack (32,42) underlying the fourth mask opening 124'a is anisotropically etched employing the fourth mask 114' as an etch mask to form a terrace opening forming the sixth step 70f, and to complete the second step 70b and the fourth step 70d by shifting them inward, as shown in FIG. 35. As shown in FIG. 35, an anisotropic etch process is performed to form a vertical terrace opening through the first insulator layer 32a and the first sacrificial layer 42a to expose a portion of second insulator layer 32b and form second step 70b, the third insulator layer 32c and the third sacrificial layer 42c to expose a portion of fourth insulator layer 32d and form fourth step 70d, and the fifth insulator layer 32e and the fifth sacrificial layer 42e to expose a portion of sixth step 32f and form sixth step 70f.

A portion of the stack (32,42) underlying the fourth mask opening 124'b is anisotropically etched employing the fourth mask 114' as an etch mask to complete the third step 70c and the fifth step 70e, and to form the seventh step 70g. As shown in FIG. 35, the anisotropic etch process forms a vertical terrace opening through the second insulator layer 32b and the second sacrificial layer 42b to expose a portion of third insulator layer 32c and form step 70c, the fourth insulator layer 32d and the fourth sacrificial layer 42d to expose a portion of fifth insulator layer 32e and complete the fifth step 70e, and the sixth insulator layer 32f and the sixth sacrificial layer 42f to expose a portion of seventh insulator layer 32g and form seventh step 70g.

In some embodiments, the anisotropic etch process shown in FIG. 35 includes more than one anisotropic etch. In other embodiments, the anisotropic etch process shown in FIG. 35 includes one or two etch steps. Only one pair of adjacent layers 32, 42 is etched in each terrace step in the etching step(s) shown in FIG. 35.

As shown in FIG. 36, the fourth mask 114' is then removed. While a stack with only six sacrificial layers 42 is shown for illustration, it should be understood that more than six (e.g., 26 to 128) sacrificial layers 42 may be included in the stack. The process steps shown in FIGS. 34-36 are repeated to form additional steps in the additional levels with additional masks which are sequentially narrower than the preceding mask (e.g., similar to mask 114' being narrower than the preceding mask 113'). Processing steps for completing the device are the same as the steps described above in reference to FIGS. 18-24.

Referring to FIGS. 2B and 2C, an insulating material 184, such as silicon oxide, is deposited in the backside trenches 180, followed by removing the insulating material 184 from the bottom of the trenches 180 and from the top of the stack to expose the source regions 12 at the bottom of the trenches. Conductive source lines 182, such as tungsten or titanium nitride/tungsten bilayer lines, are formed in the backside trenches 180 in contact with the source regions 12. Drain electrodes 186 and drain lines 188 are then formed over the stack in electrical contact with the drain regions 63, as shown in FIG. 2C.

Each of the plurality of electrically conductive via contacts 66 is electrically shorted to an electrically conductive electrode 46, and can be electrically isolated from all other electrically conductive electrodes 46 by the insulating fill layer 84. Each electrically conductive electrode 46 can be electrically isolated from any other electrically conductive electrodes 46 located at a different level, i.e., from any other electrically conductive electrode 46 that overlies the electrically conductive electrode 46 and from any other electrically conductive electrode 46 that underlies the electrically conductive electrode 46.

Each electrically conductive electrode 46 can function as a combination of a plurality of control gate electrodes and a word line electrically connecting, i.e., electrically shorting, the plurality of control gate electrodes. The plurality of control gate electrodes within each electrically conductive electrode 46 can include control gate electrodes located at the same level for the vertical memory devices including the channel and memory structures 55. In other words, each electrically conductive electrode 46 can be a word line that functions as a common control gate electrode for the plurality of vertical memory devices.

In an alternative embodiment, rather than forming integral structures including via contacts 66 and electrodes 46 in the same step, the via contacts 66 and the electrodes 46 may be formed in separate steps. In this embodiment, the via contacts 66 electrically contact the electrodes 46, but the via contacts 66 and the electrodes 46 do not form an integral structure. In this alternative embodiment, the electrodes 46 are formed in the recesses 41 through the backside trenches 180 in a first step. Then, in a second step, the via openings 64 are formed through the structure such that the via openings extend to the respective electrodes 46. Finally, in a third step, the via contacts 66 are formed in the via openings 64 in contact with the respective electrodes 46.

The plurality of electrically conductive via contacts 66 include at least one first electrically conductive via contact 66a that is located within the volume of a first via opening 64a and is electrically shorted to an electrically conductive electrode 46a, which contacts the bottom surface of the first insulator layer 32a and the top surface of the second insulator layer 32b, and is herein referred to as the first electrically conductive electrode 46a or an N-th-from-bottom electrically conductive electrode.

The plurality of electrically conductive via contacts 66 can further include at least one second electrically conductive via contact 66b that is located within the volume of a second via opening 64b and is electrically shorted to an electrically conductive electrode 46b, which contacts the bottom surface of the second insulator layer 32b and the top surface of the third insulator layer 32c, and is herein referred to as a second electrically conductive electrode 46b or an (N−1)-th-from-bottom electrically conductive electrode. The plurality of electrically conductive via contacts 66 can further include at least one third electrically conductive via contact 66c that is located within the volume of a third via opening 64c and is electrically shorted to an electrically conductive electrode 46c, which contacts the bottom surface of the third insulator layer 32c and the top surface of the fourth insulator layer 32d, and is herein referred to as a third electrically conductive electrode 46c or an (N−2)-th-from-bottom electrically conductive electrode. The plurality of electrically conductive via contacts 66 can further include at least one fourth electrically conductive via contact 66d that is located within the volume of a fourth via opening 64d and is electrically shorted to an electrically conductive electrode 46d, which contacts the bottom surface of the fourth insulator layer 32d and the top surface of the fifth insulator layer 32e, and is herein referred to as a fourth electrically conductive electrode 46d or an (N−3)-th-from-bottom electrically conductive electrode. The plurality of electrically conductive via contacts 66 can further include at least one fifth electrically conductive via contact 66e that is located within the volume of a fifth via opening 64e and is electrically shorted to an electrically conductive electrode 46e, which contacts the bottom surface of the fifth insulator layer 32e and the top surface of the sixth insulator layer 32f, and is herein referred to as a fifth electrically conductive electrode 46e or an (N−4)-th-from-bottom electrically conductive electrode. The plurality of electrically conductive via contacts 66 can further include at least one sixth electrically conductive via contact 66f that is located within the volume of a sixth via opening 64f and is electrically shorted to an electrically conductive electrode 46f, which contacts the bottom surface of the sixth insulator layer 32f and the top surface of the seventh insulator layer 32g, and is herein referred to as a sixth electrically conductive electrode 46f or an (N−5)-th-from-bottom electrically conductive electrode.

The alternating stack (32, 46) includes a plurality of alternating word lines 46 and insulator layers 32 located over a major surface of the substrate 8 and extending substantially parallel to the major surface of the substrate 8. The plurality of word lines 46 include odd numbered word lines (e.g., first word line 46a, third word line 46c, and fifth word line 46e) located in odd numbered device levels (e.g., first device level, third device level, and fifth device level). The plurality of word lines 46 also include even numbered word lines (e.g., second word line 46b, fourth word line 46d, and sixth word line 46f) located in even numbered device levels (e.g., second device level, fourth device level, and sixth device level).

The first electrically conductive via contact 66a, the third electrically conductive via contact 66c, and the fifth electrically conductive via contact 66e are located in a first stepped word line contact region 300a. The fifth electrically conductive via contact 66e extends deeper than the third electrically conductive via contact 66c, which extends deeper than the first electrically conductive via contact 66a, such that the bottom surfaces 72 (e.g., 72a, 72c, and 72e) of the odd numbered electrically conductive via contacts 66a, 66c, and 66e form a step pattern. Thus, the first stepped word line contact region 300a has a terrace structure.

The first stepped word line contact region 300a is located in a first side of the alternating stack (32, 46) adjacent to a first side of the device region 100. The odd numbered word lines contain contact portions which extend laterally beyond all overlying layers of the stack in the first stepped word line contact region 300a.

Each of the odd numbered via contacts 66 (e.g., 66a, 66c, 66e) is a word line contact in contact with a respective contact portion of one of the plurality of odd numbered word lines 46. In some embodiments, each of the odd numbered via contacts 66 (e.g., 66a, 66c, and 66e) is in contact with only a contact portion of a respective one of the odd numbered word lines 46 (e.g., 46a, 46c, and 46e). At least a portion of the plurality of even numbered word lines in the first word line contact region 300a do not contact an odd numbered via contact 66. In some embodiments, none of the even numbered word lines 46 (e.g., 46b, 46d, and 46f) contact a via contact 66 in the first stepped word line contact region 300a. Upper surfaces of even number word lines are covered by at least one overlying layer of the stack in the first stepped word line contact region 300a. In some embodiments, upper surfaces of the even numbered word lines are covered by a directly overlying insulating layer and the odd numbered word line located on the directly overlying insulating layer in the first word line contact region 300a.

At least one step in the first stepped word line contact region 300a includes a contact portion of a respective one of the plurality of odd numbered word lines 46 (e.g., 46a, 46c, and 46e), a portion of a respective one of the plurality of insulator layers 32 (e.g., 32b, 32d, and 32f) located directly under the respective odd numbered word line 46, a portion of a respective one of the plurality even numbered word lines 46 (e.g. 46b, 46d, and 46f), and a portion of another respective one of the plurality of insulator layers 32 (e.g., 32c, 32e, and 32g) located directly under the respective even numbered word line 46.

The second electrically conductive via contact 66b, the fourth electrically conductive via contact 66d, and the sixth electrically conductive via contact 66f are located in a second stepped word line contact region 300b. The sixth electrically conductive via contact 66f extends deeper than the fourth electrically conductive via contact 66d, which extends deeper than the second electrically conductive via contact 66b, such that the bottom surfaces 72 (e.g., 72b, 72d, and 72f) of the even numbered electrically conductive via contacts 66b, 66d, and 66f form a step pattern. Thus, the second stepped word line contact region 300b has a terrace structure.

The second stepped word line contact region 300b is located in a second side of the alternating stack (32, 46) adjacent to a second side of the device region 100, wherein the even numbered word lines contain contact portions which extend laterally beyond all overlying layers of the stack in the second stepped word line contact region 300b.

Each of the even numbered via contacts 66 (e.g., 66b, 66d, 66f) is a word line contact in contact with a respective contact portion of one of the plurality of even numbered word lines 46. In some embodiment, each of the even numbered via contacts 66 (e.g., 66b, 66d, and 66f) is in contact with only a contact portion of a respective one of the even numbered word lines 46 (e.g., 46b, 46d, and 46f). At least a portion of the plurality of odd numbered word lines in the second word line contact region 300b do not contact an even numbered via contact 66. In some embodiments, none of the odd numbered word lines 46 (e.g., 46a, 46c, and 46e) contact a via contact 66 in the second stepped word line contact region 300b. Upper surfaces of the odd numbered word lines are covered by at least one overlying layer of the stack in the second stepped word line contact region 300b. In some embodiments, upper surfaces of the odd numbered word lines are covered by a directly overlying insulating layer and the even numbered word line located on the directly overlying insulating layer in the second word line contact region 300b.

At least one step in the second stepped word line contact region 300b includes a contact portion of a respective one of the plurality of even numbered word lines 46 (e.g., 46b, 46d, and 46f), a portion of a respective one of the plurality of insulator layers 32 (e.g., 32c, 32e, and 32g) located directly under the respective even numbered word line 46, a portion of a respective one of the plurality odd numbered word lines 46 (e.g., 46c and 46e), and a portion of another respective one of the plurality of insulator layers 32 (e.g., 32d and 32f) located directly under the respective odd numbered word line 46.

There is no odd numbered word line under the bottom even numbered word line 46*f*. Alternatively, for a stack having an odd number of word lines, there is no even numbered word line under the bottom odd numbered word line.

Thus, the alternating stack (32, 46) includes, from top to bottom, a first insulator layer 32*a*, a first electrically conductive electrode 46*a*, a second insulator layer 32*b*, a second electrically conductive electrode 46*b*, at least one intermediate insulator layer 32*c* and at least one electrically conductive electrode 46*c*, an (N−2)-th insulator layer 32*d*, an (N−2)-th electrically conductive electrode 46*d*, an (N−1)-th insulator layer 32*e*, an (N−1)-th electrically conductive electrode 46*e*, an N-th insulator layer 32*f*, an N-th electrically conductive electrode 46*f*, and an (N+1)-th insulator layer 32*g*. It is understood that an insulator layer 32 can refer to any of, or each of, the various insulator layers (32*a*, 32*b*, 32*c*, 32*d*, 32*e*, 32*f*, 32*g*), and an electrically conductive electrode 46 can refer to any of, or each of, the various electrically conductive electrodes (46*a*, 46*b*, 46*c*, 46*d*, 46*e*, 46*f*). Further, insulator layers 32 can refer to any plurality of, or all of, the various insulator layers (32*a*, 32*b*, 32*c*, 32*d*, 32*e*, 32*f*, 32*g*), and electrically conductive electrodes 46 can refer to any plurality of, or all of, the various electrically conductive electrodes (46*a*, 46*b*, 46*c*, 46*d*, 46*e*, 46*f*).

In one embodiment remaining contiguous portions of the deposited conductive material include a plurality of integrated line and via structures (46, 66). Specifically, each electrically shorted pair of an electrically conductive via contact 66 and an electrically conductive electrode 46 constitutes an integrated line and via structure (46, 66). The first device structure includes a plurality of integrated line and via structures (46, 66) having coplanar topmost surfaces (that are within the horizontal plane including the top surface of the device) and bottommost surfaces located at different distances from the horizontal plane including the top surface of the alternating stack (32, 46) of the insulator layers 32 and the electrically conductive electrodes 46. In one embodiment, each instance of the electrically conductive electrodes 46 can be a portion of a respective one of the plurality of integrated line and via structures (46, 66).

In one embodiment, each of the plurality of integrated line and via structures (46, 66) can have a topmost surface that is coplanar with the top surface of the alternating stack (32, 46), and electrically conductive electrodes 46 within the plurality of integrated line and via structures (32, 46) can be located at different levels within the alternating stack (32, 46). The different levels are vertically spaced by at least one insulator layer 32. In one embodiment, a dielectric liner can laterally surround each electrically conductive via contact 66 within the plurality of integrated line and via structures (46, 66). Each of the plurality of integrated line and via structures (46, 66) can be electrically isolated from one another by the insulator layers 32 and the dielectric liners 64.

Each integrated line and via structure (46, 66) can include a contiguous material portion that is contiguous throughout the entirety thereof and does not include any interface therein. Specifically, each of the plurality of integrated line and via structures (46, 66) can comprise an electrically conductive electrode 46 and an electrically conductive via contact 66 that adjoins, and overlies, the electrically conductive electrode 46 such that a contiguous material portion without an interface therein contiguously extends through the electrically conductive electrode 46 and the electrically conductive via contact 66. As used herein, an "interface" refers to any microscopic contiguous surface at which different materials contact each other or a same material is spaced by a microscopic cavity or an impurity layer that is inherently present when one material is formed on another material in any environment that can introduce impurity materials. Because the same material is deposited simultaneously to form each contiguous material portion of the electrically conductive via contact 66 and the electrically conductive electrode within each integrated line and via structure (46, 66), each contiguous material portion in an integrated line and via structure (46, 66) is free of any interface that divides the contiguous material portion into two portions.

In the alternative embodiment, the lines 46 and vias 66 are formed in separate steps and do not comprise an integrated line and via structure. However, the lines and the vias 66 still electrically contact each other (either by direct physical contact or indirectly through an intermediate conductive material).

In one embodiment, each electrically conductive electrode 46 can comprise a word line that functions as a common control gate electrode for the plurality of stacked memory devices including the channel and memory structures 55. The first exemplary structure of FIG. 24 includes a memory device, which comprises at least one memory cell located over the substrate 8. Each of the at least one memory cell contains a portion of the semiconductor channel 60 including a vertical portion extending substantially perpendicular to a top, major surface 9 of the substrate 8 and further includes a portion of the memory film 50 contacting an outer sidewall of the semiconductor channel 60. The memory device further comprises an alternating stack (32, 46) of insulator layers 32 and electrically conductive electrodes 46 that laterally surrounds portions of the at least one memory cell. The memory device further optionally comprises a plurality of integrated line and via structures (46, 66) embedded within the insulator layers 32. Each of the plurality of integrated line and via structures (32, 46) comprises a respective one of the electrically conductive electrodes 46 and an electrically conductive via contact 66 that adjoins, and overlies, the respective electrically conductive electrode 46 such that a conductive material without an interface therein contiguously extends through the respective electrically conductive electrode 46 and the electrically conductive via contact 66. Alternatively, the word lines 46 and vias 66 are formed separately and do not comprise an integrated structure. Each instance of the electrically conductive electrodes 46 is a portion of a respective one of the plurality of integrated line and via structures (46, 66).

In one embodiment, each instance of the electrically conductive electrodes 46 can include a control gate electrode for the at least one memory cell. The memory device can further include a source region 12 located within, or on, the substrate 8 and contacting the at least one semiconductor channel 60, as shown in FIG. 2C. The memory device can further include a drain region 63 located on a top surface of one of the at least one semiconductor channel 60.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional NAND device, comprising:
a substrate having a major surface;
a stack of plurality of alternating word lines and insulating layers located over the major surface of the substrate and extending substantially parallel to the major surface of the substrate, wherein the plurality of word lines comprise odd numbered word lines located in odd numbered device levels and even numbered word lines located in even numbered device levels over the major surface of the substrate;
a plurality of semiconductor channels located in a device region of the stack, wherein at least one end portion of each of the plurality of the semiconductor channels extends substantially perpendicular to the major surface of the substrate through the stack;
a plurality of memory films located in the device region of the stack, wherein each of the plurality of memory films is located adjacent to a respective one of the plurality of semiconductor channels;
a first stepped word line contact region located in a first side of the stack adjacent to a first side of the device region, wherein the odd numbered word lines contain contact portions which extend laterally beyond all overlying layers of the stack in the first stepped word line contact region;
a second stepped word line contact region located in a second side of the stack adjacent to a second side of the device region opposite to the first side of the device region, wherein the even numbered word lines contain contact portions which extend laterally beyond all overlying layers of the stack in the second stepped word line contact region;
a first plurality of word line contacts extending substantially perpendicular to the major surface of the substrate in the first stepped word line contact region, wherein each of the first plurality of word line contacts is in contact with a respective contact portion of one of the plurality of odd numbered word lines, and wherein at least a portion of the plurality of even numbered word lines in the first word line contact region do not contact a word line contact; and
a second plurality of word line contacts extending substantially perpendicular to the major surface of the substrate in the second stepped word line contact region, wherein each of the second plurality of word line contacts is in contact with a respective contact portion of one of the plurality of even numbered word lines, and wherein at least a portion of the plurality of odd numbered word lines in the second word line contact region do not contact a word line contact.

2. The device of claim 1, wherein:
upper surfaces of the even numbered word lines are covered by at least one overlying layer of the stack in the first stepped word line contact region; and
upper surfaces of the odd numbered word lines are covered by at least one overlying layer of the stack in the second stepped word line contact region.

3. The device of claim 2, wherein:
the upper surfaces of the even numbered word lines are covered by a directly overlying insulating layer and the odd numbered word line located on the directly overlying insulating layer in the first word line contact region; and
upper surfaces of the odd numbered word lines are covered by a directly overlying insulating layer and the even numbered word line located on the directly overlying insulating layer in the second word line contact region.

4. The device of claim 3, wherein:
at least one step in the first stepped word line contact region comprises a contact portion of a respective one of the plurality of odd numbered word lines, a portion of a respective one of the plurality of insulating layers located directly under the respective odd numbered word line, a portion of a respective one of the plurality even numbered word lines, and a portion of another respective one of the plurality of insulating layers located directly under the respective even numbered word line; and
at least one step in the second stepped word line contact region comprises a contact portion of a respective one of the plurality of even numbered word lines, a portion of a respective one of the plurality of insulating layers located directly under the respective even numbered word line, a portion of a respective one of the plurality odd numbered word lines, and a portion of another respective one of the plurality of insulating layers located directly under the respective odd numbered word line.

5. The device of claim 1, wherein:
each of the first plurality of word line contacts are in contact only with a contact portion of a respective one of the plurality of odd numbered word lines; and
each of the second plurality of word line contacts are in contact only with a contact portion of a respective one of the plurality of even numbered word lines.

6. The device of claim 1, wherein:
none of the plurality of odd numbered word lines are contacted by a word line contact in the second stepped word line contact region; and
none of the plurality of even numbered word lines are contacted by a word line contact in the first stepped word line contact region.

7. The device of claim 1, wherein:
the plurality of odd numbered word lines comprise a plurality of odd numbered word line fingers, wherein the odd numbered word line fingers in each device level are spaced apart from each other in a horizontal direction which is substantially parallel to the major surface of the substrate; and
the plurality of even numbered word lines comprise a plurality of even numbered word line fingers, wherein the even numbered word line fingers in each device level are spaced apart from each other in a horizontal direction which is substantially parallel to the major surface of the substrate.

8. The device of claim 7, wherein:
the first stepped word line contact region comprises a plurality of adjacent first sub-regions which are spaced apart from each other in the horizontal direction which is substantially parallel to the major surface of the substrate; and
the second stepped word line contact region comprises a plurality of adjacent second sub-regions which are spaced apart from each other in the horizontal direction which is substantially parallel to the major surface of the substrate.

9. The device of claim 8, wherein:
the first plurality of word line contacts comprise a first plurality of sub-sets of word line contacts, wherein the word line contacts in each respective one of the first plurality of sub-sets are in contact with the odd numbered word line fingers in a respective one of the plurality of adjacent first sub-regions; and the second plurality of word line contacts comprise a second plurality of sub-sets of word line contacts, wherein the word line contacts in each respective one of the second plurality of sub-sets are in contact with the even numbered word line fingers in a respective one of the plurality of adjacent second sub-regions.

10. The device of claim 1, wherein:

the first plurality of word line contacts extend through an insulating fill layer located over the first stepped word line contact region;

the second plurality of word line contacts extend through the insulating fill layer located over the second stepped word line contact region;

each of the plurality of memory films comprises a blocking dielectric, a charge trapping layer or floating gate, and a tunnel dielectric;

each of the plurality of memory films is located between the word lines and a respective one of the plurality of semiconductor channels;

a portion of each word line located adjacent to each of the plurality of memory films functions as a control gate electrode of a NAND string;

the substrate comprises a silicon substrate;

the three-dimensional NAND device comprises a monolithic, three-dimensional array of NAND strings located over the silicon substrate;

at least one memory cell in a first device level of the three-dimensional array of NAND strings is located over another memory cell in a second device level of the three-dimensional array of NAND strings; and the silicon substrate contains an integrated circuit comprising a driver circuit for the at least one memory cell.

11. A method of making multi-level contacts, comprising:

providing a stack of plurality of alternating insulating layers and material layers located over a major surface of a substrate;

forming a first mask over the stack exposing a first side of the stack;

forming a first step in a first side of the stack by etching a first insulating layer and a first material layer to expose a second insulating layer;

forming a second mask over the stack exposing a second side of the stack and an outer portion of the first step while covering an inner portion the first step;

forming a second step in a second side of the stack by etching the first and the second insulating layers and the first and a second material layers to expose a third insulating layer in the second side of the stack; and forming a third step in the first side of the stack by etching the second and third insulating layers and the second and a third material layers in the outer portion of the first step to expose a fourth insulating layer in the first side of the stack.

12. The method of claim 11, wherein forming the second and the third steps occur during a same etching step, and wherein the first mask is removed prior to forming the second mask.

13. The method of claim 11, further comprising:

forming a third mask over the stack exposing an upper portion of the second side of the stack and the first, second and third steps while covering a middle portion the stack;

forming a fourth step in the second side of the stack by etching the first and the second insulating layers and the first and the second material layers to expose the third insulating layer in the second side of the stack;

forming a fifth step in the first side of the stack by etching the second and the third insulating layers and the second and the third material layers below the first step to expose a portion of the fourth insulating layer;

forming a sixth step in the second side of the stack by etching the third and the fourth insulating layers and the third and the fourth material layers below the second step to expose a portion of the fifth insulating layer; and forming a seventh step in the first side of the stack by etching the fourth and the fifth insulating layers and the fourth and the fifth material layers below the third step to expose a portion of the sixth insulating layer.

14. The method of claim 13, wherein forming the fourth through the seventh steps occur during a same etching step, and wherein the second mask is removed prior to forming the third mask.

15. The method of claim 13, further comprising repeating steps (a) and (b) a plurality of times until all desired steps in the stack are formed:

(a) forming an additional mask over the stack exposing all existing steps and an upper portion of the first or the second side of the stack; and (b) etching the first insulating layer and the first material layer in the exposed upper portion of the stack and etching a next pair of insulating and material layers underlying each existing step to form additional steps.

16. The method of claim 15, further comprising:

selectively removing the material layers in the stack to form recesses between the insulating layers in the stack, and forming conductive lines in the recesses.

17. The method of claim 16, wherein the conductive lines comprise word lines of a three-dimensional NAND device in which a contact portion of each odd numbered word line is exposed in each respective odd numbered step in the first side of the stack and a contact portion of each even numbered word line is exposed in each respective even numbered step in the second side of the stack.

18. The method of claim 17, further comprising:

forming an insulating fill layer over the first and the second sides of the stack;

forming first openings in the insulating fill layer and an insulating layer in each of the odd numbered steps in the first side of the stack;

forming second openings in the insulating fill layer and a topmost insulating layer of each of the even numbered steps in the second side of the stack;

forming a first plurality of word line contacts extending through the first openings substantially perpendicular to the major surface of the substrate to contact a respective contact portion of each odd numbered word line in the first side of the stack; and forming a second plurality of word line contacts extending through the second openings substantially perpendicular to the major surface of the substrate to contact a respective contact portion of each even numbered word line in the second side of the stack.

19. The method of claim 17, further comprising:

forming a plurality of memory openings in a middle portion of the stack;

forming at least a portion of a memory film in each of the plurality of memory openings adjacent to the word lines; and forming at least a portion of a semiconductor channel over the at least a portion of the memory film in each of the plurality of memory openings.

20. The method of claim 19, further comprising:
the substrate comprises a silicon substrate;
the three-dimensional NAND device comprises a monolithic, three-dimensional array of NAND strings located over the silicon substrate;
at least one memory cell in a first device level of the three-dimensional array of NAND strings is located over another memory cell in a second device level of the three-dimensional array of NAND strings; and
the silicon substrate contains an integrated circuit comprising a driver circuit for the at least one memory cell.

21. The method of claim 13, wherein forming the third mask comprises removing at least one portion of the second mask after forming the third step in the first side of the stack.

22. The method of claim 21, wherein the second mask comprises a photoresist mask and wherein removing the at least one portion of the second mask comprises slimming the photoresist mask by isotropic etching.

* * * * *